(12) United States Patent
Ohshima et al.

(10) Patent No.: US 12,261,570 B2
(45) Date of Patent: Mar. 25, 2025

(54) MIXER AND SEMICONDUCTOR DEVICE

(71) Applicant: Semiconductor Energy Laboratory Co., Ltd., Atsugi (JP)

(72) Inventors: Kazuaki Ohshima, Atsugi (JP); Hitoshi Kunitake, Isehara (JP); Tatsunori Inoue, Yamato (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 448 days.

(21) Appl. No.: 17/606,825

(22) PCT Filed: May 20, 2020

(86) PCT No.: PCT/IB2020/054751
§ 371 (c)(1),
(2) Date: Oct. 27, 2021

(87) PCT Pub. No.: WO2020/240348
PCT Pub. Date: Dec. 3, 2020

(65) Prior Publication Data
US 2022/0216830 A1    Jul. 7, 2022

(30) Foreign Application Priority Data

May 31, 2019  (JP) .................................. 2019-102341
Jun. 7, 2019  (JP) .................................. 2019-106983

(51) Int. Cl.
*H04B 1/06* (2006.01)
*H01L 27/06* (2006.01)
(Continued)

(52) U.S. Cl.
CPC ........ *H03D 7/1425* (2013.01); *H01L 27/0688* (2013.01); *H01L 29/7869* (2013.01);
(Continued)

(58) Field of Classification Search
CPC ...... H03D 7/14; H03D 7/1425; H03D 7/1466; H03D 7/1458; H03D 7/1475; H01L 27/0668; H04B 1/16
See application file for complete search history.

(56) References Cited

U.S. PATENT DOCUMENTS 10,250,247 B2    4/2019  Kato et al.
10,693,417 B2 *  6/2020  Banu ..................... H03D 7/1441
(Continued)

FOREIGN PATENT DOCUMENTS

| JP | 2005-057629 A | 3/2005 |
| JP | 2009-182860 A | 8/2009 |
| JP | 2017-192124 A | 10/2017 |

OTHER PUBLICATIONS

International Search Report (Application No. PCT/IB2020/054751) Dated Jul. 21, 2020.
(Continued)

*Primary Examiner* — Tuan Pham
(74) *Attorney, Agent, or Firm* — Eric J. Robinson; Robinson Intellectual Property Law Office, P.C.

(57) ABSTRACT

To provide a mixer and a semiconductor device which each have a small circuit area and each of which operation capability is inhibited from being decreased due to heat. The mixer includes a differential portion, a current source, a first load, an input terminal, and a first output terminal; the differential portion includes a first and a second transistor; and each of the first and the second transistors includes a metal oxide in a channel formation region. A first terminal of each of the first and the second transistors is electrically connected to the input terminal and a current source and a second terminal of the first transistor is electrically connected to a first terminal of the first load and the first output terminal. The first load has a function of supplying a current between the first terminal and a second terminal of the first (Continued)

load by application of voltage to the second terminal of the first load, and the current source has a function of supplying a constant current to the current source from the first terminal of each of the first and the second transistors. The current source includes a transistor including silicon in a channel formation region, and the differential portion is positioned above the current source.

4 Claims, 31 Drawing Sheets

(51) Int. Cl.
      *H01L 29/786*     (2006.01)
      *H03D 7/14*     (2006.01)
      *H04B 1/16*     (2006.01)
      *H03F 3/19*     (2006.01)

(52) U.S. Cl.
      CPC ............... *H04B 1/16* (2013.01); *H03F 3/19* (2013.01); *H03F 2200/294* (2013.01)

(56) References Cited

U.S. PATENT DOCUMENTS

| | | | |
|---|---|---|---|
| 10,693,448 B2 | 6/2020 | Kato et al. | |
| 2002/0004376 A1* | 1/2002 | Lee | H03D 7/1491 327/116 |
| 2008/0284488 A1* | 11/2008 | Sanduleanu | H03D 7/1475 327/356 |
| 2017/0230041 A1 | 8/2017 | Kato et al. | |
| 2017/0237127 A1* | 8/2017 | Ishikawa | H01G 11/52 429/234 |
| 2018/0122336 A1* | 5/2018 | Kunitake | H04L 27/02 |

OTHER PUBLICATIONS

Written Opinion (Application No. PCT/IB2020/054751) Dated Jul. 21, 2020.
Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.
Lu.Y et al., "A Novel CMOS Low-Noise Amplifier Design for 3.1- to 10.6-GHz Ultra-Wide-Band Wireless Receivers", IEEE Transactions on Circuits and Systems, Aug. 14, 2006, vol. 53, No. 8, pp. 1683-1692.
Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.
Okada.K et al., "A 60GHz 16QAM/8PSK/QPSK/BPSK direct-conversion transceiver for IEEE 802.15.3c", ISSCC 2011 (Digest of Technical Papers. IEEE International Solid-State Circuits Conference), Feb. 20, 2011, pp. 160-161.
Siligaris.A et al., "A 65nm CMOS Fully Integrated Transceiver Module for 60GHz Wireless HD Applications", ISSCC 2011 (Digest of Technical Papers. IEEE International Solid-State Circuits Conference), Feb. 20, 2011, pp. 162-163.
Emami.S et al., "A 60GHz CMOS Phased-Array Transceiver Pair for Multi-Gb/s Wireless Communications", ISSCC 2011 (Digest of Technical Papers. IEEE International Solid-State Circuits Conference), Feb. 20, 2011, pp. 164-165.
Asada.H et al., "A 60GHz 16Gb/s 16QAM Low-Power Direct-Conversion Transceiver Using Capacitive Cross-Coupling Neutralization in 65nm CMOS", IEEE ASSCC 2011 (IEEE Asian Solid-State Circuits Conference), Nov. 14, 2011, pp. 373-376.

* cited by examiner

SBMXA

SBMXB

DBMXA

DBMXB

FIG. 20A
| Amorphous | Intermediate state<br>New boundary region<br>Crystalline | Crystal |
|---|---|---|
| • completely amorphous | • CAAC<br>• nc<br>• CAC<br>excluding single crystal and poly crystal | • single crystal<br>• poly crystal |
FIG. 20B
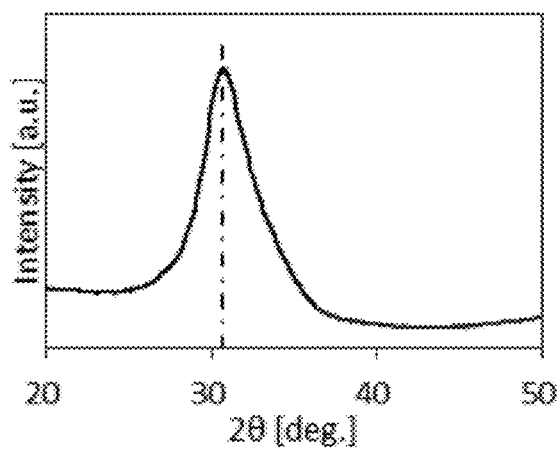
FIG. 20C
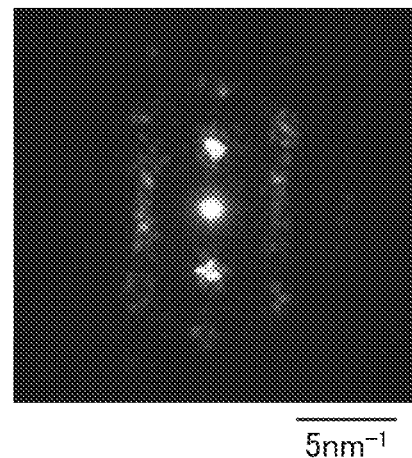

MIXER AND SEMICONDUCTOR DEVICE

TECHNICAL FIELD

One embodiment of the present invention relates to a mixer and a semiconductor device.

Note that one embodiment of the present invention is not limited to the above technical field. The technical field of the invention disclosed in this specification and the like relates to an object, an operation method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a memory device, a signal processing device, a processor, an electronic device, a system, a driving method thereof, a manufacturing method thereof, and a testing method thereof.

BACKGROUND ART

Information terminals that are easy to carry, typified by smartphones, tablet terminals, and the like, have come into widespread use. With the widespread use of information terminals, various communication standards have been established. For example, the use of an LTE-Advanced standard called the fourth-generation mobile communication system (4G) has started.

With the development of information technology such as Internet of Things (IoT), the amount of data handled in information terminals has been recently showing an increasing tendency. In addition, the transmission speed of electronic devices such as information terminals needs to be improved.

In order to be compatible with various kinds of information technology such as IoT, a new communication standard called the fifth-generation mobile communication system (5G) that achieves higher transmission speed, more simultaneous connections, and shorter delay time than 4G has been examined. For example, 5G uses communication frequencies such as the 3.7 GHz band, the 4.5 GHz band, and the 28 GHz band.

A 5G compatible semiconductor device is manufactured using a semiconductor containing one kind of element such as Si as its main component or a compound semiconductor containing a plurality of kinds of elements such as Ga and As as its main components. Furthermore, an oxide semiconductor, which is one kind of metal oxide, has attracted attention.

In addition, a CAAC (c-axis aligned crystalline) structure and an nc (nanocrystalline) structure, which are neither single crystal nor amorphous, have been found in an oxide semiconductor (see Non-Patent Document 1 and Non-Patent Document 2).

Non-Patent Document 1 and Non-Patent Document 2 each disclose a technique for manufacturing a transistor using an oxide semiconductor having a CAAC structure.

REFERENCE

Non-Patent Document

[Non-Patent Document 1] S. Yamazaki et al., "SID Symposium Digest of Technical Papers", 2012, volume 43, issue 1, pp. 183-186

[Non-Patent Document 2] S. Yamazaki et al., "Japanese Journal of Applied Physics", 2014, volume 53, Number 4S, pp. 04ED18-1-04ED18-10

SUMMARY OF THE INVENTION

Problems to be Solved by the Invention

Along with miniaturization of electronic devices such as mobile phones, the circuit area of a semiconductor device in such an electronic device is required to be reduced. For example, an integrated circuit using a Si transistor or the like is used for such an electronic device for a reduction in the circuit area of a semiconductor device in some cases. On the other hand, an integrated circuit generates heat due to power consumption and the temperature of the integrated circuit itself is increased in some cases. In particular, in the case where a Si transistor is included in an integrated circuit, as the temperature of the Si transistor is higher, the field-effect mobility is decreased; therefore, the operation capability of the integrated circuit might be decreased.

Another object of one embodiment of the present invention is to provide a semiconductor device with lowered power consumption. Another object of one embodiment of the present invention is to provide a semiconductor device whose operation capability is inhibited from being reduced due to heat. Another object of one embodiment of the present invention is to provide a semiconductor device with reduced circuit area. Another object of one embodiment of the present invention is to provide a novel semiconductor device. Another object of one embodiment of the present invention is to provide an electronic device including a novel semiconductor device.

Note that the objects of one embodiment of the present invention are not limited to the objects listed above. The objects listed above do not preclude the existence of other objects. Note that the other objects are objects that are not described in this section and are described below. The objects that are not described in this section are derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

Means for Solving the Problems (1)

One embodiment of the present invention is a mixer including a differential portion, a current source, a first load, an input terminal, and a first output terminal. The differential portion includes a first transistor and a second transistor; each of the first transistor and the second transistor includes a metal oxide in a channel formation region; a first terminal of the first transistor is electrically connected to a first terminal of the second transistor, the input terminal, and a first terminal of the current source; a second terminal of the first transistor is electrically connected to a first terminal of the first load and the first output terminal; the first load has a function of supplying a current between the first terminal and a second terminal of the first load when a first voltage is supplied to the second terminal of the first load; the current source has a function of supplying a constant current to a first terminal of the current source; and when a first signal is input to a gate of the first transistor, a second signal with a phase difference of 180° from the first signal is input to a gate of the second transistor, and a third signal is input to the input terminal, the differential portion generates a first output signal with a voltage waveform based on a voltage waveform of the first signal and a voltage waveform of the third signal and outputs the first output signal to the first output terminal.

(2)

Another embodiment of the present invention is a mixer including a differential portion, a current source, a first load, a third transistor, an input terminal, and a first output terminal. The differential portion includes a first transistor and a second transistor; each of the first transistor and the second transistor includes a metal oxide in a channel formation region; a first terminal of the first transistor is electrically connected to a first terminal of the second transistor and a first terminal of the third transistor; a second terminal of the third transistor is electrically connected to a first terminal of the current source; a gate of the third transistor is electrically connected to the input terminal; a second terminal of the first transistor is electrically connected to a first terminal of the first load and the first output terminal; the first load has a function of supplying a current between the first terminal and a second terminal of the first load when a first voltage is supplied to the second terminal of the first load; the current source has a function of supplying a constant current to a first terminal of the current source; and when a first signal is input to a gate of the first transistor, a second signal with a phase difference of 180° from the first signal is input to a gate of the second transistor, and a third signal is input to the input terminal, the differential portion generates a first output signal with a voltage waveform based on a voltage waveform of the first signal and a voltage waveform of the third signal and outputs the first output signal to the first output terminal.

(3)

Another embodiment of the present invention is the mixer in the structure of the above (1) or (2), including a second load and a second output terminal. A second terminal of the second transistor is electrically connected to a first terminal of the second load and the second output terminal; the second load has a function of supplying a current between the first terminal and a second terminal of the second load when the first voltage is supplied to the second terminal of the second load; and when the first signal is input to the gate of the first transistor, the second signal is input to the gate of the second transistor, and the third signal is input to the input terminal, the differential portion has a function of generating a second output signal with a voltage waveform based on a voltage waveform of the second signal and the voltage waveform of the third signal and outputting the second output signal to the second output terminal.

(4)

Another embodiment of the present invention is the mixer in the structure of any one of the above (1) to (3), wherein the current source comprises a transistor including silicon in a channel formation region, and the differential portion is positioned above the current source.

(5)

Another embodiment of the present invention is a mixer including a differential portion, a first current source, a second current source, a first load, a second load, a first input terminal, a second input terminal, and a first output terminal. The differential portion comprises a first transistor, a second transistor, a fourth transistor, and a fifth transistor; each of the first transistor, the second transistor, the fourth transistor, and the fifth transistor comprises a metal oxide in a channel formation region; a first terminal of the first transistor is electrically connected to a first terminal of the second transistor, the first input terminal, and a first terminal of the first current source; a first terminal of the fourth transistor is electrically connected to a first terminal of the fifth transistor, the second input terminal, and a first terminal of the second current source; a second terminal of the first transistor is electrically connected to a second terminal of the fifth transistor and a first terminal of the first load; a second terminal of the second transistor is electrically connected to a second terminal of the fourth transistor, a first terminal of the second load, and the first output terminal; the first load has a function of supplying a current between the first terminal and a second terminal of the first load when a first voltage is supplied to the second terminal of the first load; the second load has a function of supplying a current between the first terminal and a second terminal of the second load when the first voltage is supplied to the second terminal of the second load; the first current source has a function of supplying a first constant current to the first terminal of the first current source; the second current source has a function of supplying a second constant current to the first terminal of the second current source; and when a first signal is input to each of a gate of the first transistor and a gate of the fourth transistor, a second signal with a phase difference of 180° from the first signal is input to a gate of the second transistor and a gate of the fifth transistor, a third signal is input to the first input terminal, and a fourth signal is input to the second input terminal, the differential portion outputs, from the first output terminal, a fifth signal with a voltage waveform based on a voltage waveform of the first signal and a voltage waveform of the fourth signal and a sixth signal with a voltage waveform based on a voltage waveform of the second signal and a voltage waveform of the third signal, as a first output signal.

(6)

Another embodiment of the present invention is a mixer including a differential portion, a first current source, a second current source, a first load, a second load, a third transistor, a sixth transistor, a first input terminal, a second input terminal, and a first output terminal. The differential portion comprises a first transistor, a second transistor, a fourth transistor, and a fifth transistor; each of the first transistor, the second transistor, the fourth transistor, and the fifth transistor comprises a metal oxide in a channel formation region; a first terminal of the first transistor is electrically connected to a first terminal of the second transistor and a first terminal of the third transistor; a second terminal of the third transistor is electrically connected to a first terminal of the first current source; a gate of the third transistor is electrically connected to the first input terminal; a first terminal of the fourth transistor is electrically connected to a first terminal of the fifth transistor and a first terminal of the sixth transistor; a second terminal of the sixth transistor is electrically connected to a first terminal of the second current source; a gate of the sixth transistor is electrically connected to the second input terminal; a second terminal of the first transistor is electrically connected to a second terminal of the fifth transistor and a first terminal of the first load; a second terminal of the second transistor is electrically connected to a second terminal of the fourth transistor, a first terminal of the second load, and the first output terminal; the first load has a function of supplying a current between the first terminal and a second terminal of the first load when a first voltage is supplied to the second terminal of the first load; the second load has a function of supplying a current between the first terminal and a second terminal of the second load when the first voltage is supplied to the second terminal of the second load; the first current source has a function of supplying a first constant current to a first terminal of the first current source; the second current source has a function of supplying a second constant current to a first terminal of the second current source; and when a first signal is input to each of a gate of the first transistor and a gate of the fourth transistor, a second signal with a phase difference of 180° from the first signal is input to a gate of the second transistor and a gate of the fifth transistor, a third signal is input to the first input terminal, and a fourth signal is input to the second input terminal, the differential portion outputs, from the first output terminal, a fifth signal with a voltage waveform based on a voltage waveform of the first signal and a voltage waveform of the fourth signal and a sixth signal with a voltage waveform based on a voltage waveform of the second signal and a voltage waveform of the third signal as a first output signal.

(7)

Another embodiment of the present invention is the mixer in the structure of (4) or (5) above, including a second output terminal, wherein the second output terminal is electrically connected to the second terminal of the first transistor, the second terminal of the fifth transistor, and the first terminal of the load, and when the first signal is input to each of the gate of the first transistor and the gate of the fourth transistor, and the second signal is input to each of the gate of the second transistor and the gate of the fifth transistor, the third signal is input to the first input terminal, and the fourth signal is input to the second input terminal, the differential portion has a function of outputting, from the second output terminal, a seventh signal with a voltage waveform based on the voltage waveform of the first signal and the voltage waveform of the third signal and an eighth signal with a voltage waveform based on the voltage waveform of the second signal and the voltage waveform of the fourth signal, as a second output signal.

(8)

Another embodiment of the present invention is the mixer in the structure of any one of the above (5) to (7), wherein each of the first current source and the second current source comprises a transistor including silicon in a channel formation region, and the differential portion is positioned above the first current source and the second current source.

(9)

Another embodiment of the present invention is a semiconductor device including a mixer and a local oscillator. The mixer comprises a transistor; the transistor comprises a metal oxide in a channel formation region; a first terminal of the mixer is electrically connected to the local oscillator; the local oscillator has a function of supplying a ninth signal to a gate of the transistor through a first terminal of the mixer; and the mixer has a function of generating an eleventh signal with a voltage waveform based on a voltage waveform of the ninth signal and a voltage waveform of a tenth signal input to a first terminal of the transistor through a second terminal of the mixer, and outputting the eleventh signal to a third terminal of the mixer from a second terminal of the transistor.

(10)

Another embodiment of the present invention is the semiconductor device in the structure of the above (9), wherein the first terminal of the mixer is electrically connected to the gate of the transistor; the second terminal of the mixer is electrically connected to the first terminal of the transistor; and the third terminal of the mixer is electrically connected to the second terminal of the transistor.

(11)

Another embodiment of the present invention is the semiconductor device in the structure of the above (9) or (10), including an antenna and a low noise amplifier, wherein the antenna is electrically connected to an input terminal of the low noise amplifier, and an output terminal of the low noise amplifier is electrically connected to the second terminal of the mixer.

Note that in this specification and the like, a semiconductor device refers to a device that utilizes semiconductor characteristics, and means a circuit including a semiconductor element (a transistor, a diode, a photodiode, or the like), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves are semiconductor devices, or include semiconductor devices in some cases.

In the case where there is a description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow(s) electrical connection between X and Y (e.g., a switch, a transistor, a capacitor, an inductor, a resistor, a diode, a display device, a light-emitting device, and a load) can be connected between X and Y. Note that a switch has a function of being controlled to be turned on or off. That is, the switch has a function of being in a conduction state (on state) or a non-conduction state (off state) to control whether a current flows or not.

For example, in the case where X and Y are functionally connected, one or more circuits that allow(s) functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For example, even when another circuit is interposed between X and Y, X and Y are functionally connected when a signal output from X is transmitted to Y.

Note that an explicit description, X and Y are electrically connected, includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes, in its category, such a case where one conductive film has functions of a plurality of components.

In this specification and the like, a "resistor" can be, for example, a circuit element or a wiring having a resistance higher than 0Ω. Therefore, in this specification and the like, a "resistor" sometimes includes a wiring having a resistance value, a transistor in which current flows between its source and drain, a diode, and a coil. Thus, the term "resistor" can be replaced with the terms "resistance", "load", and "a region having a resistance value", and the like; Conversely, the terms "resistance", "load", and "a region having a resistance" can be replaced with the term "resistor" and the like. The resistance value can be, for example, preferably greater than or equal to 1 mΩ and less than or equal to 10Ω, further preferably greater than or equal to 5 mΩ and less than or equal to 5Ω, still further preferably greater than or equal to 10 mΩ and less than or equal to 1Ω. As another example, the resistance value may be greater than or equal to 1Ω and less than or equal to $1\times10^9$Ω.

In this specification and the like, a "capacitor" can be, for example, a circuit element having an electrostatic capacitance higher than 0 F, a region of a wiring having an electrostatic capacitance value, parasitic capacitance, or gate capacitance of a transistor. Therefore, in this specification and the like, a "capacitor" sometimes includes not only a circuit element that has a pair of electrodes and a dielectric between the electrodes, but also parasitic capacitance generated between wirings, gate capacitance generated between a gate and one of a source and a drain of a transistor, and the like. The terms "capacitor", "parasitic capacitance", "gate capacitance", and the like can be replaced with the term "capacitance" and the like; Conversely, the term "capacitance" can be replaced with the terms "capacitor", "parasitic capacitance", "gate capacitance", and the like. The term "pair of electrodes" of "capacitor" can be replaced with "pair of conductors", "pair of conductive regions", "pair of regions", and the like. Note that the electrostatic capacitance value can be greater than or equal to 0.05 fF and less than or equal to 10 pF, for example. Alternatively, the electrostatic capacitance value may be greater than or equal to 1 pF and less than or equal to 10 μF, for example.

In this specification and the like, a transistor includes three terminals called a gate, a source, and a drain. The gate functions as a control terminal for controlling the conduction state of the transistor. Two terminals functioning as the source or the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms "source" and "drain" can be replaced with each other in this specification and the like. In this specification and the like, expressions "one of a source and a drain" (or a first electrode or a first terminal) and "the other of the source and the drain" (or a second electrode or a second terminal) are used in description of the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

In this specification and the like, a node can be referred to as a terminal, a wiring, an electrode, a conductive layer, a conductor, an impurity region, or the like depending on the circuit structure, the device structure, or the like. Furthermore, a terminal, a wiring, or the like can be referred to as a node.

In this specification and the like, "voltage" and "potential" can be replaced with each other as appropriate. The "voltage" refers to a potential difference from a reference potential, and when the reference potential is a ground potential, for example, the "voltage" can be replaced with the "potential". Note that the ground potential does not necessarily mean 0 V. Moreover, potentials are relative values, and a potential supplied to a wiring, a potential applied to a circuit and the like, a potential output from a circuit and the like, for example, are changed with a change of the reference potential.

In this specification and the like, the term "high-level potential" or "low-level potential" does not mean a particular potential. For example, in the case where two wirings are both described as "functioning as a wiring for supplying a high-level potential", the levels of the high-level potentials that these wirings supply are not necessarily equal to each other. Similarly, in the case where two wirings are both described as "functioning as a wiring for supplying a low-level potential", the levels of the low-level potentials that these wirings supply are not necessarily equal to each other.

Note that "current" is a charge transfer (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of a current" in a wiring or the like refers to the direction in which a carrier with a positive charge moves, and the amount of current is expressed as a positive value. In other words, the direction in which a carrier with a negative charge moves is opposite to the direction of a current, and the amount of current is expressed as a negative value. Thus, in the case where the polarity of a current (or the direction of a current) is not specified in this specification and the like, the description "current flows from element A to element B" can be rephrased as "current flows from element B to element A", for example. The description "current is input to element A" can be rephrased as "current is output from element A", for example.

Ordinal numbers such as "first", "second", and "third" in this specification and the like are used to avoid confusion among components. Thus, the terms do not limit the number of components. In addition, the terms do not limit the order of components. In this specification and the like, for example, a "first" component in one embodiment can be referred to as a "second" component in other embodiments or the scope of claims. Furthermore, in this specification and the like, for example, a "first" component in one embodiment can be omitted in other embodiments or the scope of claims.

In this specification and the like, the terms for describing positioning, such as "over" or "above" and "under" or "below", are sometimes used for convenience to describe the positional relation between components with reference to drawings. The positional relation between components is changed as appropriate in accordance with a direction in which the components are described. Thus, the positional relation is not limited to the terms described in the specification and the like, and can be described with another term as appropriate depending on the situation. For example, the expression "an insulator positioned over (on) a top surface of a conductor" can be replaced with the expression "an insulator positioned under (on) a bottom surface of a conductor" when the direction of a drawing showing these components is rotated by 180°.

Furthermore, the terms such as "over" or "above" and "under" or "below" do not necessarily mean that a component is placed directly over or directly under and in direct contact with another component. For example, the expression "electrode B over insulating layer A" does not necessarily mean that the electrode B is formed on and in direct contact with the insulating layer A, and does not exclude the case where another component is provided between the insulating layer A and the electrode B.

In this specification and the like, the terms "film", "layer", and the like can be interchanged with each other depending on the situation. For example, the term "conductive layer" can be changed into the term "conductive film" in some cases. Moreover, the term "insulating film" can be changed into the term "insulating layer" in some cases. Alternatively, the term "film", "layer", or the like is not used and can be interchanged with another term depending on the case or the situation. For example, the term "conductive layer" or "conductive film" can be changed into the term "conductor" in some cases. Furthermore, for example, the term "insulating layer" or "insulating film" can be changed into the term "insulator" in some cases.

In this specification and the like, the term such as an "electrode", a "wiring", or a "terminal" does not limit the function of a component. For example, an "electrode" is used as part of a "wiring" in some cases, and vice versa. Furthermore, the term "electrode" or "wiring" also includes the case where a plurality of "electrodes" or "wirings" are formed in an integrated manner, for example. For example, a "terminal" is used as part of a "wiring" or an "electrode" in some cases, and vice versa. Furthermore, the term "terminal" can also include the case where a plurality of "electrodes", "wirings", "terminals", or the like are formed in an integrated manner. Therefore, for example, an "electrode" can be part of a "wiring" or a "terminal", and a "terminal" can be part of a "wiring" or an "electrode". Moreover, the terms "electrode", "wiring", "terminal", and the like are sometimes replaced with the term "region" depending on the case, for example.

In this specification and the like, the terms "wiring", "signal line", "power supply line", and the like can be interchanged with each other depending on the case or the situation. For example, the term "wiring" can be changed into the term "signal line" in some cases. As another example, the term "wiring" can be changed into the term "power supply line" in some cases. Conversely, the term "signal line", "power supply line", or the like can be changed into the term "wiring" in some cases. The term "power supply line" or the like can be changed into the term "signal line" or the like in some cases. Conversely, the term "signal line" or the like can be changed into the term "power supply line" or the like in some cases. The term "potential" that is applied to a wiring can be changed into the term "signal" or the like depending on the case or the situation. Conversely, the term "signal" or the like can be changed into the term "potential" in some cases.

In this specification and the like, an impurity in a semiconductor refers to an element other than a main component of a semiconductor layer, for example. For example, an element with a concentration of lower than 0.1 atomic % is an impurity. When an impurity is contained, for example, the density of defect states in a semiconductor may be increased, the carrier mobility may be decreased, or the crystallinity may be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. Specifically, when the semiconductor is a silicon layer, examples of an impurity that changes characteristics of the semiconductor include Group 1 elements, Group 2 elements, Group 13 elements, and Group 15 elements (except oxygen and hydrogen).

In this specification and the like, a switch is in a conduction state (on state) or a non-conduction state (off state) to determine whether a current flows or not. Alternatively, a switch has a function of selecting and changing a current path. For example, an electrical switch or a mechanical switch can be used. That is, a switch can be any element capable of controlling a current, and is not limited to a particular element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical system) technology. Such a switch includes an electrode that can be moved mechanically, and operates by controlling conduction and non-conduction with movement of the electrode.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, the term "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 800 and less than or equal to 100°. Thus, the case where the angle is greater than or equal to 850 and less than or equal to 950 is also included. Furthermore, "approximately perpendicular" or "substantially perpendicular" indicates a state where two straight lines are placed at an angle greater than or equal to 600 and less than or equal to 120°.

Effect of the Invention

One embodiment of the present invention can provide a semiconductor device with reduced power consumption. Another embodiment of the present invention can provide a semiconductor device whose operation capability is inhibited from being decreased due to heat. Another embodiment of the present invention can provide a semiconductor device with reduced circuit area. Another embodiment of the present invention can provide a novel semiconductor device. Another embodiment of the present invention can provide an electronic device including a novel semiconductor device.

Note that the effects of one embodiment of the present invention are not limited to the effects listed above. The effects listed above do not preclude the existence of other effects. Note that the other effects are effects that are not described in this section and will be described below. The effects that are not described in this section are derived from the descriptions of the specification, the drawings, and the like and can be extracted from these descriptions by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIG. 20A shows classification of IGZO crystal structures, FIG. 20B shows an XRD spectrum of crystalline IGZO, and FIG. 20C shows a nanobeam electron diffraction pattern of the crystalline IGZO.

MODE FOR CARRYING OUT THE INVENTION

Figure 1:
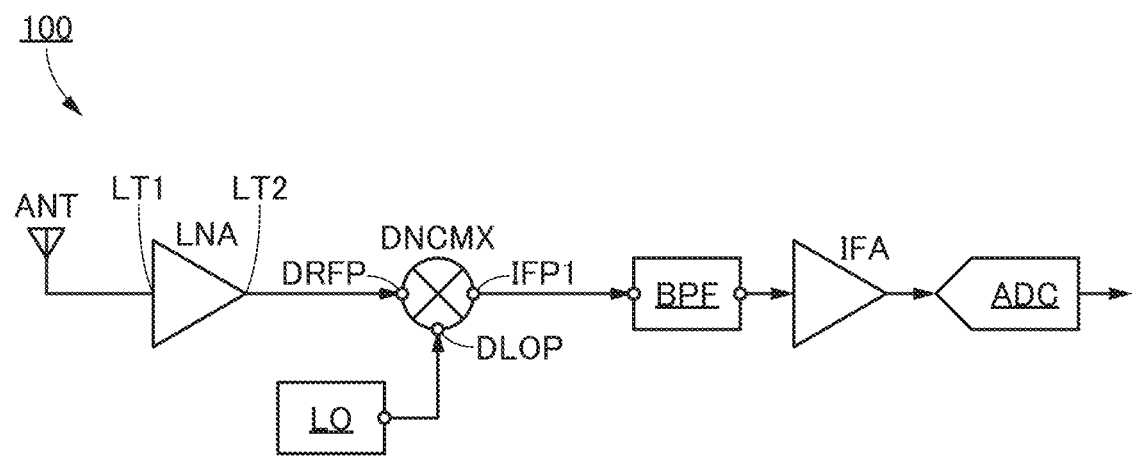
FIG. 1 is a block diagram illustrating a structure example of a semiconductor device.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is included in a channel formation region of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

Furthermore, in this specification and the like, a metal oxide containing nitrogen is also collectively referred to as a metal oxide in some cases. A metal oxide containing nitrogen may be referred to as a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment, a content described in the embodiment is a content described with reference to a variety of diagrams or a content described with text in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings.

In this specification and the like, when a plurality of components are denoted by the same reference numerals, and in particular need to be distinguished from each other, an identification sign such as "_1", "[n]", or "[m,n]" is sometimes added to the reference numerals.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes or values shown in the drawings. For example, variations in signal, voltage, or current due to noise, variations in signal, voltage, or current due to difference in timing, or the like can be included.

Embodiment 1

In this embodiment, a structure example of a high frequency receiver that is a semiconductor device of one embodiment of the present invention is described.

FIG. 1 illustrates a structure example of a high frequency receiver 100.

The high frequency receiver 100 includes, for example, an antenna ANT, a low noise amplifier LNA, a local oscillator LO, a downconversion mixer DNCMX, a band pass filter BPF, an IF amplifier IFA, and an analog-to-digital converter circuit ADC.

The low noise amplifier LNA includes a terminal LT1 serving as an input terminal and a terminal LT2 serving as an output terminal. In addition, the downconversion mixer DNCMX includes a terminal DRFP, a terminal DLOP, and a terminal IFP1.

The antenna ANT is electrically connected to the terminal LT1 of the low noise amplifier LNA and the terminal LT2 of the low noise amplifier LNA is electrically connected to the terminal DRFP of the downconversion mixer DNCMX. A terminal DLOP of the downconversion mixer DNCMX is electrically connected to the local oscillator LO and the terminal IFP1 of the downconversion mixer DNCMX is electrically connected to an input terminal of the band pass filter BPF. An input terminal of the IF amplifier IFA is electrically connected to an output terminal of the band pass filter BPF and an output terminal of the IF amplifier IFA is electrically connected to an input terminal of the analog-to-digital converter circuit ADC.

An output terminal of the analog-to-digital converter circuit ADC is electrically connected to, for example, a logic circuit or the like (not illustrated) in the semiconductor device.

The antenna ANT has, for example, a function of converting a radio wave to an RF (radio frequency) signal, when the antenna ANT receives the radio wave with a frequency used for a carrier wave for wireless communication.

The low noise amplifier LNA has a function of amplifying a voltage amplitude of the RF signal generated when the antenna ANT receives a radio wave from the outside, for example. The low noise amplifier LNA also has a function of reducing noise of the RF signal to be amplified. In addition, the low noise amplifier LNA preferably has a filtering function of removing noise in addition to the function of reducing noise.

Figure 2A:
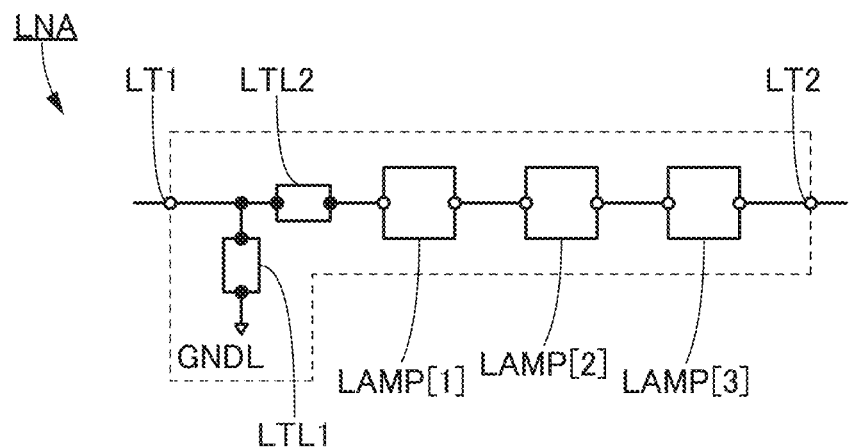
FIG. 2A and FIG. 2B are block diagrams each illustrating a structure example of a circuit included in the semiconductor device.

The low noise amplifier LNA can have a circuit structure illustrated in FIG. 2A, for example. The low noise amplifier LNA illustrated in FIG. 2A has a three-stage power amplifier. Specifically, the low noise amplifier LNA in FIG. 2A includes an amplifier LAMP[1] to an amplifier LAMP[3], a transmission line LTL1, and a transmission line LTL2. In addition, each of the amplifier LAMP[1] to the amplifier LAMP[3] has an input terminal and an output terminal.

The terminal LT1 is electrically connected to a wiring GNDL through the transmission line LTL1. The terminal LT1 is also electrically connected to the input terminal of the amplifier LAMP[1] through the transmission line LTL2. The output terminal of the amplifier LAMP[1] is electrically connected to the input terminal of the amplifier LAMP[2], the output terminal of the amplifier LAMP[2] is electrically connected to the input terminal of the amplifier LAMP[3], and the output terminal of the amplifier LAMP[3] is electrically connected to the terminal LT2.

Each of the transmission line LTL1 and the transmission line LTL2 is a wiring for transmission of an electrical signal such as an RF signal and has a parasitic resistance, a parasitic capacitance, or the like. Therefore, the transmission line LTL1 and the transmission line LTL2 each have input impedance, characteristic impedance, or the like.

Figure 2B:
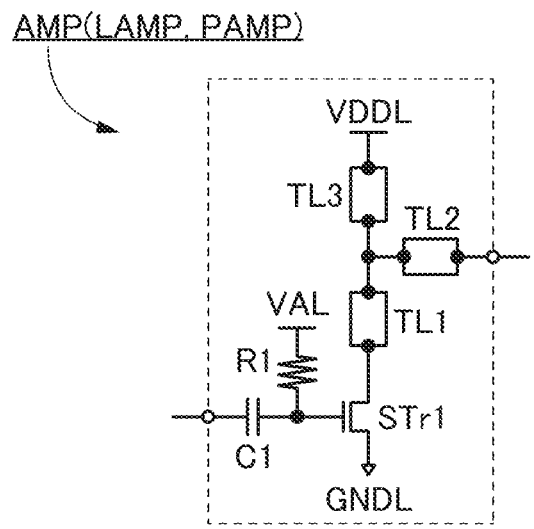

Each of the amplifier LAMP[1] to the amplifier LAMP[3] can have a circuit structure illustrated in FIG. 2B, for example.

An amplifier AMP in FIG. 2B includes a capacitor C1, a resistor R1, a transistor STr1, and a transmission line TL1 to a transmission line TL3.

An input terminal of the amplifier AMP is electrically connected to a first terminal of the capacitor C1, and a second terminal of the capacitor C1 is electrically connected to a first terminal of the resistor R1 and a gate of the transistor STr1. A second terminal of the resistor R1 is electrically connected to a wiring VAL. A first terminal of the transistor STr1 is electrically connected to a wiring VDDL through the transmission line TL1 and the transmission line TL3, and a second terminal of the transistor STr1 is electrically connected to the wiring GNDL.

The wiring VAL functions as a wiring for supplying a constant voltage, for example. The constant voltage can be a high-level potential (VDD), a potential higher than VDD, or a potential lower than VDD, for example. The wiring VDDL functions as a wiring for supplying a constant voltage, for example. The constant voltage can be a high-level potential (VDD), for example. The wiring GNDL functions as a wiring for supplying a constant voltage, for example. The constant voltage can be a low-level potential or a ground potential (GND), for example.

An output terminal of the amplifier AMP is electrically connected to a connection portion between the transmission line TL1 and the transmission line TL3 through the transmission line TL2.

The transmission line TL1 to the transmission line TL3 are wirings for transmitting an electrical signal like the transmission line LTL1 and the transmission line LTL2. Therefore, the transmission line PTL1 has input impedance, characteristic impedance, or the like.

The amplifier AMP has a function of amplifying a voltage amplitude of an electrical signal input to the input terminal and outputting the signal to the output terminal. The amplifier AMP serves as an impedance matching circuit.

A transistor including silicon in a channel formation region (hereinafter referred to as a Si transistor) is used as the transistor STr1, for example. As such silicon, amorphous silicon (sometimes referred to as hydrogenated amorphous silicon), single crystal silicon, microcrystalline silicon, polycrystalline silicon, or the like can be used, for example. Further, the transistor STr1 can be, for example, a transistor including Ge in a channel formation region, a transistor including a compound semiconductor such as ZnSe, CdS, GaAs, InP, GaN, or SiGe in a channel formation region, a transistor including a carbon nanotube in a channel formation region, a transistor including an organic semiconductor in a channel formation region, in addition to the Si transistor.

The low noise amplifier LNA can be configured with the amplifier AMP illustrated in FIG. 2B.

The local oscillator LO has a function of generating a signal for converting a voltage waveform. The conversion is performed in the downconversion mixer DNCMX described below.

The downconversion mixer DNCMX has a function of mixing an RF signal input to the terminal DRFP with a signal transmitted to the terminal DLOP from the local oscillator LO to generate an electrical signal with a frequency lower than that of the RF signal input to the terminal DRFP. The generated electrical signal is output to the terminal IFP1 as a signal having an intermediate frequency (hereinafter referred to as an IF signal).

The band pass filter BPF has a function of outputting, to the output terminal of the band pass filter BPF, an AC voltage in a particular frequency band in the frequency of the IF signal input to the input terminal of the band pass filter BPF. In addition, the band pass filter BPF has a function of attenuating an AC voltage that is not in the particular frequency band. The band pass filter BPF can select one or two or more channels from an IF signal with a plurality of channels by determining a particular frequency band to be output to the output terminal.

The IF amplifier IFA has a function of amplifying the voltage amplitude of an IF signal of a channel selected by the band pass filter BPF.

The analog-to-digital converter circuit ADC has a function of converting the IF signal amplified by the IF amplifier IFA to a digital signal.

The digital signal output from the analog-to-digital converter circuit ADC is transmitted to a processing unit (not illustrated) electrically connected to the high frequency receiver 100, for example. The processing unit can include a logic circuit processing the digital signal, for example. By using the high frequency receiver 100, a radio wave received by the antenna ANT (specifically, a radio wave with a frequency used for a carrier wave of wireless communication) is resultantly converted into a digital signal. Then, the data contained in the digital signal can be read out and processing can be conducted on the basis of the data in the processing unit.

The low noise amplifier LNA that can be applied to the high frequency receiver 100 has a three-stage structure of the amplifiers LAMP in FIG. 2A, but may have two stages or four or more stages.

In particular, since the RF signal converted from a radio wave by the antenna ANT is weak, the low noise amplifier LNA preferably amplifies the voltage amplitude of the RF signal to the extent that the RF signal can be treated in the processing unit (for example, a logic circuit) where the RF signal is to be output from the analog-to-digital converter circuit ADC. Therefore, the low noise amplifier LNA has a plurality of stages of amplifiers LAMP. In contrast, when the number of the amplifiers LAMP included in the low noise amplifier LNA is increased, the circuit area of the low noise amplifier LNA is increased, which may result in an increase in the area occupied by the high frequency receiver 100. In addition, the increased number of the amplifiers LAMP included in the low noise amplifier LNA might generate heat caused by current, thereby increasing the temperature of the high frequency receiver 100. In the case where a Si transistor is included in the amplifier LAMP, it is difficult for the amplifier LAMP to amplify the electrical signal to a desired voltage amplitude, because the field effect mobility of the Si transistor is decreased when the temperature is raised.

Figure 3A:
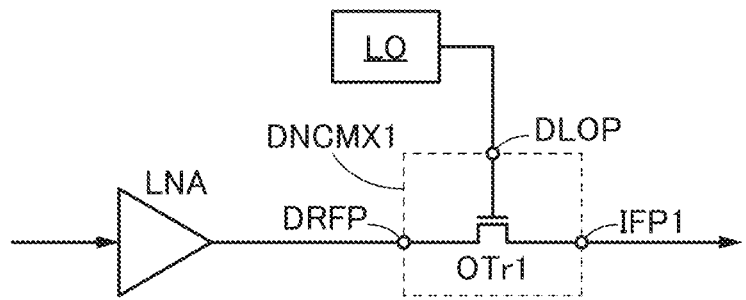
FIG. 3A to FIG. 3C are block diagrams each illustrating a structure example of a circuit included in the semiconductor device.

Thus, the downconversion mixer DNCMX including an OS transistor is considered. FIG. 3A illustrates an example of a circuit structure of a downconversion mixer DNCMX1 that can be used as the downconversion mixer DNCMX in FIG. 1. Note that FIG. 3A also illustrates the low noise amplifier LNA and the local oscillator LO as well as the downconversion mixer DNCMX, for explanation of an electrical connection between the downconversion mixer DNCMX and the peripheral circuit.

The downconversion mixer DNCMX1 illustrated in FIG. 3A includes a transistor Otr1 that is an OS transistor. The transistor OTr1 serves as a pass transistor in the downconversion mixer DNCMX1.

A first terminal of the transistor OTr1 is electrically connected to the terminal DRFP, a second terminal of the transistor OTr1 is electrically connected to the terminal IFP1, and a gate of the transistor OTr1 is electrically connected to the terminal DLOP.

The OS transistor can be formed, for example, over a glass substrate. Therefore, unlike a Si transistor, the OS transistor can have a structure without a bulk capacitor. Accordingly, the OS transistor is less likely to be affected by a decrease in the operation frequency caused by the bulk capacitor.

Figure 10:
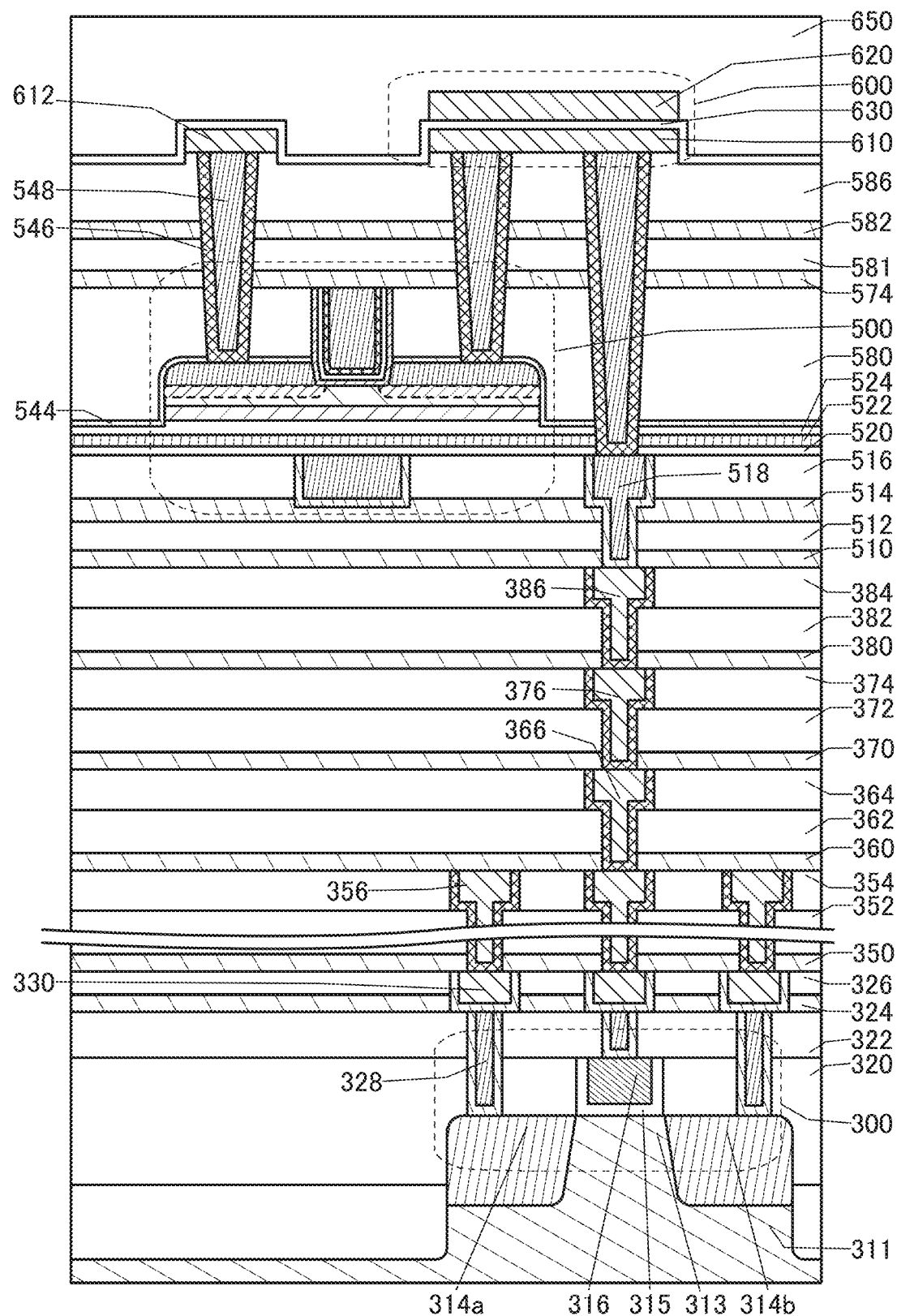
FIG. 10 is a schematic cross-sectional view illustrating a structure example of a semiconductor device.

In addition, as illustrated in FIG. 10 to be described in Embodiment 3, the OS transistor can be provided over a substrate above which a Si transistor is formed. In other words, the semiconductor device can include both OS transistors and Si transistors, and thus a circuit for the semiconductor device can be configured to be suitable for the characteristics of both the OS transistors and the Si transistors. For example, in the same circuit in the semiconductor device, transistors with different semiconductor layers can be used in the same circuit; for example, a Si transistor is used as a transistor with a high on-state current and an OS transistor is used as a transistor whose electrical characteristics hardly change due to a temperature change.

The OS transistor can be formed over a substrate such as an SOI substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, a base material film, or the like, as well as a glass substrate. Examples of the glass substrate include barium borosilicate glass, aluminoborosilicate glass, and soda lime glass. Examples of the flexible substrate, the attachment film, and the base material film, and the like are as follows. The examples include plastics typified by polyethylene terephthalate (PET), polyethylene naphthalate (PEN), polyether sulfone (PES), and polytetrafluoroethylene (PTFE). Another example is a resin such as acrylic. Other examples are polypropylene, polyester, polyvinyl fluoride, and polyvinyl chloride. Other examples are polyamide, polyimide, aramid, epoxy, an inorganic vapor deposition film, paper, and the like.

The transistor OTr1 included in the downconversion mixer DNCMX1 can be a transistor with a back gate. A downconversion mixer DNCMX2 illustrated in FIG. 3B has a structure in which a back gate is provided for the transistor OTr1 of the downconversion mixer DNCMX1, and the downconversion mixer DNCMX2 can be used as the downconversion mixer DNCMX in FIG. 1, like the downconversion mixer DNCMX1.

Figure 3B:
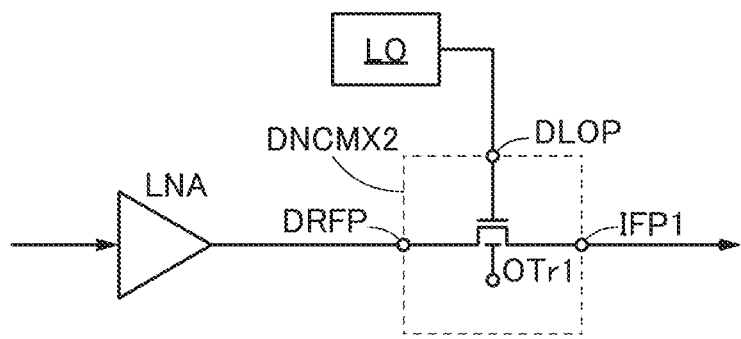

Although a point to which the back gate of the transistor OTr1 is electrically connected is not illustrated in FIG. 3B, the point to which the back gate of the transistor OTr1 is electrically connected can be freely determined in design of the high frequency receiver 100. For example, with a structure in which the gate and the back gate of the transistor OTr1 are electrically connected to each other, the driving frequency of the transistor of OTr1 can be increased and the amount of current flowing through the transistor OTr1 in an on state of the transistor OTr1 can be increased. Furthermore, for example, with a structure in which the back gate of the transistor OTr1 is provided with a wiring for electrical connection to an external circuit, the threshold voltage of the transistor OTr1 can be varied when a potential is applied to the back gate of the transistor OTr1 by the external circuit. Note that in addition to the transistor OTr1 of FIG. 3B, a transistor described in another part of this specification or a transistor illustrated in another drawing can have such a back gate. In that case, electrical connection to the back gate of the transistor can be freely determined as in the transistor OTr1 as described above.

In the downconversion mixer DNCMX1 in FIG. 3A or the downconversion mixer DNCMX2 in FIG. 3B, for example, an element, a circuit, or the like (e.g., a passive element (such as a resistor, a capacitor, a coil, or a transformer) or an active element (such as a transistor) may be connected between the terminal DRFP and the first terminal of the transistor OTr1. Similarly, an element, a circuit, or the like may be connected between the terminal IFP1 and the second terminal of the transistor OTr1, for example. For example, an element, a circuit, or the like may be connected between the terminal DLOP and the gate of the transistor OTr1. For example, as in a downconversion mixer DNCMX3 in FIG. 3C, a circuit that can be applied to the downconversion mixer DNCMX in FIG. 1 may be a circuit in which a circuit ANC1, a circuit ANC2, and a circuit ANC3 are connected between the terminal DRFP and the first terminal of the transistor OTr1, between the terminal IFP1 and the second terminal of the transistor OTr1, and between the terminal DLOP and the gate of the transistor OTr1, respectively, in the downconversion mixer DNCMX1 in FIG. 3A. Note that the circuit ANC1 to the circuit ANC3 can each be an element, a circuit, or the like.

Figure 3C:
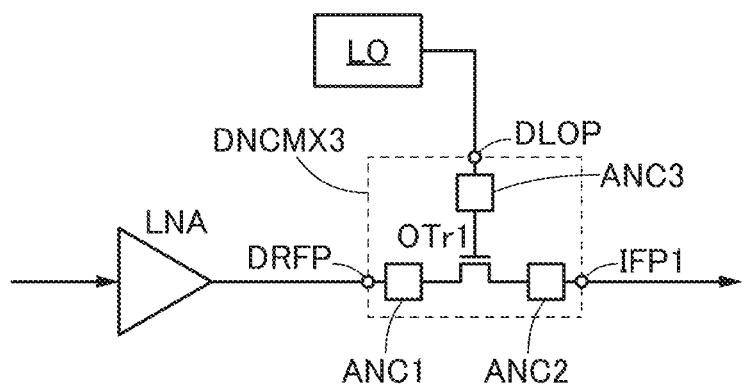
Figure 4:
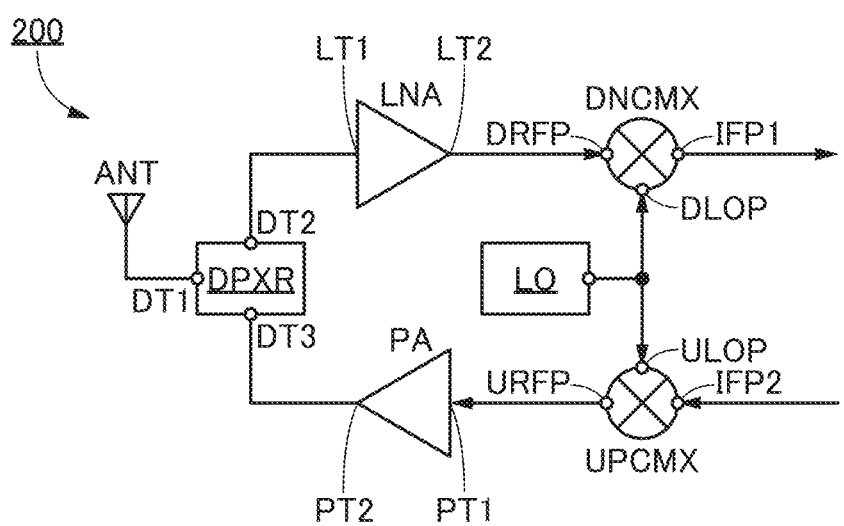
FIG. 4 is a block diagram illustrating a structure example of a semiconductor device.

Although the high frequency receiver 100 is described as an example of the semiconductor device including any one of the downconversion mixer DNCMX1 to the downconversion mixer DNCMX3 in FIG. 3A to FIG. 3C, one embodiment of the present invention is not limited thereto. For example, any one of the downconversion mixer DNCMX1 to the downconversion mixer DNCMX3 can also be applied to a high frequency transmitter and receiver. FIG. 4 illustrates a structure example of a high frequency transmitter and receiver 200, which corresponds to the front end of an FDD (Frequency Division Duplex) type transceiver as an example, and the downconversion mixer DNCMX included in the high frequency transmitter and receiver 200 can employ the structure in FIG. 3A to FIG. 3C.

The high frequency transmitter and receiver 200 is described below. Explanation of parts of the high frequency transmitter and receiver 200 that are common to the high frequency receiver 100 is omitted in some cases.

The high frequency transmitter and receiver 200 includes the antenna ANT, a duplexer DPXR, the low noise amplifier LNA, a power amplifier PA, the local oscillator LO, the downconversion mixer DNCMX, and an upconversion mixer UPCMX, for example.

The duplexer DPXR has a terminal DT1, a terminal DT2, and a terminal DT3. In addition, the low noise amplifier LNA has the terminal LT1 serving as an input terminal and the terminal LT2 serving as an output terminal. The power amplifier PA has a terminal PT1 serving as an input terminal and a PT2 serving as an output terminal. In addition, the downconversion mixer DNCMX has the terminal DRFP, the terminal DLOP, and the terminal IFP1. The upconversion mixer UPCMX has a terminal URFP, a terminal ULOP, and a terminal IFP2.

The antenna ANT is electrically connected to the terminal DTT of the duplexer DPXR. The terminal LT1 of the low noise amplifier LNA is electrically connected to the terminal DT2 of the duplexer DPXR and the terminal LT2 of the low noise amplifier LNA is electrically connected to the terminal DRFP of the downconversion mixer DNCMX. The terminal PT1 of the power amplifier PA is electrically connected to the terminal URFP of the upconversion mixer UPCMX and the terminal PT1 of the power amplifier PA is electrically connected to the terminal DT3 of the duplexer DPXR. The local oscillator LO is electrically connected to the terminal DLOP of the downconversion mixer DNCMX and the terminal ULOP of the upconversion mixer UPCMX.

The terminal IFP1 of the downconversion mixer DNCMX is electrically connected to a logic circuit or the like (not illustrated) included in the semiconductor device through the band pass filter, the amplifier, the analog-to-digital converter circuit, or the like, for example. Similarly, the terminal IFP2 of the upconversion mixer UPCMX is electrically connected to a logic circuit or the like (not illustrated) included in the semiconductor device, for example.

When the antenna ANT included in the high frequency transmitter and receiver 200 receives a radio wave with a frequency used for a carrier wave of wireless communication, the antenna ANT has a function of converting the radio wave to an RF signal, like the antenna ANT included in the high frequency receiver 100. In addition, when an RF signal is input to the antenna ANT included in the high frequency transmitter and receiver 200, the antenna ANT has a function of converting the RF signal to, for example, a radio wave with a frequency used for a carrier wave of wireless communication to transmit the radio wave to the outside.

The duplexer DPXR is a circuit used for an FDD-type transceiver or the like and has a function of electrically separating a signal path for transmission from a signal path for reception. Specifically, when the antenna ANT receives a radio signal from the outside, the duplexer DPXR has a function of bringing the connection between the antenna ANT and the terminal LT1 of the low noise amplifier LNA into a conduction state and bringing the connection between the antenna ANT and the terminal PT2 of the power amplifier PA into a non-conduction state. In addition, when the antenna ANT receives a radio signal from the outside, the duplexer DPXR also has a function of bringing the connection between the antenna ANT and the terminal LT1 of the low noise amplifier LNA into a non-conduction state and bringing the connection between the antenna ANT and the terminal PT2 of the power amplifier PA into a conduction state.

That is, with the use of the duplexer DPXR, the antenna ANT can be one antenna serving as both a transmission antenna and a reception antenna.

The power amplifier PA has a function of amplifying the voltage amplitude of the RF signal input to the input terminal to output the amplified electrical signal to the output terminal. Accordingly, the antenna ANT can receive the RF signal amplified by the power amplifier PA and convert the RF signal into a radio wave, for example.

Figure 5:
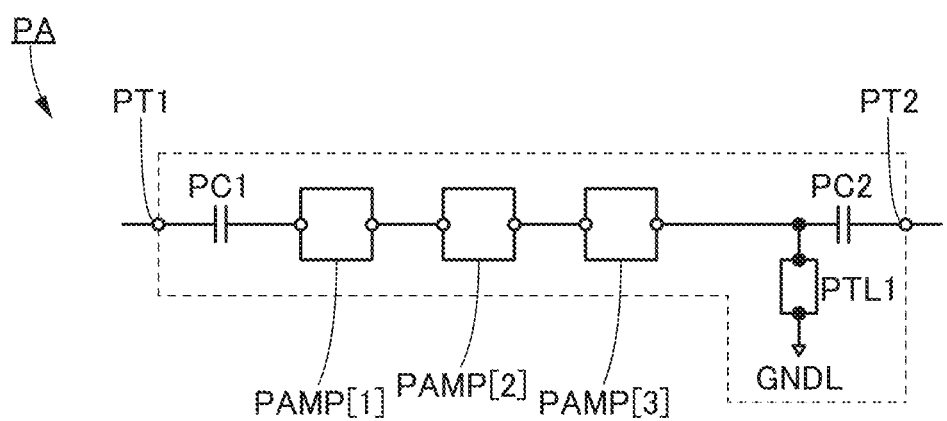
FIG. 5 is a block diagram illustrating a structure example of a circuit included in the semiconductor device.

The power amplifier PA can have, for example, a circuit structure illustrated in FIG. 5. The power amplifier PA illustrated in FIG. 5 has a structure of a three-stage power amplifier. Specifically, the power amplifier PA illustrated in FIG. 5 includes an amplifier PAMP[1] to an amplifier PAMP[3], a capacitor PC1, a capacitor PC2, and a transmission line PTL1.

The terminal PT1 is electrically connected to a first terminal of the capacitor PC1, and a second terminal of the capacitor PC2 is electrically connected to an input terminal of the amplifier PAMP[1]. An output terminal of the amplifier PAMP[1] is electrically connected to an input terminal of the amplifier PAMP[2]. An output terminal of the amplifier PAMP[2] is electrically connected to an input terminal of the amplifier PAMP[3]. An output terminal of the amplifier PAMP[3] is electrically connected to the wiring GNDL through the transmission line PTL1. The output terminal of the amplifier PAMP[3] is also electrically connected to a first terminal of the capacitor PC2, and the second terminal of the capacitor PC2 is electrically connected to the terminal PT2.

The transmission line PTL1 is a wiring for transmitting an electrical signal, like the transmission line LTL1 and the transmission line LTL2. Therefore, the transmission line PTL1 has input impedance, characteristic impedance, or the like.

The structures of the amplifier PAMP[1] to the amplifier PAMP[3] can each be, for example, the structure of the amplifier AMP in FIG. 2B, like the amplifier LAMP[1] to the amplifier LAMP[3]. That is, the power amplifier PA can be configured with the amplifier AMP in FIG. 2B.

The power amplifier PA has a three-stage structure of the amplifiers PAMP in FIG. 5 but may have two stages or four or more stages.

The local oscillator LO of the high frequency transmitter and receiver 200 has a function of generating a signal for converting a voltage waveform, like the local oscillator LO of the high frequency receiver 100. Specifically, the conversion is performed not only by the downconversion mixer DNCMX but also by the upconversion mixer UPCMX described below.

The upconversion mixer UPCMX has a function of mixing a signal transmitted from the local oscillator LO to the terminal ULOP with the IF signal input to the terminal IFP2 to generate an electrical signal having a frequency higher than that of the electrical signal input to the terminal IFP2. The generated electrical signal is output as an RF signal to the terminal URFP.

Although the electrical connection destination of the terminal IFP1 of the downconversion mixer DNCMX is not illustrated in FIG. 4, the IF signal output from the terminal IFP1 of the downconversion mixer DNCMX is transmitted to, for example, a processing unit through the band pass filter, the amplifier, the analog-to-digital converter circuit, or the like. Thus, the radio wave (specifically, a radio wave with a frequency used for a carrier wave of wireless communication) received from the antenna ANT of the high frequency transmitter and receiver 200 is resultantly converted to a digital signal. Then, in the processing unit, the data contained in the digital signal can be read out and processing can be conducted on the basis of the data.

Although not illustrated in FIG. 4, the terminal IFP2 of the upconversion mixer UPCMX can be electrically connected to the processing unit through the amplifier, the analog-to-digital converter circuit, or the like, for example. In the processing unit, for example, a digital signal containing data to be transmitted from the antenna ANT is generated and converted into an analog voltage by the analog-to-digital converter circuit. In addition, the voltage waveform of the analog voltage is converted by the upconversion mixer UPCMX. The converted analog voltage is transmitted to the antenna ANT through the power amplifier PA and the duplexer DPXR, and the antenna ANT converts the analog voltage into a radio wave with a frequency used for a carrier wave of wireless communication. Thus, the high frequency transmitter and receiver 200 can transmit data from the processing unit or the like to the outside as a radio wave.

Note that this embodiment can be combined with any of the other embodiments in this specification as appropriate.

Embodiment 2

This embodiment describes structure examples of a single-balanced mixer and a double-balanced mixer that can be used in the downconversion mixer DNCMX or the upconversion mixer UPCMX included in the high frequency receiver 100 and the high frequency transmitter and receiver 200 described in Embodiment 1.

In this specification and the like, the single-balanced mixer and the double-balanced mixer are collectively referred to as a "mixer" in some cases. In addition, the term "mixer" can be replaced with a mixer circuit, a mixing circuit, a mixing device a frequency mixing circuit, a frequency converter, a frequency converter circuit, or an analog multiplier, for example.

<Single-Balanced Mixer 1>

Figure 6A:
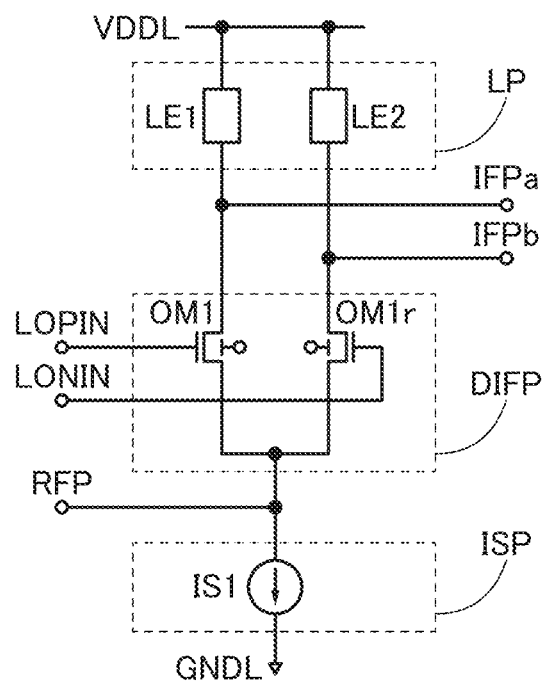
FIG. 6A and FIG. 6B are block diagrams each illustrating a structure example of a circuit included in the semiconductor device.

FIG. 6A illustrates an example of the single-balanced mixer that can be used in the downconversion mixer DNCMX, the upconversion mixer UPCMX, or the like. The single-balanced mixer SBMXA has a function of generating an IF signal of a differential signal by mixing an RF signal of a single-phase signal with a differential signal from the local oscillator LO, for example, when the single-balanced mixer SBMXA functions as a downconversion mixer. In addition, the single-balanced mixer SBMXA has a function of generating an RF signal of a differential signal by mixing an IF signal with a differential signal from the local oscillator LO, for example, when the single-balanced mixer SBMXA functions as an upconversion mixer.

The single-balanced mixer SBMXA of FIG. 6A includes a transistor OM1, a transistor OM1r, a load LET, a load LE2, and a current source IS1, for example.

As the load LET and the load LE2, for example, a resistor, an inductor, a diode, a transistor, or the like can be used. Moreover, as the load LET and the load LE2, a transistor which is driven in a linear region or a saturation region, a resistance-variable element, an MTJ (magnetic tunnel junction) element, or the like may be used. In addition, a current mirror circuit may be configured with the load LE1 and the load LE2.

Furthermore, it is not necessary to provide one of the load LE1 and the load LE2 depending on the structure of the single-balanced mixer SBMXA. For example, in a case where there is no need to output a signal from a terminal IFPb (where the terminal IFPb is not provided and an IF signal is output as a single-phase signal), the single-balanced mixer SBMXA may be electrically connected to the wiring VDDL and a first terminal of the transistor OM1r, without the load LE2.

In the single-balanced mixer SBMXA in FIG. 6A, the transistor OM1 and the transistor OM1r are included, for example, in a differential portion DIFP, the current source IS1 is included, for example, in a current source part ISP, and the load LE1 and the load LE2 are included, for example, in a load portion LP. Note that the structure of the single-balanced mixer SBMXA is not limited to the structure illustrated in FIG. 6A. For example, the single-balanced mixer SBMXA may have a structure in which the load LE1 and the load LE2 are included in the differential portion DIFP. Moreover, for example, the single-balanced mixer SBMXA may have a structure in which the load LE1 and the load LE2 are included in the current source part ISP.

A first terminal of the load LE1 is electrically connected to the wiring VDDL, and a second terminal of the load LE1 is electrically connected to the first terminal of the transistor OM1 and the terminal IFPa. In addition, a first terminal of the load LE2 is electrically connected to the wiring VDDL, and a second terminal of the load LE2 is electrically connected to the first terminal of the transistor OM1r and the terminal IFPb.

An input terminal of the current source IS1 is electrically connected to a second terminal of the transistor OM1, a second terminal of the transistor OM1r, and a terminal RFP. An output terminal of the current source IS1 is electrically connected to the wiring GNDL.

A gate of the transistor OM1 is electrically connected to a terminal LOPIN. A gate of the transistor OM1r is electrically connected to a terminal LONIN.

The terminal LOPIN and the terminal LONIN correspond to the terminal DLOP of the downconversion mixer DNCMX in FIG. 1. As an example, a signal from the local oscillator LO can be input to the terminal LOPIN. The voltage waveform of the signal can be a pulse voltage, for example. To the terminal LONIN, a signal (signal whose logic is inverted) with a phase difference of 180° from the above signal can be input.

The terminal RFP corresponds to the terminal DRFP of the downconversion mixer DNCMX in FIG. 1. An RF signal output from the output terminal of the low noise amplifier LNA can be input to the terminal RFPIN, for example.

The terminal IFPa and the terminal IFPb correspond to the terminal IFP1 of the downconversion mixer DNCMX in FIG. 1. Thus, the terminal IFPa and the terminal IFPb output differential signals generated in the single-balanced mixer SBMXA as IF signals.

Moreover, the single-balanced mixer SBMXA is configured to output an IF signal of a differential signal, but may convert the differential signal to a single-phase signal. Therefore, the single-balanced mixer SBMXA may have a structure in which the terminal IFPa and the terminal IFPb are electrically connected to a differential single-phase conversion circuit (sometimes referred to as a balanced-unbalanced circuit or a high-frequency transformer) (not illustrated). With this structure, the single-balanced mixer SBMXA can output a single-phase signal obtained by conversion of the IF signal that is a differential signal output from the terminal IFPa and the terminal IFPb.

The load portion LP has a function of supplying current to the first terminal of the transistor OM1 from the second terminal of the load LET and supplying current from the second terminal of the load LE2 to the first terminal of the transistor OM1r, depending on voltage supplied from the wiring VDDL, for example.

For example, the current source IS1 has a function of supplying a constant current to the output terminal from the input terminal. For example, the current source IS illustrated in FIG. 6C can be used as the current source IS1. The current source IS includes a transistor Itr, a terminal VI, a terminal VO, and a terminal VB. A first terminal of the transistor Itr is electrically connected to the terminal VI, a second terminal of the transistor Itr is electrically connected to the terminal VO, and a gate of the transistor Itr is electrically connected to the terminal VB. The terminal VI is electrically connected to the differential portion DIFP and the terminal RFP of the single-balanced mixer SBMXA, and the terminal VO is electrically connected to the wiring GNDL, for example. A constant voltage is input to the terminal VB to supply a constant current between the terminal VI and the terminal VO of the current source IS. The constant voltage can be, for example, a high-level potential or a potential that is higher than a ground potential (GND).

The differential portion DIFP has a function of generating a signal having a voltage waveform based on the voltage waveform of the RF signal input from the terminal RFP and the voltage waveform of a signal input from the terminal LOPIN and outputting the signal to the terminal IFPa, for example. The differential portion DIFP also has a function of generating a signal having a voltage waveform based on the voltage waveform of the RF signal input from the terminal RFP and the voltage waveform of a signal input from the terminal LONIN and outputting the signal to the terminal IFPb, for example.

Specifically, the transistor OM1 generates a signal with a frequency based on a product, a sum, a difference, or the like of the frequency of the RF signal input from the terminal RFP and the frequency of the signal input from the terminal LOPIN, to output the signal to the terminal IFPa. The transistor OM1r generates a signal with a frequency based on a product, a sum, a difference, or the like of the frequency of the RF signal input from the terminal RFP and the frequency of the signal input from the terminal LONIN, to output the signal to the terminal IFPb. The differential signals output from the terminal IFPa and the terminal IFPb are the IF signals which the single-balanced mixer SBMXA outputs.

Figure 7A:
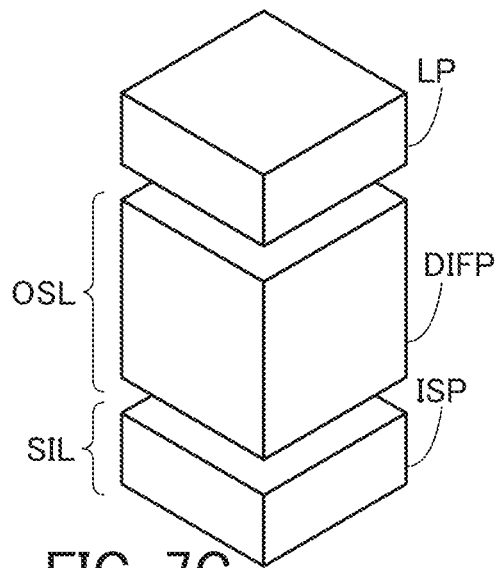
FIG. 7A to FIG. 7D are perspective views each illustrating a stacked-layer structure of a circuit included in the semiconductor device.

Incidentally, since the single-balanced mixer includes a plurality of circuit elements such as transistors in a load portion, a current source part, and a differential portion, the single-balanced mixer sometimes becomes large. In view of this, a structure of the single-balanced mixer SBMXA is considered in which the differential portion DIFP is provided above the current source part ISP and the load portion LP is provided above the differential portion DIFP as illustrated in FIG. 7A, for example. Specifically, a layer SIL includes the current source part ISP and a layer OSL includes the differential portion DIFP. The single-balanced mixer SBMXA has a structure where the current source part ISP, the differential portion DIFP, and the load portion LP are stacked, which can reduce the area occupied by the single-balanced mixer SBMXA.

In consideration of such a structure, preferably, the transistor included in the layer OSL is an OS transistor and the transistor included in the layer SIL is a Si transistor, for example. That is, it is preferable that the transistor OM1 and the transistor OM1r be OS transistors and that the transistor (e.g., the transistor Itr) included in the current source part ISP be a Si transistor. For example, the Si transistor is formed over a substrate and the OS transistor is formed above the Si transistor; thus, the single-balanced mixer illustrated in the schematic view of FIG. 7A can be formed. In addition, a stacked layer in which the OS transistor is formed above the Si transistor is described in detail in Embodiment 3.

Figure 7B:
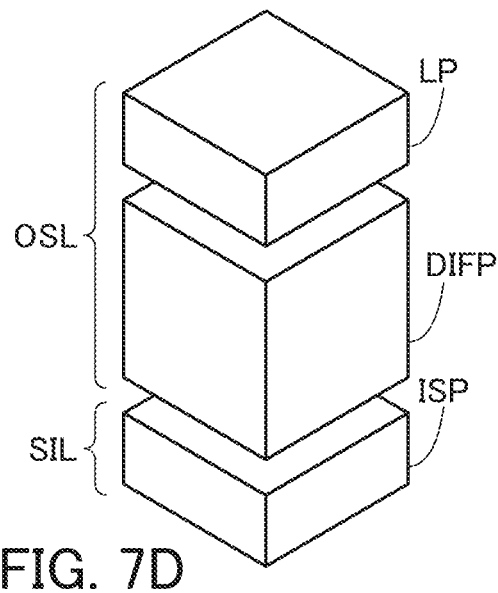
Figure 7C:
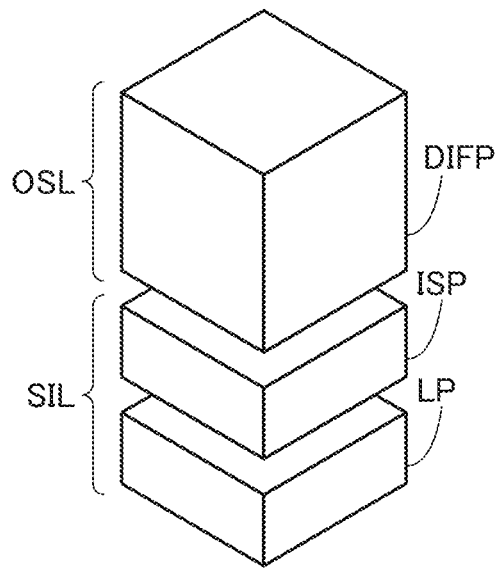
Figure 7D:
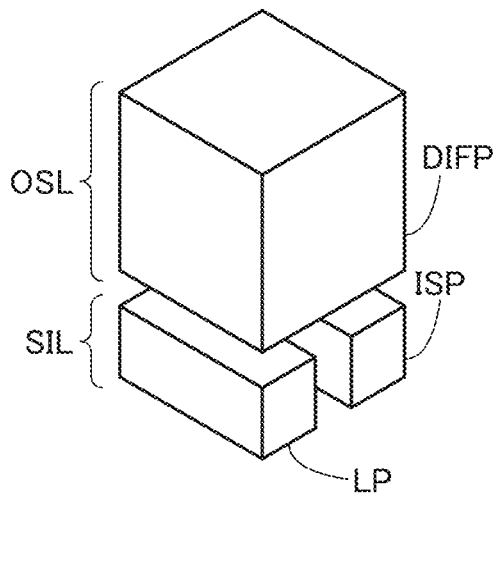

Note that the single-balanced mixer SBMXA of FIG. 6A is not limited to the stacked-layer structure illustrated in FIG. 7A. For example, the load portion LP may be included in the layer OSL as illustrated in FIG. 7B. For example, the load portion LP may be included in the layer SIL as illustrated in FIG. 7C. Although the load portion LP is provided above the differential portion DIFP in FIG. 7B, for example, the load portion LP may be provided above the current source part ISP and the differential portion DIFP may be provided above the load portion LP (not illustrated). Moreover, although the current source part ISP is provided above the load portion LP in FIG. 7C, for example, the load portion LP may be provided above the current source part ISP and the differential portion DIFP may be provided above the load portion LP (not illustrated). As illustrated in FIG. 7D, the layer SIL may be configured such that the current source part ISP and the load portion LP are not stacked with each other, for example. As in FIG. 7D, the layer OSL may be configured such that the differential portion DIFP and the load portion LP are not stacked with each other (not illustrated).

<Single-Balanced Mixer 2>

Next, another single-balanced mixer that is different from the single-balanced mixer SBMXA in FIG. 6A is described. An example of the single-balanced mixer that can be applied to the downconversion mixer DNCMX may be a single-balanced mixer SBMXB illustrated in FIG. 6B.

The single-balanced mixer SBMXB is described below. Note that description of parts of the single-balanced mixer SBMXB that are common to the single-balanced mixer SBMXA, is omitted.

The single-balanced mixer SBMXB has a structure of an active type single-balanced mixer, in which a circuit part ACP is provided in the single-balanced mixer SBMXA. Specifically, the circuit part ACP includes a transistor RFOM, and a first terminal of the transistor RFOM is electrically connected to the second terminal of the transistor OM1 and the second terminal of the transistor OM1r; a second terminal of the transistor RFOM is electrically connected to the input terminal of the current source IS1; and a gate of the transistor RFOM is electrically connected to the terminal RFP.

Figure 6B:
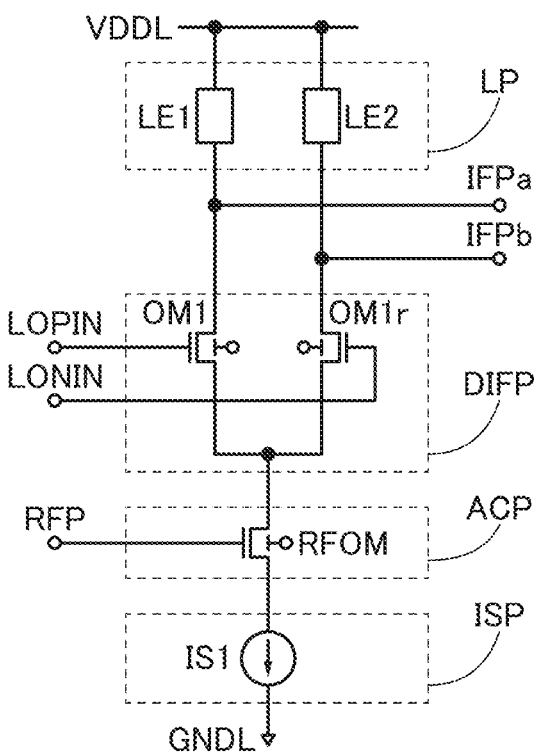
Figure 6C:
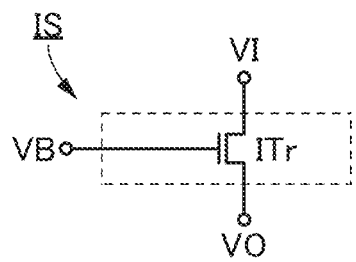
FIG. 6C is a circuit diagram illustrating an example of a current source.

Note that the structure of the single-balanced mixer SBMXB is not limited to the structure illustrated in FIG. 6B. The single-balanced mixer SBMXB may have, for example, a structure in which the transistor RFOM is included in the differential portion DIFP or a structure in which the transistor RFOM is included in the current source part ISP.

Like the single-balanced mixer SBMXA, the single-balanced mixer SBMXB has a structure where the current source part ISP, the circuit part ACP, the differential portion DIFP, and the load portion LP are stacked, which can reduce the area occupied by the single-balanced mixer SBMXB. Specifically, for example, as illustrated in FIG. 8A, the single-balanced mixer SBMXB can have a structure in which the circuit part ACP is provided above the current source part ISP, the differential portion DIFP is provided above the circuit part ACP, and the load portion LP is provided above the differential portion DIFP.

In particular, when the layer SIL includes the current source part ISP and the layer OSL includes the circuit part ACP and the differential portion DIFP, preferably, the transistor included in the layer SIL is applied to a Si transistor and the transistor included in the layer OSL is applied to an OS transistor. In other words, it is preferable that OS transistors be used as the transistor OM1, the transistor OM1r, and the transistor RFOM and that Si transistors be used as the transistors (e.g., the transistor Itr) included in the current source part ISP.

Figure 8A:
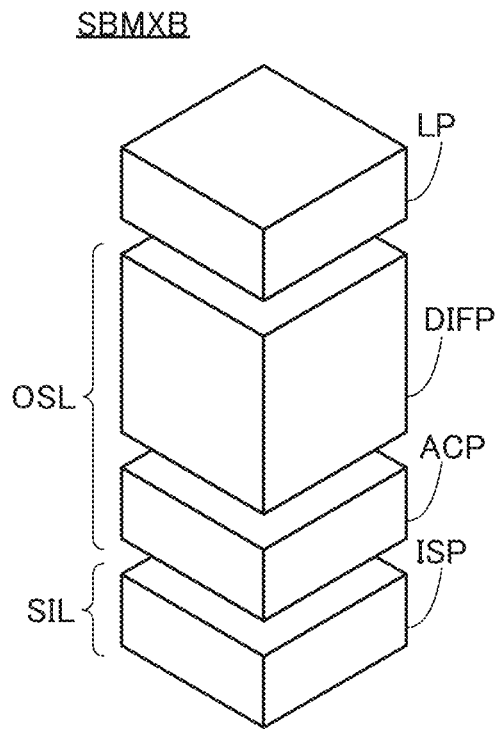
FIG. 8A to FIG. 8C are perspective views each illustrating a stacked-layer structure of a circuit included in the semiconductor device.

Note that the single-balanced mixer SBMXB of FIG. 6B is not limited to the stacked-layer structure illustrated in FIG. 8A. Although the circuit part ACP is included in the layer OSL in FIG. 8A, the circuit part ACP may be provided above the current source part ISP and the circuit part ACP and the current source part ISP may be included in the layer SIL (not illustrated). That is, OS transistors may be used as the transistor OM1 and the transistor OM1r and Si transistors may be used as the transistor included in the current source part ISP and the transistor RFOM.

Figure 8B:
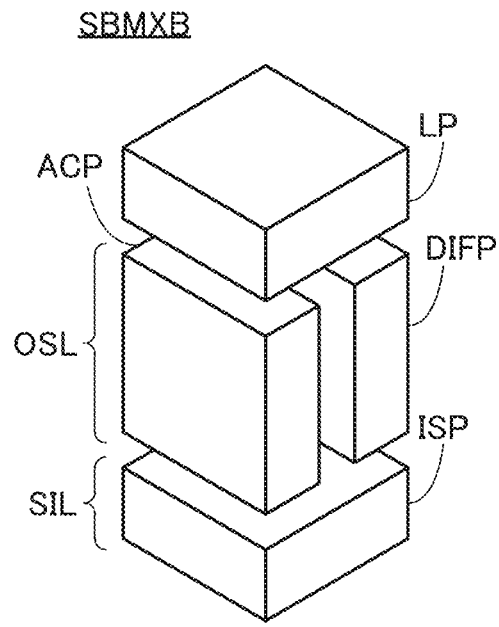
Figure 8C:
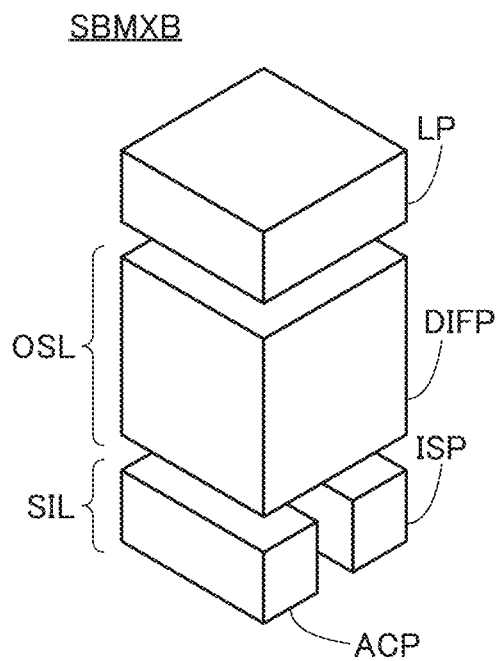

Alternatively, for example, as illustrated in FIG. 8B, the layer OSL may be configured such that the circuit part ACP and the differential portion DIFP are not stacked with each other. Furthermore, for example, as illustrated in FIG. 8C, the layer SIL may be configured such that the circuit part ACP and the current source part ISP are not stacked with each other.

<Double-Balanced Mixer 1>

Next, a double-balanced mixer that can reduce a second distortion more than the single-balanced mixer is described.

Figure 9A:
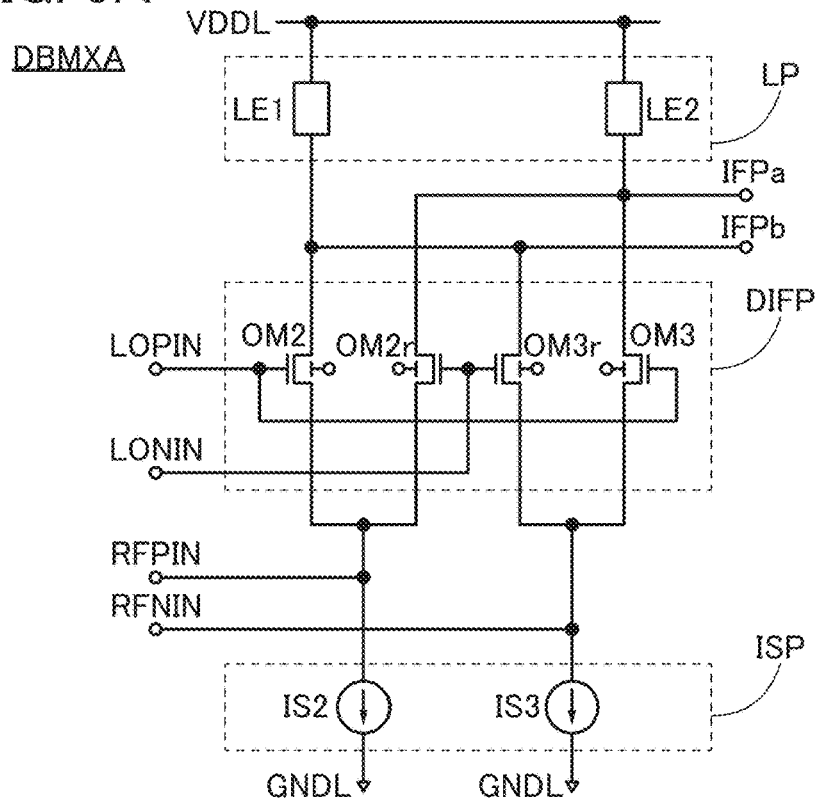
FIG. 9A and FIG. 9B are block diagrams each illustrating a structure example of a circuit included in the semiconductor device.

FIG. 9A illustrates an example of a double-balanced mixer that can be applied to the downconversion mixer DNCMX or the upconversion mixer UPCMX. The double-balanced mixer DBMXA has a function of generating an IF signal of a differential signal by mixing an RF signal of a differential signal with a differential signal from the local oscillator LO, for example, when functioning as a down-conversion mixer. In addition, the double-balanced mixer DBMXA has a function of generating an RF signal of a differential signal by mixing an IF signal with a differential signal from the local oscillator LO, for example, when functioning as an upconversion mixer.

The double-balanced mixer DBMXA includes a transistor OM2, a transistor OM2r, a transistor OM3, a transistor OM3r, the load LET, the load LE2, a current source IS2, and a current source IS3, as an example.

For the load LET and the load LE2, the description of the load LET and the load LE2 included in the single-balanced mixer SBMXA can be referred to.

In addition, one of the load LET and the load LE2 is not necessarily provided depending on the structure of the double-balanced mixer DBMXA. For example, in the case where there is no need to output a signal from the terminal IFPa (where the terminal IFPa is not provided and a signal-phase signal is output as an IF signal), the double-balanced mixer DBMXA may have a structure in which the wiring VDDL, a first terminal of the transistor OM2r, and a first terminal of the transistor OM3 are electrically connected to each other, without the load LE2.

In the structure of the double-balanced mixer DBMXA illustrated in FIG. 9A, the transistor OM2, the transistor OM2r, the transistor OM3, and the transistor OM3r are included in the differential portion DIFP as an example, the current source IS2 and the current source IS3 are included in the current source part ISP as an example, and the load LET and the load LE2 are included in the load portion LP as an example. Note that the double-balanced mixer DBMXB may have a structure in which the load LET and/or the load LE2 are/is included in the differential portion DIFP, a structure in which the load LET and/or the load LE2 are/is included in the current source part ISP, or a structure in which the load LET and/or the load LE2 are/is included in neither the differential portion DIFP nor the current source part ISP.

The first terminal of the load LET is electrically connected to the wiring VDDL, and the second terminal of the load LET is electrically connected to the first terminal of the transistor OM2 and a first terminal of the transistor OM3r, and the terminal IFPb. A first terminal of the load LE2 is electrically connected to the wiring VDDL, and the second terminal of the load LE2 is electrically connected to the first terminal of the transistor OM3 and the first terminal of the transistor OM2r, and the terminal IFPa.

An input terminal of the current source IS2 is electrically connected to a second terminal of the transistor OM2, a second terminal of the transistor OM2r, and the terminal RFPIN. An output terminal of the current source IS2 is electrically connected to the wiring GNDL. An input terminal of the current source IS3 is electrically connected to a second terminal of the transistor OM3, a second terminal of the transistor OM3r, and a terminal RFNIN. An output terminal of the current source IS3 is electrically connected to the wiring GNDL.

A gate of the transistor OM2 and a gate of the transistor OM3 are electrically connected to the terminal LOPIN. In addition, a gate of the transistor OM2r and a gate of the transistor OM3r are electrically connected to the terminal LONIN.

The terminal RFPIN and the terminal RFNIN correspond to the terminal DRFP of the downconversion mixer DNCMX in FIG. 1. For example, an RF signal of a differential signal is input to the terminal RFPIN and the terminal RFNIN. Specifically, for example, a signal input to the terminal RFNIN can be a signal with a phase advanced (or delayed) by a half wavelength from a phase of a signal input to the terminal RFPIN. This differential signal can be generating by converting an RF signal of a single-phase signal generated in the low noise amplifier LNA with use of a single-phase differential conversion circuit (also referred to as a balanced-unbalanced circuit, a high-frequency transformer). That is, the double-balanced mixer DBMXA may have a structure in which the single-phase differential conversion circuit is electrically connected to the terminal RFPIN and the terminal RFNIN (not illustrated). With this structure, the RF signal of the single-phase signal generated in the low noise amplifier LNA can be converted into a differential signal, and the differential signal can be input to the terminal RFPIN and the terminal RFNIN.

As another structure, for example, the double-balanced mixer DBMXA may have a structure in which a single-phase RF signal output from an output terminal of the low noise amplifier LNA is input to the terminal RFPIN and a ground potential is input to the terminal RFNIN.

For the terminal LOPIN, the terminal LONIN, the terminal IFPa, and the terminal IFPb, description of the terminal LOPIN, the terminal LONIN, the terminal IFPa, and the terminal IFPb included in the single-balanced mixer SBMXA is referred to.

The load portion LP has a function of supplying current to the first terminal of the transistor OM2 and the first terminal of the transistor OM3r from the second terminal of the load LE1, and supplying current to the first terminal of the transistor OM2r and the first terminal of the transistor OM3 from the second terminal of the load LE2 in accordance with a voltage supplied from the wiring VDDL, as an example.

The current source IS2 and the current source IS3 each have a function of supplying a constant current from the input terminal to the output terminal, for example. Note that the current source IS illustrated in FIG. 6C can be used as the current source IS2 and the current source IS3, for example.

In the differential portion DIFP, the transistor OM2 has a function of, for example, generating a signal (referred to as a first signal here) having a voltage waveform based on a voltage waveform of a signal input from the terminal RFPIN and a voltage waveform of a signal input from the terminal LOPIN. Furthermore, the transistor OM2r has a function of, for example, generating a signal (referred to as a second signal here) having a voltage waveform based on a voltage waveform of a signal input from the terminal RFPIN and a voltage waveform of a signal input from the terminal LONIN. The transistor OM3 has a function of, for example, generating a signal (referred to as a third signal here) having a voltage waveform based on a voltage waveform of a signal input from the terminal RFNIN and a voltage waveform of a signal input from the terminal LOPIN. The transistor OM3r has a function of, for example, generating a signal (referred to as a fourth signal here) having a voltage waveform based on a voltage waveform of a signal input from the terminal RFNIN and a voltage waveform of a signal input from the terminal LONIN.

Specifically, the first signal can be a signal with a frequency based on a product, a sum, a difference, or the like of the frequency of the signal input from the terminal RFPIN and a frequency of the signal input from the terminal LOPIN, for example. Similarly, the second signal can be a signal with a frequency based on a product, a sum, a difference, or the like of the frequency of a signal input from the terminal RFPIN and the frequency of the signal input from the terminal LONIN, for example, and the third signal can be a signal with a frequency based on a product, a sum, a difference, or the like of the frequency of a signal input from the terminal RFNIN and the frequency of the signal input from the terminal LOPIN, for example. The fourth signal can be a signal with a frequency based on a product, a sum, a difference, or the like of the frequency of a signal input from the terminal RFNIN and the frequency of the signal input from the terminal LONIN, for example. Note that the frequency conversion above can be determined in the accordance with the structure or the like of the load portion LP, for example.

Thus, the differential portion DIFP outputs the second signal and the third signal as first output signals to the terminal IFPa, and the first signal and the fourth signal as second output signals to the terminal IFPb. In this case, the first output signal and the second output signal correspond to the IF signals of the differential signals output from the terminal IFP1 of the downconversion mixer DNCMX in FIG. 1.

The double-balanced mixer DBMXA is configured to output the IF signal of the differential signal, or may convert the differential signal to a single-phase signal. Thus, the double-balanced mixer DBMXA may have a structure in which the differential single-phase conversion circuit is electrically connected to the terminal IFPa and the terminal IFPb (not illustrated). With this structure, the double-balanced mixer DBMXA can output a single-phase signal converted from the IF signal of the differential signal output from the terminal IFPa and the terminal IFPb.

Note that the double-balanced mixer DBMXA can have a structure in which the differential portion DIFP and the current source part ISP are stacked to reduce the circuit area, like the single-balanced mixer SBMXA. For example, when the double-balanced mixer DBMXA has the stacked structure in FIG. 7A in which the differential portion DIFP is included in the layer OSL and the current source part ISP is included in the layer SIL, OS transistors are used as the transistor OM2, the transistor OM2r, transistor OM3, and the transistor OM3r included in the differential portion DIFP, and Si transistors can be used as the transistors (e.g., the transistor Itr) included in the current source IS2 and the current source IS3.

For another example of the stacked structure of the double-balanced mixer DBMXA, the description of the example of the stacked structure of the single-balanced mixer SBMXA described above is referred to.

<Double-Balanced Mixer 2>

Next, another double-balanced mixer different from the double-balanced mixer DBMXA of FIG. 9A is described. The double-balanced mixer applicable to the downconversion mixer DNCMX may be, for example, the double-balanced mixer DBMXB illustrated in FIG. 9B. The double-balanced mixer applicable to the upconversion mixer UPCMX may be, for example, the double-balanced mixer DBMXB illustrated in FIG. 9B.

The double-balanced mixer DBMXB is described below. Note that description of parts of the double-balanced mixer DBMXB that are common to the double-balanced mixer DBMXA is omitted.

The double-balanced mixer DBMXB has the structure of an active-type double-balanced mixer in which the circuit part ACP is provided for the double-balanced mixer DBMXA. Specifically, the circuit part ACP includes a transistor RFOM1 and a transistor RFOM2. A first terminal of the transistor RFOM1 is electrically connected to the second terminal of the transistor OM2 and the second terminal of the transistor OM2r, a second terminal of the transistor RFOM1 is electrically connected to the input terminal of the current source IS2, and a gate of the transistor RFOM1 is electrically connected to the terminal RFPIN. In addition, a first terminal of the transistor RFOM2 is electrically connected to the second terminal of the transistor OM3 and the second terminal of the transistor OM3r, a second terminal of the transistor RFOM2 is electrically connected to the input terminal of the current source IS3, and a gate of the transistor RFOM2 is electrically connected to the terminal RFNIN.

Figure 9B:
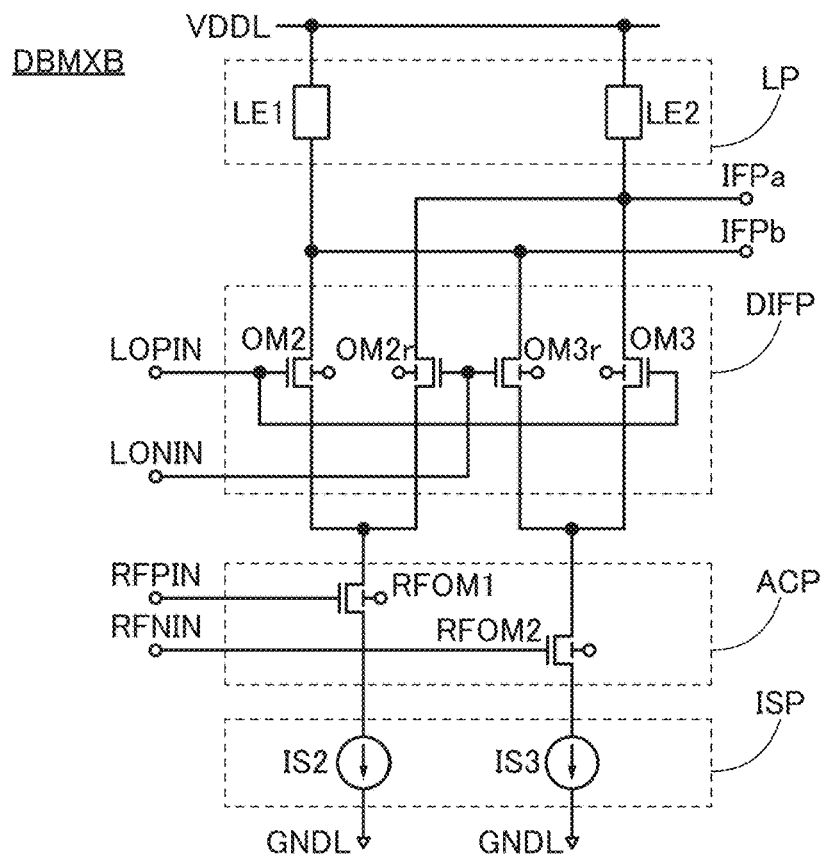

Note that the structure of the double-balanced mixer DBMXB is not limited to the structure illustrated in FIG. 9B. The double-balanced mixer DBMXB may have, for example, a structure in which the transistor RFOM1 and/or the transistor RFOM2 are/is included in the differential portion DIFP or a structure in which the transistor RFOM1 and/or the transistor RFOM2 are/is included in the current source part ISP.

Like the double-balanced mixer DBMXA, the double-balanced mixer DBMXB has a structure in which the current source part ISP, the circuit part ACP, the differential portion DIFP, and the load portion LP are stacked, which enables the circuit area of the double-balanced mixer DBMXB to be reduced.

For example, especially in the stacked-structure of the double-balanced mixer DBMXB, when the layer SIL includes the current source part ISP and the layer OSL includes the circuit part ACP and the differential portion DIFP as illustrated in FIG. 8A, the transistor included in the layer SIL is preferably applied to the Si transistor and the transistor included in the layer OSL is preferably applied to the OS transistor. In other words, it is preferable that OS transistors be used as the transistor OM2, the transistor OM2r, the transistor OM3, the transistor OM3r, the transistor RFOM1, and the transistor RFOM2 and that a Si transistor be used as the transistor (e.g., the transistor Itr) included in the current source part ISP.

For example, in the stacked-layer structure of the double-balanced mixer DBMXB, in the case where the layer SIL includes the circuit part ACP and the current source part ISP and the layer OSL includes differential portion DIFP as illustrated in FIG. 8C, it is preferable that the transistor included in the layer SIL be applied to the Si transistor and that the transistor included in the layer OSL be applied to the OS transistor. In other words, it is preferable that OS transistors be used as the transistor OM2, the transistor OM2r, the transistor OM3, and the transistor OM3r, and that Si transistors be used as the transistor included in the current source part ISP, the transistor RFOM1, and the transistor RFOM2.

For another example of the stacked structure of the double-balanced mixer DBMXB, the above description of the example of the stacked structure of the single-balanced mixer SBMXB is referred to.

Note that this embodiment can be combined with any of the other embodiments in this specification as appropriate.

Embodiment 3

This embodiment describes structure examples of the semiconductor device described in the above embodiment and structure examples of a transistor that can be applied to the semiconductor device.

<Structure Example of Semiconductor Device>

Figure 12A:
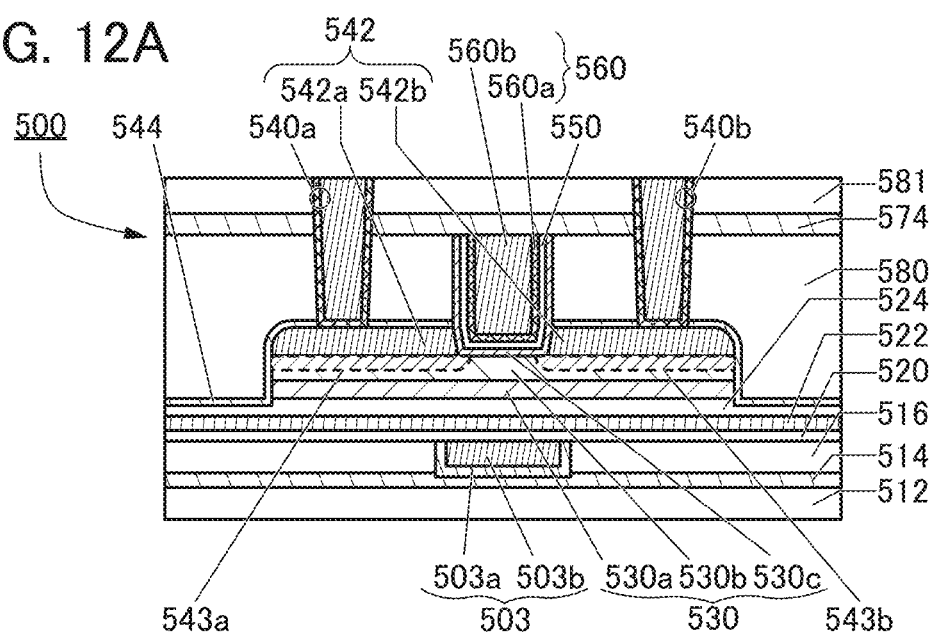
FIG. 12A to FIG. 12C are schematic cross-sectional views illustrating structure examples of transistors.
Figure 12B:
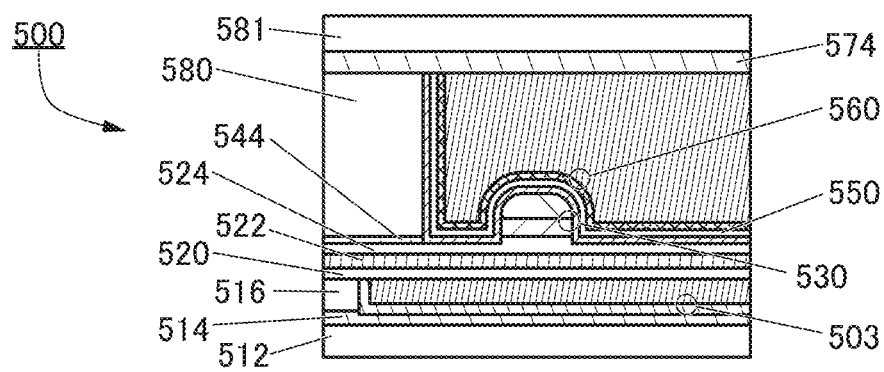
Figure 12C:
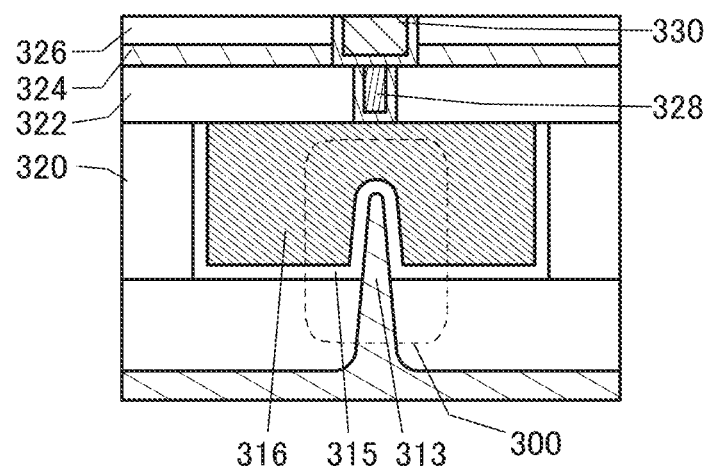

A semiconductor device illustrated in FIG. 10 includes a transistor 300, a transistor 500, and a capacitor 600. FIG. 12A is a cross-sectional view of the transistor 500 in the channel length direction, FIG. 12B is a cross-sectional view of the transistor 500 in the channel width direction, and FIG. 12C is a cross-sectional view of the transistor 300 in the channel width direction.

The transistor 500 is an OS transistor. The transistor 500 has features that the off-state current is low and that the field-effect mobility hardly changes even at high temperatures. When the transistor 500 is used as the transistors included in the downconversion mixer DNCMX in a semiconductor device, for example, the high frequency receiver 100 or the high frequency transmitter and receiver 200, the semiconductor device whose operation capability hardly decreases even at high temperatures can be realized.

The semiconductor device described in this embodiment includes the transistor 300, the transistor 500, and the capacitor 600 as illustrated in FIG. 10, for example. The transistor 500 is provided above the transistor 300, and the capacitor 600 is provided above the transistor 300 and the transistor 500, for example. Note that the capacitor 600 can be a capacitor included in the high frequency receiver 100, the high frequency transmitter and receiver 200, or the like described in the above embodiments. Note that the capacitor 600 illustrated in FIG. 10 is not necessarily provided depending on the structure of the high frequency receiver 100 or the high frequency transmitter and receiver 200.

The transistor 300 is provided over a substrate 311 and includes a conductor 316, an insulator 315, a semiconductor region 313 that is part of the substrate 311, and a low-resistance region 314a and a low-resistance region 314b each functioning as a source region or a drain region. Note that the transistor 300 can be used as, for example, the transistors included in the high frequency receiver 100, the high frequency transmitter and receiver 200, or the like described in the above embodiments. Specifically, the transistors can be transistors included in the band pass filter BPF, the IF amplifier IFA, the analog-to-digital converter circuit ADC, the local oscillator LO, or the like for example. FIG. 10 illustrates the structure in which a gate of the transistor 300 is electrically connected to one of a source and a drain of the transistor 500 through one of a pair of electrodes of the capacitor 600; however, depending on the structure of the high frequency receiver 100 or the high frequency transmitter and receiver 200, a structure in which one of a source and a drain of the transistor 300 is electrically connected to one of the source and the drain of the transistor 500 through one of the pair of electrodes of the capacitor 600 or a structure in which one of the source and the drain of the transistor 300 is electrically connected to a gate of the transistor 500 through one of the pair of electrodes of the capacitor 600 may be employed.

A semiconductor substrate (e.g., a single crystal substrate or a silicon substrate) is preferably used as the substrate 311.

In the transistor 300, the top surface and the side surface in the channel width direction of the semiconductor region 313 are covered with the conductor 316 with the insulator 315 therebetween, as illustrated in FIG. 12C. Such a Fin-type transistor 300 can have an increased effective channel width, and thus the transistor 300 can have improved on-state characteristics. In addition, contribution of an electric field of a gate electrode can be increased, so that the off-state characteristics of the transistor 300 can be improved.

Note that the transistor 300 can be either a p-channel transistor or an n-channel transistor.

A region of the semiconductor region 313 where a channel is formed, a region in the vicinity thereof, the low-resistance region 314a and the low-resistance region 314b each functioning as the source region or the drain region, or the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed, which employs silicon whose effective mass is controlled by stress application to the crystal lattice to change the lattice spacing. Alternatively, the transistor 300 may be an HEMT (High Electron Mobility Transistor) with the use of GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to a semiconductor material used for the semiconductor region 313.

For the conductor 316 functioning as a gate electrode, a semiconductor material such as silicon containing an element that imparts n-type conductivity, such as arsenic or phosphorus, or an element that imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 11:
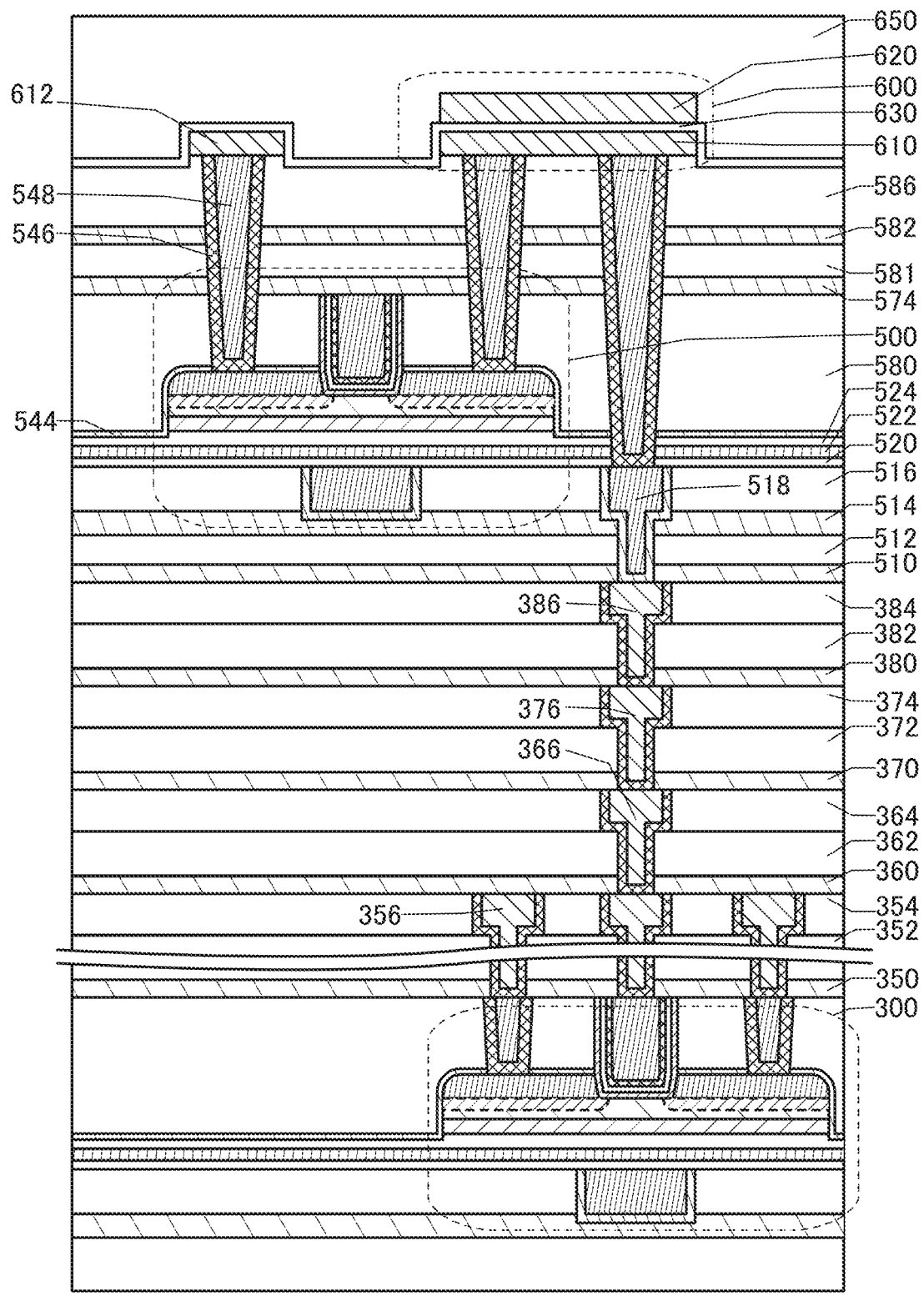
FIG. 11 is a schematic cross-sectional view illustrating a structure example of a semiconductor device.

Note that the transistor 300 illustrated in FIG. 10 is an example and the structure is not limited thereto; an appropriate transistor can be used in accordance with a circuit structure or a driving method. For example, when a semiconductor device is configured as a single-polarity circuit using only OS transistors, the transistor 300 may have a structure similar to that of the transistor 500 using an oxide semiconductor, as illustrated in FIG. 11. Note that the details of the transistor 500 are described later.

An insulator 320, an insulator 322, an insulator 324, and an insulator 326 are stacked in this order to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for planarizing a level difference caused by the transistor 300 or the like provided below the insulator 322. For example, a top surface of the insulator 322 may be planarized by planarization treatment using a chemical mechanical polishing (CMP) method or the like to increase planarity.

As the insulator 324, it is preferable to use a film having a barrier property that prevents diffusion of hydrogen or impurities from the substrate 311, the transistor 300, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film that release a small amount of hydrogen.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10\times10^{15}$ atoms/cm$^2$, preferably less than or equal to $5\times10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low permittivity is used for the interlayer film, the parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As a material of each of plugs and wirings (e.g., the conductor 328 and the conductor 330), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 10, an insulator 350, an insulator 352, and an insulator 354 are stacked in this order. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against hydrogen. The conductor 356 preferably contains a conductor having a barrier property against hydrogen. In particular, the conductor having a barrier property against hydrogen is formed in an opening portion of the insulator 350 having a barrier property against hydrogen. With this structure, the transistor 300 and the transistor 500 can be separated by the barrier layer, so that diffusion of hydrogen from the transistor 300 into the transistor 500 can be inhibited.

For the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of the wiring is maintained. In that case, a structure is preferable in which a tantalum nitride layer having a barrier property against hydrogen is in contact with the insulator 350 having a barrier property against hydrogen.

A wiring layer may be provided over the insulator 354 and the conductor 356. For example, in FIG. 10, an insulator 360, an insulator 362, and an insulator 364 are stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 300 and the transistor 500 can be separated by the barrier layer, so that diffusion of hydrogen from the transistor 300 into the transistor 500 can be inhibited.

A wiring layer may be provided over the insulator 364 and the conductor 366. For example, in FIG. 10, an insulator 370, an insulator 372, and an insulator 374 are stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

For example, like the insulator 324, the insulator 370 is preferably formed using an insulator having a barrier property against hydrogen. The conductor 376 preferably contains a conductor having a barrier property against hydrogen. In particular, the conductor having a barrier property against hydrogen is formed in an opening portion of the insulator 370 having a barrier property against hydrogen. With this structure, the transistor 300 and the transistor 500 can be separated by the barrier layer, so that diffusion of hydrogen from the transistor 300 into the transistor 500 can be inhibited.

A wiring layer may be provided over the insulator 374 and the conductor 376. For example, in FIG. 10, an insulator 380, an insulator 382, and an insulator 384 are stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

For example, like the insulator 324, the insulator 380 is preferably formed using an insulator having a barrier property against hydrogen. The conductor 386 preferably contains a conductor having a barrier property against hydrogen. In particular, the conductor having a barrier property against hydrogen is formed in an opening portion of the insulator 380 having a barrier property against hydrogen. With this structure, the transistor 300 and the transistor 500 can be separated by the barrier layer, so that diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked sequentially and provided over the insulator 384. A substance having a barrier property against oxygen or hydrogen is preferably used for any of the insulator 510, the insulator 512, the insulator 514, and the insulator 516.

For example, as the insulator 510 and the insulator 514, it is preferable to use a film having a barrier property that prevents diffusion of hydrogen or impurities from the substrate 311, a region where the transistor 300 is provided, or the like into the region where the transistor 500 is provided. Thus, a material similar to that for the insulator 324 can be used.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film that release a small amount of hydrogen.

As the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents transmission of oxygen and impurities such as hydrogen and moisture which would cause a change in the electrical characteristics of the transistor. Accordingly, aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

In addition, for the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film or a silicon oxynitride film can be used for the insulator 512 and the insulator 516, for example.

Furthermore, a conductor 518, a conductor included in the transistor 500 (a conductor 503 for example), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; hence, the diffusion of hydrogen from the transistor 300 into the transistor 500 can be inhibited.

The transistor 500 is provided above the insulator 512.

As illustrated in FIG. 12A and FIG. 12B, the transistor 500 includes the conductor 503 positioned to be embedded in the insulator 514 and the insulator 516, an insulator 520 positioned over the insulator 516 and the conductor 503, an insulator 522 positioned over the insulator 520, an insulator 524 positioned over the insulator 522, an oxide 530a positioned over the insulator 524, an oxide 530b positioned over the oxide 530a, a conductor 542a and a conductor 542b positioned apart from each other over the oxide 530b, an insulator 580 that is positioned over the conductor 542a and the conductor 542b and is provided with an opening formed to overlap with a region between the conductor 542a and the conductor 542b, an oxide 530c positioned on a bottom and a side surface of the opening, an insulator 550 positioned on a formation surface of the oxide 530c, and a conductor 560 positioned on a formation surface of the insulator 550.

As illustrated in FIG. 12A and FIG. 12B, an insulator 544 is preferably provided between the insulator 580 and the oxide 530a, the oxide 530b, the conductor 542a, and the conductor 542b. In addition, as illustrated in FIG. 12A and FIG. 12B, the conductor 560 preferably includes a conductor 560a provided inside the insulator 550 and a conductor 560b provided to be embedded inside the conductor 560a. As illustrated in FIG. 12A and FIG. 12B, the insulator 574 is preferably positioned over the insulator 580, the conductor 560, and the insulator 550.

Note that in the following description, the oxide 530a, the oxide 530b, and the oxide 530c are sometimes collectively referred to as an oxide 530.

The structure of the transistor 500 is shown, in which the three layers of the oxide 530a, the oxide 530b, and the oxide 530c are stacked in the region where the channel is formed and in its vicinity thereof; however, one embodiment of the present invention is not limited to the structure. For example, a single layer of the oxide 530b, a two-layer structure of the oxide 530b and the oxide 530a, a two-layer structure of the oxide 530b and the oxide 530c, or a stacked-layer structure of four or more layers may be employed. Furthermore, although the conductor 560 is shown to have a stacked-layer structure of two layers in the transistor 500, one embodiment of the present invention is not limited thereto. For example, the conductor 560 may have a single-layer structure or a stacked-layer structure of three or more layers. Note that the transistor 500 illustrated in FIG. 10, FIG. 12A, and FIG. 12B is an example, and the structure is not limited thereto; an appropriate transistor can be used in accordance with a circuit structure or a driving method.

Here, the conductor 560 functions as a gate electrode of the transistor, and each of the conductor 542a and the conductor 542b function as a source electrode or a drain electrode. As described above, the conductor 560 is formed to be embedded in the opening of the insulator 580 and the region interposed between the conductor 542a and the conductor 542b. The positions of the conductor 560, the conductor 542a, and the conductor 542b are selected in a self-aligned manner with respect to the opening in the insulator 580. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and the conductor 542a and the conductor 542b can be reduced. As a result, the switching speed of the transistor 500 can be increased, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 500 can be controlled by changing a potential applied to the conductor 503 independently of a potential applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

In addition, the conductor 503 has a structure similar to that of the conductor 518; a conductor 503a is formed in contact with an inner wall of an opening in the insulator 514 and the insulator 516, and a conductor 503b is formed on the inner side. Although the transistor 500 having a structure in which the conductor 503a and the conductor 503b are stacked is illustrated, one embodiment of the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are unlikely to pass) is preferably used. Alternatively, it is preferable to use a conductive material that has a function of inhibiting diffusion of oxygen (e.g., at least one of an oxygen atom, an oxygen molecule, and the like) (through which the above oxygen is unlikely to pass). Note that in this specification, a function of inhibiting diffusion of impurities or oxygen means a function of inhibiting diffusion of any one or all of the above impurities and the above oxygen.

For example, when the conductor 503a has a function of inhibiting diffusion of oxygen, a reduction in conductivity by oxidation of the conductor 503b can be inhibited.

In addition, in the case where the conductor 503 also functions as a wiring, a conductive material with high conductivity that contains tungsten, copper, or aluminum as its main component is preferably used for the conductor 503b. Note that the conductor 503b is shown as a single layer but may have a stacked-layer structure, for example, a stack of the above conductive material and titanium or titanium nitride.

The insulator 520, the insulator 522, and the insulator 524 have a function of a second gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in a range of higher than or equal to 100° C. and lower than or equal to 700° C., or higher than or equal to 100° C. and lower than or equal to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of VoH is cut occurs, i.e., a reaction of "VoH→Vo+H" occurs. Part of hydrogen generated at this time is bonded to oxygen to be $H_2O$, and removed from the oxide 530 or an insulator near the oxide 530 in some cases. Part of hydrogen is diffused into or gettered (also referred to as gettering) by the conductor 542a and the conductor 542b in some cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies (Vo). The heat treatment may be performed under reduced pressure. Alternatively, the heat treatment may be performed in such a manner that heat treatment is performed in a nitrogen gas or inert gas atmosphere, and then heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, in other words, a reaction of "Vo+O→null" is promoted. Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of VoH.

When the insulator 524 includes an excess-oxygen region, it is preferable that the insulator 522 have a function of inhibiting diffusion of oxygen (e.g., oxygen atoms and oxygen molecules) (or that the above oxygen be less likely to pass through the insulator 522).

When the insulator 522 has a function of inhibiting diffusion of oxygen or impurities, oxygen contained in the oxide 530 is not diffused to the insulator 520 side, which is preferable. Furthermore, the reaction of the conductor 503 with oxygen included in the insulator 524 and the oxide 530 can be suppressed.

The insulator 522 is preferably a single layer or stacked layers using an insulator containing a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST). As miniaturization and high integration of transistors progress, a problem such as leakage current may arise because of a thinner gate insulating film. When a high-k material is used for the insulator functioning as the gate insulating film, a gate potential at the time when the transistor operates can be reduced while the physical thickness is maintained.

It is particularly preferable to use an insulator containing an oxide of one or both of aluminum and hafnium, which is an insulating material having a function of inhibiting diffusion of impurities, oxygen, and the like (through which the above oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

It is preferable that the insulator 520 be thermally stable. For example, silicon oxide and silicon oxynitride, which have thermal stability, are suitable. Furthermore, when an insulator that is a high-k material is combined with silicon oxide or silicon oxynitride, the insulator 520 having a stacked-layer structure that has thermal stability and a high relative permittivity can be obtained.

Note that in the transistor 500 in FIG. 12A and FIG. 12B, the insulator 520, the insulator 522, and the insulator 524 are shown as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including the channel formation region. For example, as the oxide 530, a metal oxide such as an In-M-Zn oxide (the element M is one or more selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, the In-M-Zn oxide which can be used for the oxide 530 is preferably a CAAC-OS (C-Axis Aligned Crystalline Oxide Semiconductor) or a CAC-OS (Cloud-Aligned Composite Oxide Semiconductor). Furthermore, an In—Ga oxide, an In—Zn oxide, an In oxide, or the like may be used as the oxide 530.

Furthermore, a metal oxide with a low carrier concentration is preferably used in the transistor 500. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in a metal oxide include hydrogen, nitrogen, alkali metal, alkaline earth metal, iron, nickel, and silicon.

In particular, hydrogen contained in a metal oxide reacts with oxygen bonded to a metal atom to become water, and thus forms oxygen vacancies in the metal oxide in some cases. In the case where hydrogen enters an oxygen vacancy in the oxide 530, the oxygen vacancy and the hydrogen are bonded to each other to form VoH in some cases. The VoH serves as a donor and an electron that is a carrier is generated in some cases. In other cases, bonding of part of hydrogen to oxygen bonded to a metal atom generates electrons serving as carriers. Thus, a transistor using a metal oxide containing a large amount of hydrogen is likely to have normally-on characteristics. Moreover, hydrogen in a metal oxide easily moves by stress such as heat and an electric field; thus, the reliability of a transistor may be low when the metal oxide contains a plenty of hydrogen. In one embodiment of the present invention, VoH in the oxide 530 is preferably reduced as much as possible so that the oxide 530 becomes a highly purified intrinsic or substantially highly purified intrinsic oxide. It is important to remove impurities such as moisture and hydrogen in a metal oxide (sometimes described as dehydration or dehydrogenation treatment) and to compensate for oxygen vacancies by supplying oxygen to the metal oxide (sometimes described as oxygen supplying treatment) to obtain a metal oxide whose VoH is sufficiently reduced. When a metal oxide in which impurities such as VoH are sufficiently reduced is used for a channel formation region of a transistor, stable electrical characteristics can be given.

A defect in which hydrogen has entered an oxygen vacancy can function as a donor of a metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Consequently, when a metal oxide is used for the oxide 530, hydrogen in the metal oxide is preferably reduced as much as possible. Specifically, the hydrogen concentration of the metal oxide obtained by secondary ion mass spectrometry (SIMS) is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently low concentration of impurities such as hydrogen is used for a channel formation region of a transistor, the transistor can have stable electrical characteristics.

In the case where a metal oxide is used as the oxide 530, the metal oxide is an intrinsic (also referred to as i-type) or substantially intrinsic semiconductor that has a large band gap, and the carrier concentration of the metal oxide in the channel formation region is preferably lower than $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. Note that the lower limit of the carrier concentration of the metal oxide in the channel formation region is not particularly limited and can be, for example, $1\times10^{-9}$ cm$^{-3}$.

In the case where a metal oxide is used as the oxide 530, contact between the oxide 530 and each of the conductor 542*a* and the conductor 542*b* may diffuse oxygen in the oxide 530 into the conductor 542*a* and the conductor 542*b*, resulting in oxidation of the conductor 542*a* and the conductor 542*b*. It is highly possible that oxidation of the conductor 542*a* and the conductor 542*b* lowers the conductivity of the conductor 542*a* and the conductor 542*b*. Note that diffusion of oxygen from the oxide 530 into the conductor 542*a* and the conductor 542*b* can be rephrased as absorption of oxygen in the oxide 530 by the conductor 542*a* and the conductor 542*b*.

When oxygen in the oxide 530 is diffused into the conductor 542*a* and the conductor 542*b*, a different layer is sometimes formed between the conductor 542*a* and the oxide 530*b* and between the conductor 542*b* and the oxide 530*b*. The different layer contains a larger amount of oxygen than the conductor 542*a* and the conductor 542*b* and thus presumably has an insulating property. In this case, a three-layer structure of the conductor 542*a* or the conductor 542*b*, the different layer, and the oxide 530*b* can be regarded as a three-layer structure of a metal, an insulator, and a semiconductor and is sometimes referred to as a MIS (Metal-Insulator-Semiconductor) structure or referred to as a diode-connected structure mainly formed of the MIS structure.

The above different layer is not necessarily formed between the oxide 530*b* and the conductor 542*a* and the conductor 542*b*; for example, the different layer may be formed between the oxide 530*c* and the conductor 542*a* and the conductor 542*b*, or between the oxide 530*b* and the conductor 542*a* and the conductor 542*b*, and between the oxide 530*c* and the conductor 542*a* and the conductor 542*b*.

The metal oxide functioning as the channel formation region in the oxide 530 has a band gap of preferably 2 eV or more, further preferably 2.5 eV or more. With use of a metal oxide having such a wide bandgap, the off-state current of the transistor can be reduced.

When the oxide 530 includes the oxide 530*a* under the oxide 530*b*, it is possible to inhibit diffusion of impurities into the oxide 530*b* from the components formed below the oxide 530*a*. Moreover, including the oxide 530*c* over the oxide 530*b* makes it possible to inhibit diffusion of impurities into the oxide 530*b* from the components formed above the oxide 530*c*.

Note that the oxide 530 preferably has a stacked-layer structure of a plurality of oxide layers that differ in the atomic ratio of metal atoms. Specifically, the atomic proportion of the element M in the constituent elements in the metal oxide used as the oxide 530*a* is preferably higher than the atomic proportion of the element M in the constituent elements in the metal oxide used as the oxide 530*b*. In addition, the atomic ratio of the element M to In in the metal oxide used as the oxide 530*a* is preferably higher than the atomic ratio of the element M to In in the metal oxide used as the oxide 530*b*. Furthermore, the atomic ratio of In to the element M in the metal oxide used as the oxide 530*b* is preferably higher than the atomic ratio of In to the element M in the metal oxide used as the oxide 530*a*. As the oxide

530c, it is possible to use a metal oxide that can be used as the oxide 530a or the oxide 530b.

Specifically, as the oxide 530a, a metal oxide in which an atomic ratio of In to Ga and Zn is In:Ga:Zn=1:3:4 or 1:1:0.5 is favorably used. In addition, as the oxide 530b, a metal oxide in which an atomic ratio of In to Ga and Zn is In:Ga:Zn=4:2:3 or 1:1:1 is favorably used. In addition, as the oxide 530c, a metal oxide in which an atomic ratio of In to Ga and Zn is In:Ga:Zn=1:3:4 or an atomic ratio of Ga to Zn is Ga:Zn=2:1 or Ga:Zn=2:5 is favorably used. Specific examples of the case where the oxide 530c has a stacked-layer structure include a stacked-layer structure of a layer in which an atomic ratio of In to Ga and Zn is In:Ga:Zn=4:2:3 and a layer with In:Ga:Zn=1:3:4; a stacked-layer structure of a layer in which an atomic ratio of Ga to Zn is Ga:Zn=2:1 and a layer in which an atomic ratio of In to Ga and Zn is In:Ga:Zn=4:2:3; a stacked-layer structure of a layer in which an atomic ratio of Ga to Zn is Ga:Zn=2:5 and a layer in which an atomic ratio of In to Ga and Zn is In:Ga:Zn=4:2:3; and a stacked-layer structure of gallium oxide and a layer in which an atomic ratio of In to Ga and Zn is In:Ga:Zn=4:2:3.

For example, in the case where the atomic ratio of In to the element M in the metal oxide used as the oxide 530a is lower than the atomic ratio of In to the element M in the metal oxide used as the oxide 530b, an In—Ga—Zn oxide having a composition with an atomic ratio of In:Ga:Zn=5:1:6 or a neighborhood thereof, In:Ga:Zn=5:1:3 or a neighborhood thereof, In:Ga:Zn=10:1:3 or a neighborhood thereof, or the like can be used as the oxide 530b.

As the oxide 530b, it is also possible to use a metal oxide having a composition of In:Zn=2:1, a composition of In:Zn=5:1, a composition of In:Zn=10:1, or a composition in the neighborhood of any one of these compositions, other than the above-described compositions.

These oxide 530a, the oxide 530b, and the oxide 530c are preferably combined to satisfy the above relation of the atomic ratios. For example, it is preferable that the oxide 530a and the oxide 530c each be a metal oxide having a composition of In:Ga:Zn=1:3:4 or a composition in the neighborhood thereof and the oxide 530b be a metal oxide having a composition of In:Ga:Zn=4:2:3 to 4:2:4.1 or a composition in the neighborhood thereof. Note that the above composition represents the atomic ratio of an oxide formed over a base or the atomic ratio of a sputtering target. Moreover, it is suitable that the proportion of In is increased in the composition of the oxide 530b because the transistor can have a higher on-state current, higher field effect mobility, or the like.

In addition, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To change the energy level gradually, the densities of defect states in mixed layers formed at an interface between the oxide 530a and the oxide 530b and an interface between the oxide 530b and the oxide 530c are favorably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, it is preferable to use an In—Ga—Zn oxide, a Ga—Zn oxide, gallium oxide, or the like as the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and thus the transistor 500 can have a high on-state current.

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are illustrated in FIG. 12A and FIG. 12B, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

As illustrated in FIG. 12A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier concentration of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one or more selected from hafnium, aluminum, gallium, yttrium, zirconium, tungsten, titanium, tantalum, nickel, germanium, neodymium, lanthanum, magnesium, and the like can be used as the insulator 544. Moreover, silicon nitride oxide, silicon nitride, or the like can be used as the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose the conductivity even after absorbing oxygen. Design is appropriately set in consideration of required transistor characteristics.

With the insulator 544, diffusion of impurities such as water and hydrogen contained in the insulator 580 into the oxide 530b through the oxide 530c and the insulator 550 can be inhibited. Furthermore, oxidation of the conductor 560 due to excess oxygen contained in the insulator 580 can be inhibited.

The insulator 550 functions as a first gate insulating film. The insulator 550 is preferably positioned in contact with the inner side (the top surface and the side surface) of the oxide 530c. Like the insulator 524 described above, the insulator 550 is preferably formed using an insulator that contains excess oxygen and releases oxygen by heating.

Specifically, it is possible to use any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide, each of which contains excess oxygen. In particular, silicon oxide and silicon oxynitride are preferable because they are thermally stable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably lowered. The thickness of the insulator 550 is preferably greater than or equal to 1 nm and less than or equal to 20 nm.

To efficiently supply excess oxygen contained in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 can be used.

Note that the insulator 550 may have a stacked-layer structure like the second gate insulating film. As miniaturization and high integration of transistors progress, a problem such as leakage current may arise because of a thinner gate insulating film; for that reason, when the insulator functioning as a gate insulating film has a stacked-layer structure of a high-k material and a thermally stable material, a gate potential at the time when the transistor operates can be lowered while the physical thickness of the gate insulating film is maintained. Furthermore, the stacked-layer structure can be thermally stable and have a high relative permittivity.

Although the conductor 560 functioning as the first gate electrode has a two-layer structure in FIG. 12A and FIG. 12B, the conductor 560 may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting oxygen diffusion, tantalum, tantalum nitride, ruthenium, or ruthenium oxide is preferably used, for example. For the conductor 560a, the oxide semiconductor that can be used as the oxide 530 can be used. In that case, when the conductor 560b is deposited by a sputtering method, the conductor 560a can have a reduced electrical resistance value to be a conductor. This can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus is preferably a conductor having high conductivity. For example, a conductive material containing tungsten, copper, or aluminum as its main component can be used. Moreover, the conductor 560b may have a stacked-layer structure, for example, a stacked-layer structure of the above conductive material and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 from which oxygen is released by heating is provided in contact with the oxide 530c, oxygen in the insulator 580 can be efficiently supplied to the oxide 530 through the oxide 530c. The concentration of impurities such as water or hydrogen in the insulator 580 is preferably lowered.

The opening of the insulator 580 is formed to overlap with the region between the conductor 542a and the conductor 542b. Accordingly, the conductor 560 is formed to be embedded in the opening in the insulator 580 and the region sandwiched between the conductor 542a and the conductor 542b.

The gate length needs to be short for miniaturization of the semiconductor device, but it is necessary to prevent a reduction in conductivity of the conductor 560. When the conductor 560 is made thick for that, the conductor 560 might have a shape with a high aspect ratio. In this embodiment, the conductor 560 is provided to be embedded in the opening in the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 550. When the insulator 574 is deposited by a sputtering method, excess-oxygen regions can be provided in the insulator 550 and the insulator 580. Thus, oxygen can be supplied from the excess-oxygen regions to the oxide 530.

For example, a metal oxide containing one or more selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Thus, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 and the like, the concentration of impurities such as water or hydrogen in the insulator 581 is preferably lowered.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to structures of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture, which are factors of a change in electrical characteristics of the transistor. Accordingly, aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

An insulator 586 is provided over the insulator 582. For the insulator 586, a material similar to that for the insulator 320 can be used. Furthermore, when a material with a comparatively low permittivity is used for these insulators, parasitic capacitance generated between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using a material similar to those for the conductor 328 and the conductor 330.

Note that after the transistor 500 is formed, an opening may be formed to surround the transistor 500 and an insulator having a high barrier property against hydrogen or water may be formed to cover the opening. Surrounding the transistor 500 by the insulator having a high barrier property can prevent entry of moisture and hydrogen from the outside. Alternatively, a plurality of transistors 500 may be collectively surrounded by the insulator having a high barrier property against hydrogen or water. In the case where an opening is formed to surround the transistor 500, for example, the formation of an opening reaching the insulator 514 or the insulator 522 and the formation of the insulator having a high barrier property in contact with the insulator 514 or the insulator 522 are suitable because these formation steps can also serve as some of the manufacturing steps of the transistor 500. For the insulator having a high barrier property against hydrogen or water, a material similar to that for the insulator 522 can be used, for example.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are illustrated in FIG. 10, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap the conductor 610 with the insulator 630 therebetween. For the conductor 620, a conductive material such as a metal material, an alloy material, or a metal oxide material can be used. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, can be used.

An insulator 650 is provided over the conductor 620 and the insulator 630. The insulator 650 can be provided using a material similar to that for the insulator 320. The insulator 650 may function as a planarization film that covers an uneven shape thereunder.

With the use of this structure, change in electrical characteristics can be inhibited and the reliability can be improved in a semiconductor device using a transistor including an oxide semiconductor. Alternatively, a semiconductor device using a transistor including an oxide semiconductor can be miniaturized or highly integrated.

Next, other structure examples of the OS transistors illustrated in FIG. 10 and FIG. 11 are described.

Figure 13A:
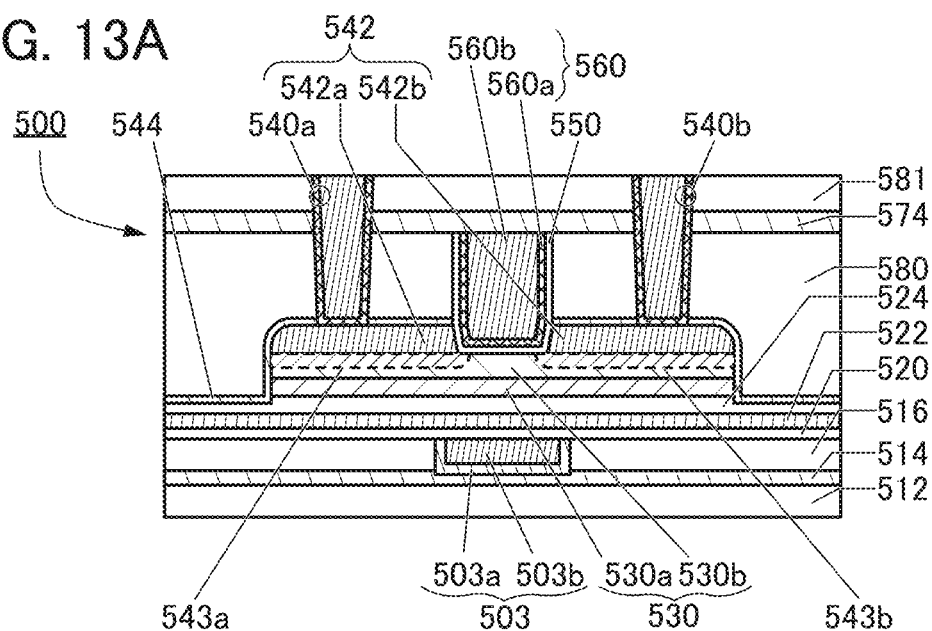
FIG. 13A and FIG. 13B are schematic cross-sectional views illustrating a structure example of a transistor.
Figure 13B:
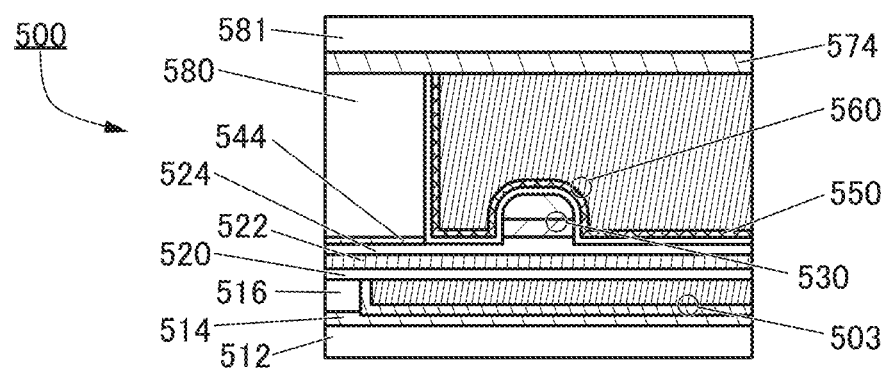

FIG. 13A and FIG. 13B illustrate a modification example of the transistor 500 illustrated in FIG. 12A and FIG. 12B. FIG. 13A is a cross-sectional diagram of the transistor 500 in the channel length direction and FIG. 13B is a cross-sectional diagram of the transistor 500 in the channel width direction. Note that the structure illustrated in FIG. 13A and FIG. 13B can be employed for other transistors, such as the transistor 300, included in the semiconductor device of one embodiment of the present invention.

The transistor 500 with the structure illustrated in FIG. 13A and FIG. 13B is different from the transistor 500 with the structure illustrated in FIG. 12A and FIG. 12B in that the oxide 530c is not provided. Therefore, the insulator 550 is provided on the bottom and side surfaces of the opening portion of the insulator 580, which is formed between the conductor 542a and the conductor 542b, and a conductor 560 is provided on a surface where the insulator 550 is formed.

Since the transistor 500 with the structure illustrated in FIG. 13A and FIG. 13B does not include the oxide 530c, parasitic capacitance between the oxide 530c and the conductor 560 with the insulator 550 therebetween can be eliminated. Thus, the operation frequency of the transistor 500 can be increased. In particular, when transistors with high operation frequency are used as transistors included in a circuit such as a mixer or an amplifier, the circuit can deal with AC voltage having a high frequency.

Figure 14A:
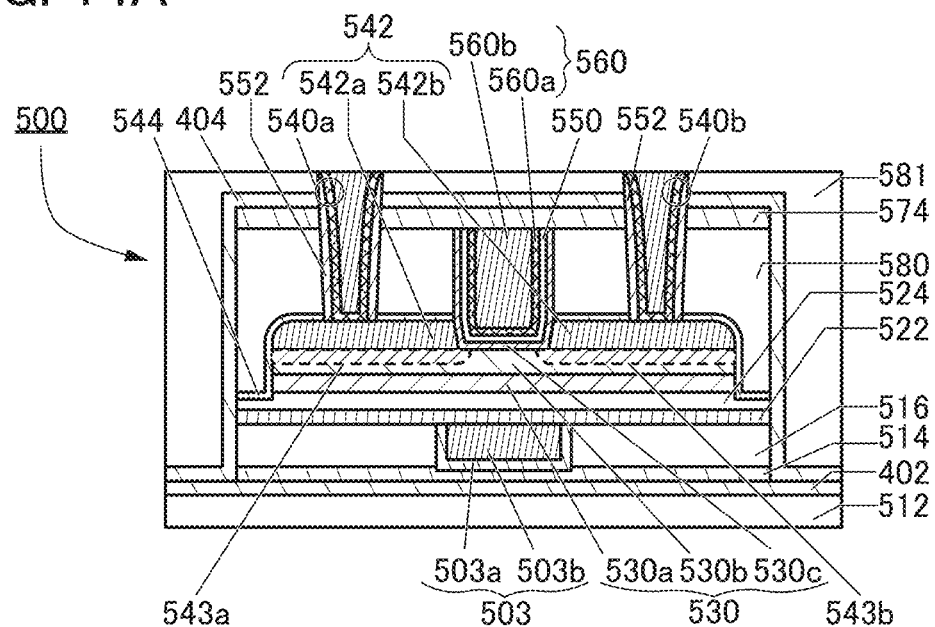
FIG. 14A and FIG. 14B are schematic cross-sectional views illustrating a structure example of a transistor.
Figure 14B:
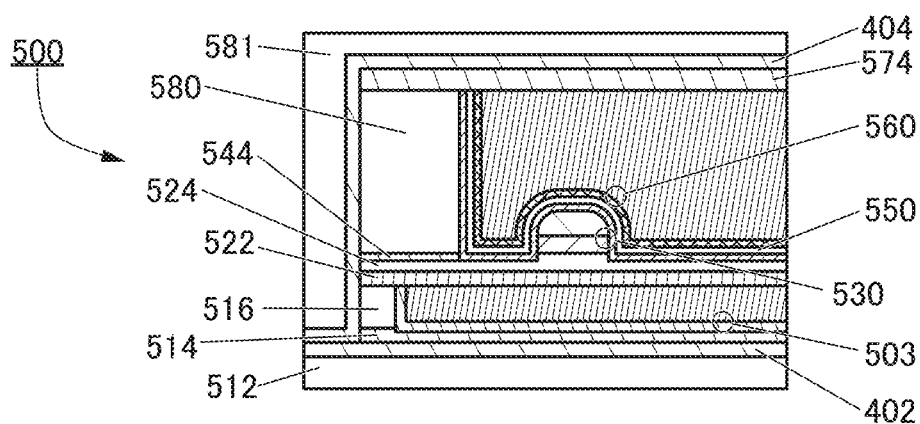

FIG. 14A and FIG. 14B illustrate a modification example of the transistor 500 illustrated in FIG. 12A and FIG. 12B, which is different from the example illustrated in FIG. 13A and FIG. 13B. FIG. 14A is a cross-sectional view of the transistor 500 in the channel length direction and FIG. 14B is a cross-sectional view of the transistor 500 in the channel width direction. Note that the structure illustrated in FIG. 14A and FIG. 14B can also be employed for other transistors included in the semiconductor device of one embodiment of the present invention, such as the transistor 300.

The transistor 500 illustrated in FIG. 14A and FIG. 14B includes the insulator 402 and the insulator 404, which is different from the transistor 500 illustrated in FIG. 12A and FIG. 12B. In addition, insulators 552 are provided in contact with a side surface of the conductor 540a and a side surface of the conductor 540b, which are also different from the transistor 500 illustrated in FIG. 12A and FIG. 12B. Furthermore, the insulator 520 is not included, which is different from the transistor 500 illustrated in FIG. 12A and FIG. 12B.

In the transistor 500 having the structure illustrated in FIG. 14A and FIG. 14B, the insulator 402 is provided over the insulator 512. In addition, the insulator 404 is provided over the insulator 574 and the insulator 402.

In the transistor 500 having the structure illustrated in FIG. 14A and FIG. 14B, the insulator 514, the insulator 516, the insulator 522, the insulator 524, the insulator 544, the insulator 580, and the insulator 574 are provided and covered with the insulator 404. That is, the insulator 404 is in contact with the top surface of the insulator 574, the side surface of the insulator 574, the side surface of the insulator 580, the side surface of the insulator 544, the side surface of the insulator 524, the side surface of the insulator 522, the side surface of the insulator 516, the side surface of the insulator 514, and the top surface of the insulator 402. Thus, the oxide 530 and the like are isolated from the outside by the insulator 404 and the insulator 402.

It is preferable that the insulator 402 and the insulator 404 have higher capability of inhibiting diffusion of hydrogen (e.g., at least one of a hydrogen atom, a hydrogen molecule, and the like) or a water molecule. For example, the insulator 402 and the insulator 404 are preferably formed using silicon nitride or silicon nitride oxide that is a material having a high hydrogen barrier property. This can inhibit the diffusion of hydrogen or the like into the oxide 530, whereby the deterioration of the characteristics of the transistor 500 can be inhibited. Consequently, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, for the insulator 552, an insulator such as silicon nitride, aluminum oxide, or silicon nitride oxide that is a material having a high hydrogen barrier property is preferably used. In particular, it is preferable to use silicon nitride as the insulator 552 because of its high hydrogen barrier property. By using a material having a high hydrogen barrier property for the insulator 552, the diffusion of impurities such as water or hydrogen from the insulator 580 and the like into the oxide 530 through the conductor 540a and the conductor 540b can be inhibited. Furthermore, oxygen contained in the insulator 580 can be inhibited from being absorbed by the conductor 540a and the conductor 540b. As described above, the reliability of the semiconductor device of one embodiment of the present invention can be increased.

Figure 15:
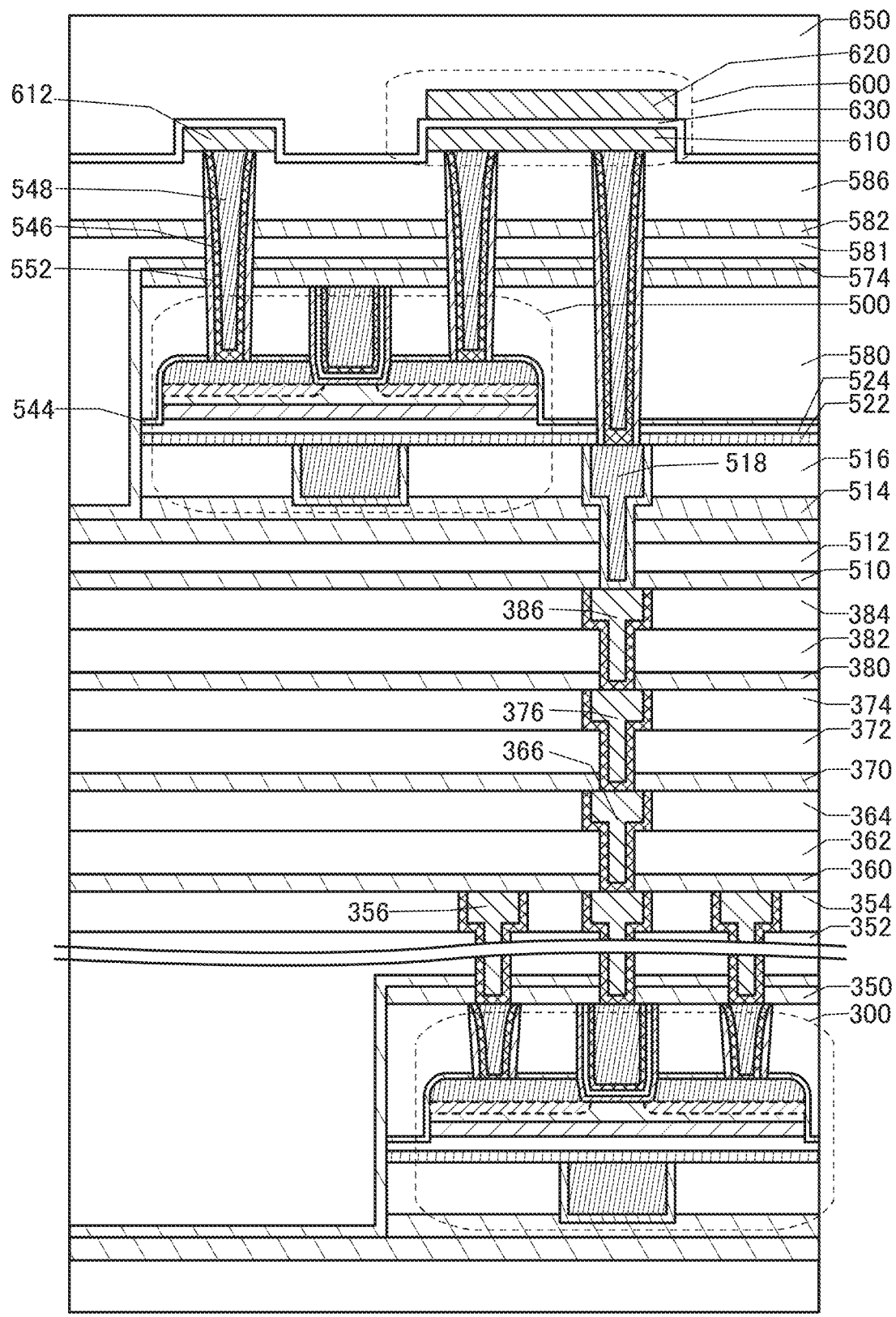
FIG. 15 is a schematic cross-sectional view illustrating a structure example of a semiconductor device.

FIG. 15 is a cross-sectional view showing a structure example of a semiconductor device in the case where the transistor 500 and the transistor 300 each have the structure illustrated in FIG. 14A and FIG. 14B. The insulator 552 is provided on the side surface of the conductor 546.

Figure 16A:
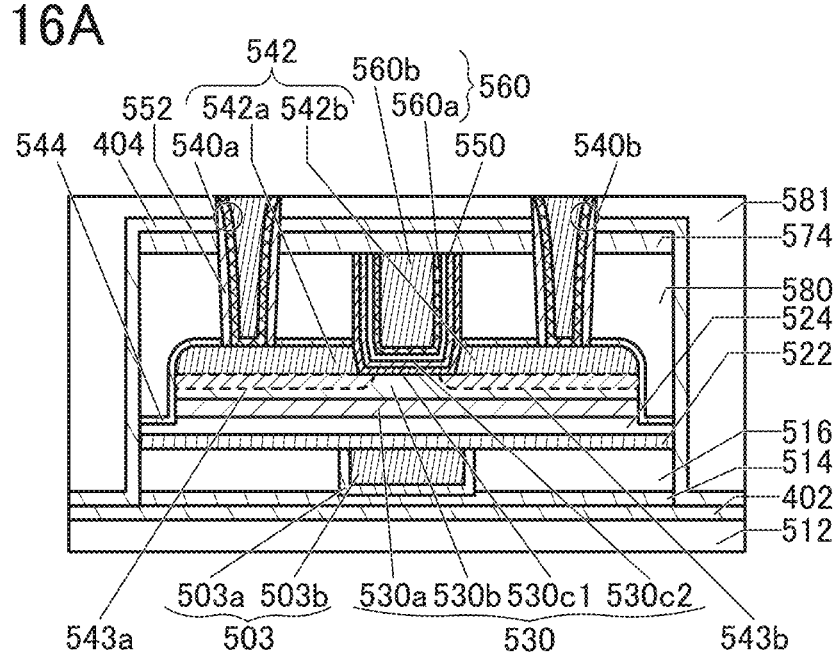
FIG. 16A and FIG. 16B are schematic cross-sectional views illustrating a structure example of a transistor.
Figure 16B:
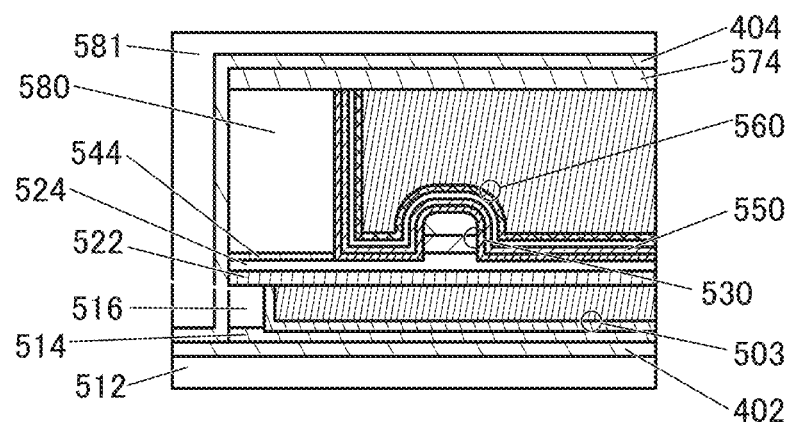

The transistor structure of the transistor 500 illustrated in FIG. 14A and FIG. 14B may be changed depending on the situation. As the modification example of the transistor 500 illustrated in FIG. 14A and FIG. 14B, a transistor illustrated in FIG. 16A and FIG. 16B can be employed, for example. FIG. 16A is a cross-sectional view of the transistor in the channel length direction and FIG. 16B is a cross-sectional view of the transistor in the channel width direction. The transistor illustrated in FIG. 16A and FIG. 16B is different from the transistor illustrated in FIG. 14A and FIG. 14B in that the oxide 530c has a two-layer structure of an oxide 530c1 and an oxide 530c2.

The oxide 530c1 is in contact with the top surface of the insulator 524, the side surface of the oxide 530a, the top surface and the side surface of the oxide 530b, the side surfaces of the conductor 542a and the conductor 542b, the side surface of the insulator 544, and the side surface of the insulator 580. The oxide 530c2 is in contact with the insulator 550.

An In—Zn oxide can be used as the oxide 530c1, for example. For the oxide 530c2, it is possible to use a material similar to a material used for the oxide 530c when the oxide 530c has a single-layer structure. For example, as the oxide 530c2, a metal oxide with In:Ga:Zn=1:3:4 [atomic ratio], Ga:Zn=2:1 [atomic ratio], or Ga:Zn=2:5 [atomic ratio] can be used.

When the oxide 530c has a two-layer structure of the oxide 530c1 and the oxide 530c2, the on-state current of the transistor can be increased as compared with the case where the oxide 530c has a single-layer structure. Thus, the transistor can be used as a power MOS transistor, for example. Note that the oxide 530c included in the transistor illustrated in FIG. 12A and FIG. 12B can also have a two-layer structure of the oxide 530c1 and the oxide 530c2.

The transistor having the structure illustrated in FIG. 16A and FIG. 16B can be used as, for example, the transistor 300 illustrated in FIG. 10 and FIG. 11. For example, as described above, the transistor 300 can be used as transistors or the like included in the high frequency receiver 100, the high frequency transmitter and receiver 200, and the like described in the above embodiment, or the like. Note that the transistor illustrated in FIG. 16A and FIG. 16B can be employed as a transistor other than the transistor 300 and the transistor 500 which are included in the semiconductor device of one embodiment of the present invention.

Figure 17:
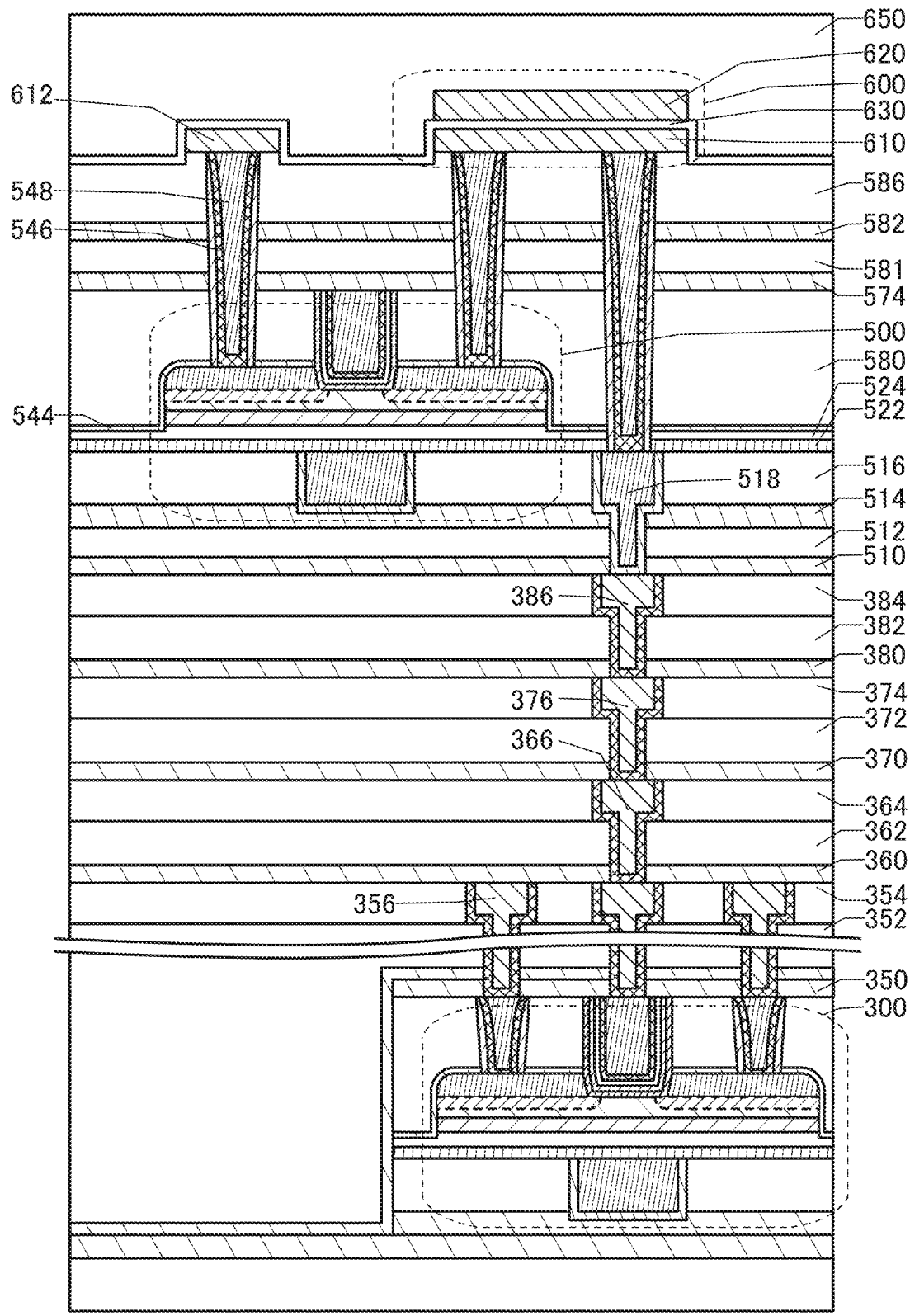
FIG. 17 is a schematic cross-sectional view illustrating a structure example of a semiconductor device.

FIG. 17 is a cross-sectional view illustrating a structure example of a semiconductor device in which the transistor illustrated in FIG. 12A is used as the transistor 500 and the transistor illustrated in FIG. 16A is used as the transistor 300. Note that a structure is employed where the insulator 552 is provided on the side surface of the conductor 546 as in FIG. 15. As illustrated in FIG. 17, in the semiconductor device of one embodiment of the present invention, the transistor 300 and the transistor 500 can have different structures while the transistor 300 and the transistor 500 are both OS transistors.

Next, a capacitor that can be used in the semiconductor devices in FIG. 10, FIG. 11, FIG. 15, and FIG. 17 is described.

Figure 18A:
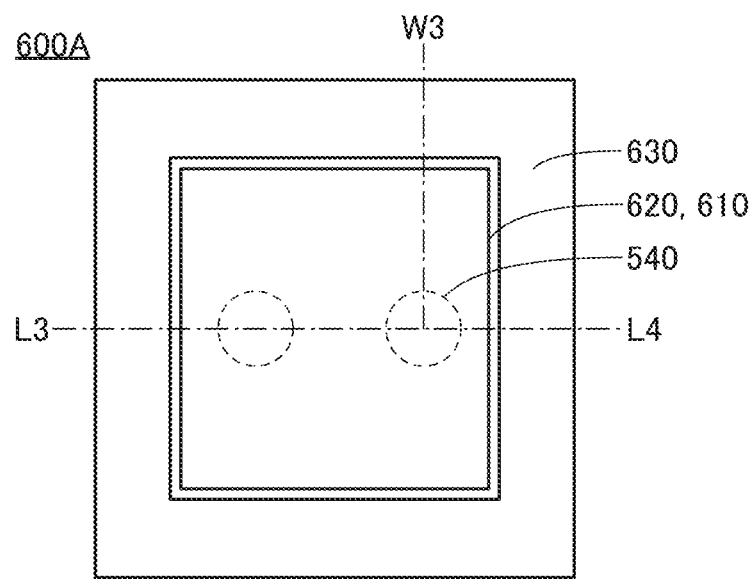
FIG. 18A is a top view illustrating a structure example of a capacitor.
Figure 18B:
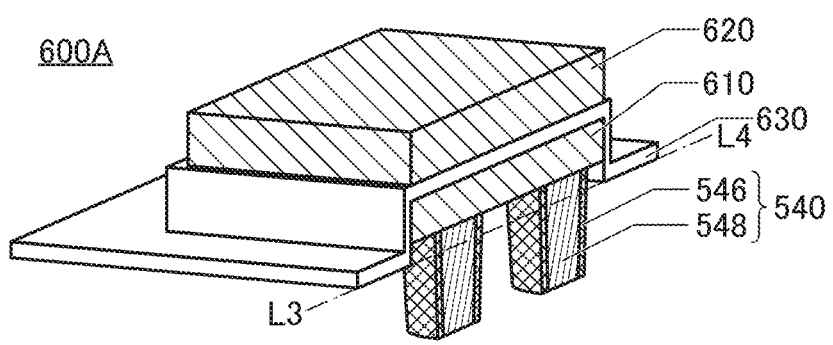
FIG. 18B and FIG. 18C are cross-sectional perspective views illustrating a structure example of the capacitor.
Figure 18C:
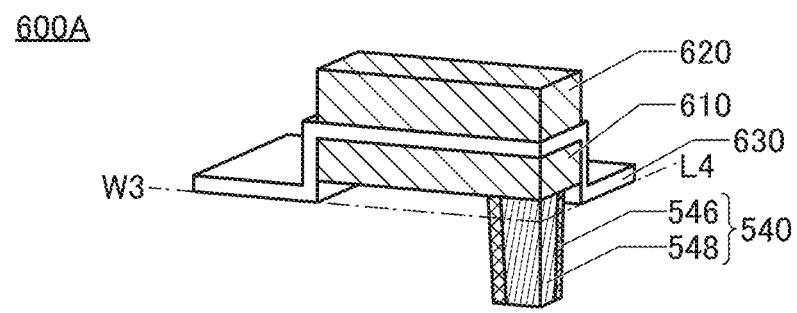

FIGS. 18A to 18C illustrate a capacitor 600A as an example of the capacitor 600 that can be used in the semiconductor devices shown in FIG. 10, FIG. 11, FIG. 15, and FIG. 17. FIG. 18A is a top view of the capacitor 600A, FIG. 18B is a perspective view illustrating a cross section of the capacitor 600A along the dashed-dotted line L3-L4, and FIG. 18C is a perspective view illustrating a cross section of the capacitor 600A along the dashed-dotted line W3-L4.

The conductor 610 functions as one of a pair of electrodes of the capacitor 600A, and the conductor 620 functions as the other of the pair of electrodes of the capacitor 600A. The insulator 630 functions as a dielectric between the pair of electrodes.

The insulator 630 can be provided to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or zirconium oxide. Furthermore, in this specification, hafnium oxynitride refers to a material that contains oxygen at a higher proportion than nitrogen, and hafnium nitride oxide refers to a material that contains nitrogen at a higher proportion than oxygen.

Alternatively, for the insulator 630, a stacked-layer structure using a material with high dielectric strength such as silicon oxynitride and a high permittivity (high-k) material may be used, for example. In the capacitor 600A having such a structure, a sufficient capacitance can be ensured owing to the high permittivity (high-k) insulator, and the dielectric strength can be increased owing to the insulator with high dielectric strength, so that the electrostatic breakdown of the capacitor 600A can be inhibited.

As the insulator of a high permittivity (high-k) material (a material having a high relative permittivity), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like can be given.

Alternatively, for example, a single layer or stacked layers of an insulator containing a high-k material, such as aluminum oxide, hafnium oxide, tantalum oxide, zirconium oxide, lead zirconate titanate (PZT), strontium titanate ($SrTiO_3$), or $(Ba,Sr)TiO_3$ (BST), may be used as the insulator 630. In the case where the insulator 630 has stacked layers, a three-layer structure in which zirconium oxide, aluminum oxide, and zirconium oxide are formed in this order, or a four-layer structure in which zirconium oxide, aluminum oxide, zirconium oxide, and aluminum oxide are formed in this order can be employed, for example. For the insulator 630, a compound containing hafnium and zirconium may be employed. When the semiconductor device is miniaturized and highly integrated, a dielectric used for a gate insulator and a capacitor becomes thin, which might cause a problem of leakage current of a transistor and a capacitor. When a high-k material is used as an insulator functioning as the dielectric used for the gate insulator and the capacitor, a gate potential during operation of the transistor can be lowered and the capacitance of the capacitor can be ensured while the physical thickness is kept.

A bottom portion of the conductor 610 in the capacitor 600 is electrically connected to the conductor 546 and the conductor 548. The conductor 546 and the conductor 548 function as plugs or wirings for connection to another circuit element. In FIG. 18A to FIG. 18C, the conductor 546 and the conductor 548 are collectively referred to as a conductor 540.

For clarification of the drawing, the insulator 586 in which the conductor 546 and the conductor 548 are embedded and the insulator 650 that covers the conductor 620 and the insulator 630 are omitted in FIG. 18A to FIG. 18C.

Although the capacitor 600 illustrated in each of FIG. 10, FIG. 11, FIG. 15, FIG. 17, and FIG. 18A to FIG. 18C is a planar capacitor, the shape of the capacitor is not limited thereto. For example, the capacitor 600 may be a cylindrical capacitor 600B illustrated in FIG. 19A to FIG. 19C.

Figure 19A:
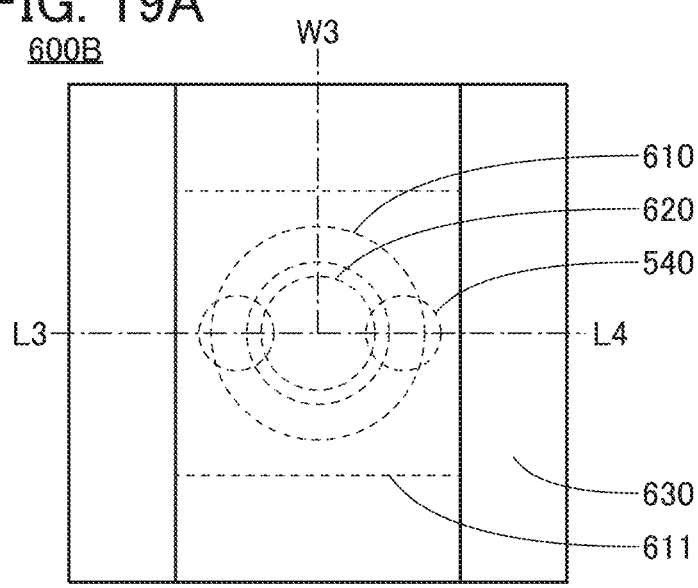
FIG. 19A is a top view illustrating a structure example of a capacitor.
Figure 19B:
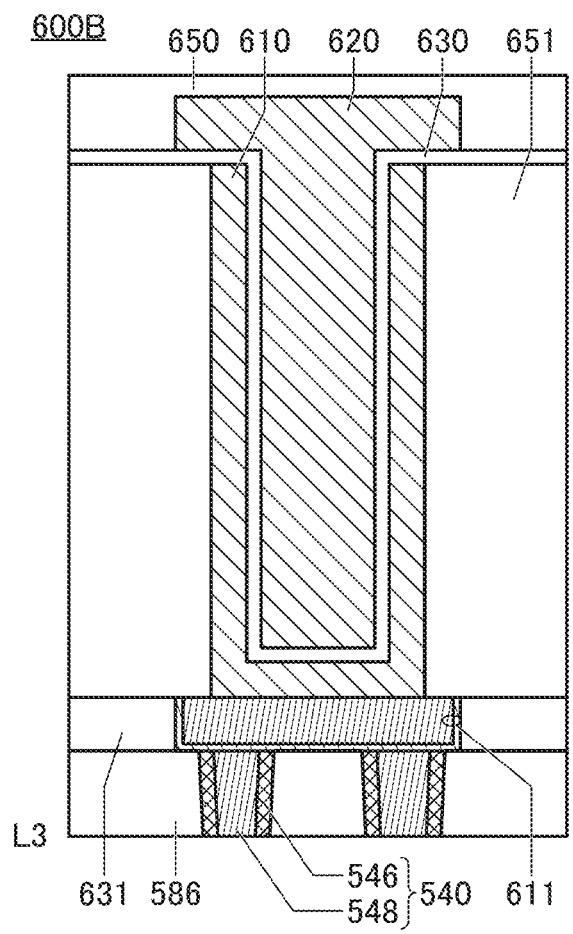
FIG. 19B is a cross-sectional view illustrating a structure example of the capacitor.
Figure 19C:
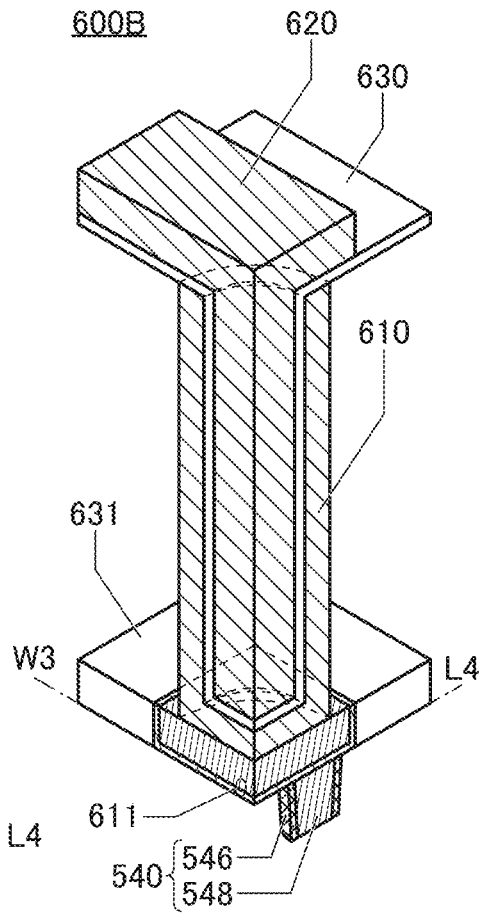
FIG. 19C is a cross-sectional perspective view illustrating a structure example of the capacitor.

FIG. 19A is a top view of the capacitor 600B, FIG. 19B is a perspective view illustrating a cross section of the capacitor 600B along the dashed-dotted line L3-L4, and FIG. 19C is a perspective view illustrating a cross section of the capacitor 600B along the dashed-dotted line W3-L4.

In FIG. 19B, the capacitor 600B includes an insulator 651 having an opening portion, the conductor 610 functioning as one of a pair of electrodes, the conductor 620 functioning as the other of the pair of electrodes, and the insulator 630 over the insulator 651 and the conductor 610.

For clarification of the drawing, the insulator 586, the insulator 650, and the insulator 651 are omitted in FIG. 19C.

For the insulator 631, a material similar to that for the insulator 586 can be used, for example.

A conductor 611 is embedded in the insulator 631 to be electrically connected to the conductor 540. For the conductor 611, a material similar to those for the conductor 330 and the conductor 518 can be used, for example.

For the insulator 651, a material similar to that for the insulator 586 can be used, for example.

The insulator 651 has an opening portion as described above, and the opening portion overlaps with the conductor 611.

The conductor 610 is formed on the bottom portion and the side surface of the opening portion. In other words, the conductor 610 overlaps with the conductor 611 and is electrically connected to the conductor 611.

The conductor 610 is formed in such a manner that an opening portion is formed in the insulator 651 by an etching method or the like, and then the conductor 610 is deposited by a sputtering method, an ALD method, or the like. After that, the conductor 610 deposited over the insulator 651 can be removed by a CMP (Chemical Mechanical Polishing) method or the like while the conductor 610 deposited in the opening portion is left.

The insulator 630 is positioned over the insulator 651 and over the formation surface of the conductor 610. Note that the insulator 630 functions as a dielectric between the pair of electrodes in the capacitor.

The conductor 620 is formed over the insulator 630 so as to fill the opening portion of the insulator 651.

The insulator 650 is formed to cover the insulator 630 and the conductor 620.

The capacitance value of the cylindrical capacitor 600B illustrated in FIG. 19A to FIG. 19C can be higher than that of the planar capacitor 600A.

Note that this embodiment can be combined with any of the other embodiments in this specification as appropriate.

Embodiment 4

Described in this embodiment is a metal oxide (hereinafter also referred to as an oxide semiconductor) that can be used in the OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of the crystal structures of oxide semiconductor will be explained with FIG. 20A. FIG. 20A is a diagram showing the classification of crystal structures of an oxide semiconductor, typically IGZO (a metal oxide containing In, Ga, and Zn).

As shown in FIG. 20A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite) (excluding single crystal and poly crystal). Note that the term "Crystalline" excludes single crystal, poly crystal, and completely amorphous. The term "Crystal" includes single crystal and poly crystal.

Note that the structures in the thick frame in FIG. 20A are in an intermediate state between "Amorphous" and "Crystal", and belong to a new boundary region (new crystalline phase). That is, these structures are completely different from "Amorphous", which is energetically unstable, and "Crystal".

Note that a crystal structure of a film or a substrate can be evaluated with an X-ray diffraction (XRD) spectrum. FIG. 20B shows an XRD spectrum, which is obtained by GIXD (Grazing-Incidence XRD) measurement, of a CAAC-IGZO film classified into "Crystalline" (the vertical axis represents intensity in arbitrary unit (a.u.)). Note that a GIXD method is also referred to as a thin film method or a Seemann-Bohlin method. The XRD spectrum that is shown in FIG. 20B and obtained by GIXD measurement is hereinafter simply referred to as an XRD spectrum. The CAAC-IGZO film in FIG. 20B has a composition in the vicinity of In:Ga:Zn=4:2:3 [atomic ratio]. The CAAC-IGZO film in FIG. 20B has a thickness of 500 nm.

As shown in FIG. 20B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 20B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 20C shows a diffraction pattern of the CAAC-IGZO film. FIG. 20C shows a diffraction pattern obtained by the NBED method in which an electron beam is incident in the direction parallel to the substrate. The composition of the CAAC-IGZO film in FIG. 20C is In:Ga:Zn=4:2:3 [atomic ratio] or the vicinity thereof. In the nanobeam electron diffraction method, electron diffraction is performed with a probe diameter of 1 nm.

As shown in FIG. 20C, a plurality of spots indicating c-axis alignment are observed in the diffraction pattern of the CAAC-IGZO film.

<<Structure of Oxide Semiconductor>>

Oxide semiconductors might be classified in a manner different from one shown in FIG. 20A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using $\theta/2\theta$ scanning, for example, a peak indicating c-axis alignment is detected at $2\theta$ of 31° or around 31°. Note that the position of the peak indicating c-axis alignment (the value of $2\theta$) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using $\theta/2\theta$ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS contains a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has higher [In] than [In] in the second region and lower [Ga] than [Ga] in the second region. Moreover, the second region has higher [Ga] than [Ga] in the first region and lower [In] than [In] in the first region.

Specifically, the first region includes indium oxide, indium zinc oxide, or the like as its main component. The second region includes gallium oxide, gallium zinc oxide, or the like as its main component. That is, the first region can be rephrased with a region containing In as its main component. The second region can be rephrased with a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus also has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

Note that this embodiment can be combined with any of the other embodiments in this specification as appropriate.

Embodiment 5

This embodiment will show examples of a semiconductor wafer where the semiconductor device or the like described in the above embodiment is formed and electronic components incorporating the semiconductor device.

<Semiconductor Wafer>

First, an example of a semiconductor wafer where a semiconductor device or the like is formed is described with reference to FIG. 21A.

Figure 21A:
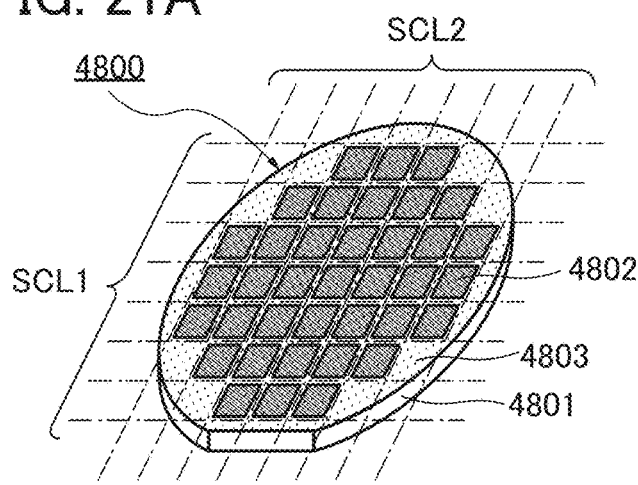
FIG. 21A is a perspective view illustrating an example of a semiconductor wafer.

A semiconductor wafer 4800 shown in FIG. 21A includes a wafer 4801 and a plurality of circuit portions 4802 provided on the top surface of the wafer 4801. A portion without the circuit portion 4802 on the top surface of the wafer 4801 is a spacing 4803 that is a region for dicing.

The semiconductor wafer 4800 can be fabricated by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as the next step. The dicing is performed along scribe lines SCL1 and scribe lines SCL2 (referred to as dicing lines or cutting lines in some cases) indicated by dashed-dotted lines. Note that to perform the dicing step easily, it is preferable that the spacing 4803 be provided so that the plurality of scribe lines SCL1 are parallel to each other, the plurality of scribe lines SCL2 are parallel to each other, and the scribe lines SCL1 are perpendicular to the scribe lines SCL2.

Figure 21B:
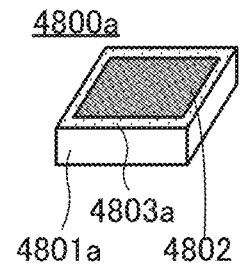
FIG. 21B is a perspective view illustrating an example of a chip.

With the dicing step, a chip 4800a as shown in FIG. 21B can be cut out from the semiconductor wafer 4800. The chip 4800a includes a wafer 4801a, the circuit portion 4802, and a spacing 4803a. Note that it is preferable to make the spacing 4803a as small as possible. In this case, the width of the spacing 4803 between adjacent circuit portions 4802 is substantially the same as a length of a cutting allowance of the scribe line SCL1 or a cutting allowance of the scribe line SCL2.

Note that the shape of the element substrate of one embodiment of the present invention is not limited to the shape of the semiconductor wafer 4800 shown in FIG. 21A. The element substrate may be a rectangular semiconductor wafer, for example. The shape of the element substrate can be changed as appropriate, depending on a manufacturing process of an element and an apparatus for manufacturing the element.

<Electronic Component>

Figure 21C:
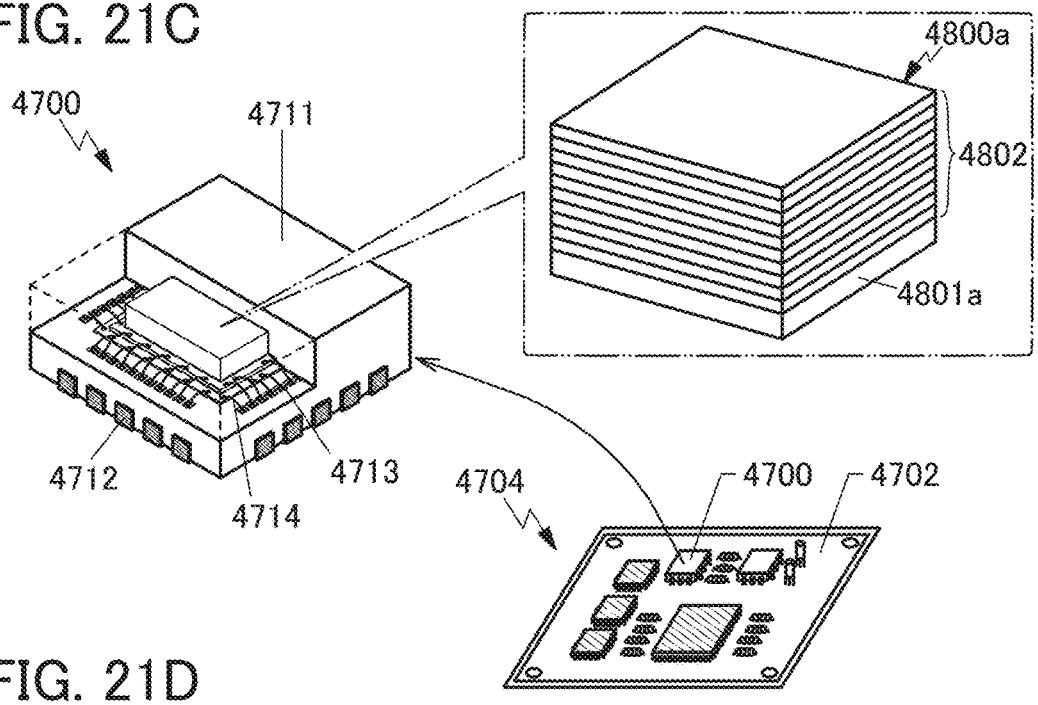
FIG. 21C and FIG. 21D are perspective views illustrating examples of electronic components.

FIG. 21C is a perspective view of an electronic component 4700 and a substrate (a mounting board 4704) on which the electronic component 4700 is mounted. The electronic component 4700 illustrated in FIG. 21C includes the chip 4800a in a mold 4711. Note that the chip 4800a illustrated in FIG. 21C may have a structure in which the circuit portions 4802 are stacked. To illustrate the inside of the electronic component 4700, some portions are omitted in FIG. 21C. The electronic component 4700 includes a land 4712 outside the mold 4711. The land 4712 is electrically connected to an electrode pad 4713, and the electrode pad 4713 is electrically connected to the chip 4800a through a wire 4714. The electronic component 4700 is mounted on a printed circuit board 4702, for example. A plurality of such electronic components are combined and electrically connected to each other on the printed circuit board 4702, whereby the mounting board 4704 is completed.

Figure 21D:
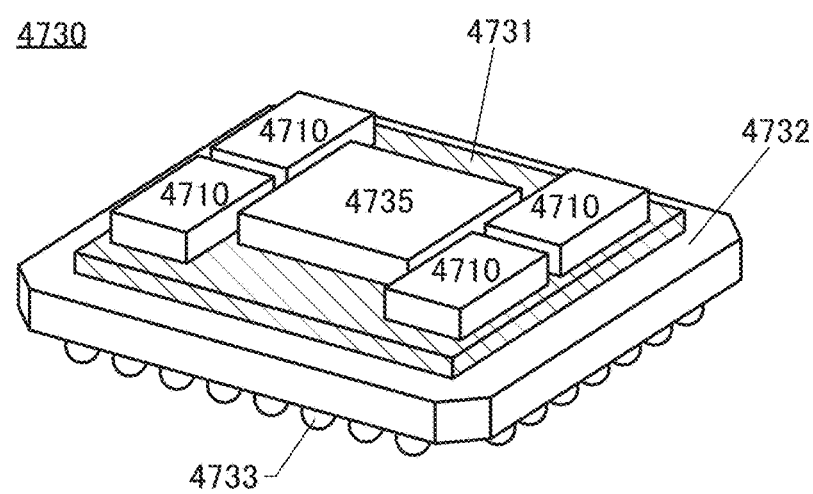

FIG. 21D is a perspective view of an electronic component 4730. The electronic component 4730 is an example of a SiP (System in package) or an MCM (Multi Chip Module). In the electronic component 4730, an interposer 4731 is provided on a package substrate 4732 (printed circuit board), and a semiconductor device 4735 and a plurality of semiconductor devices 4710 are provided on the interposer 4731.

The electronic component 4730 includes the semiconductor devices 4710. Examples of the semiconductor devices 4710 include the semiconductor device described in the above embodiment and a high bandwidth memory (HBM). An integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings have a single-layer structure or a layered structure. Moreover, the interposer 4731 has a function of electrically connecting an integrated circuit provided on the interposer 4731 to an electrode provided on the package substrate 4732. Accordingly, the interposer is sometimes referred to as a redistribution substrate or an intermediate substrate. A through electrode is provided in the interposer 4731 and the through electrode is used to electrically connect an integrated circuit and the package substrate 4732 in some cases. In the case of using a silicon interposer, a TSV (through-silicon via) can also be used as the through electrode.

A silicon interposer is preferably used as the interposer 4731. The silicon interposer can be manufactured at lower cost than an integrated circuit because the silicon interposer is not necessarily provided with an active element. Meanwhile, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In an SiP, an MCM, or the like using a silicon interposer, a decrease in reliability due to a difference in expansion coefficient between an integrated circuit and the interposer is less likely to occur. Furthermore, a surface of a silicon interposer has high planarity, and a poor connection between the silicon interposer and an integrated circuit provided thereon less likely occurs. It is particularly preferable to use a silicon interposer for a 2.5D package (2.5D mounting) in which a plurality of integrated circuits are arranged side by side on the interposer.

A heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on the bottom portion of the package substrate 4732. FIG. 21D shows an example in which the electrode 4733 is formed of a solder ball. Solder balls are provided in a matrix on the bottom portion of the package substrate 4732, whereby BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods other than BGA and PGA. For example, a mounting method such as a staggered pin grid array (SPGA), a land grid array (LGA), a quad flat package (QFP), a quad flat J-leaded package (QFJ), or a quad flat non-leaded package (QFN) can be employed.

Note that this embodiment can be combined with any of the other embodiments in this specification as appropriate.

Embodiment 6

In this embodiment, a system including any of the semiconductor devices, the electronic components, and the like disclosed in this specification and the like is described.

Figure 22:
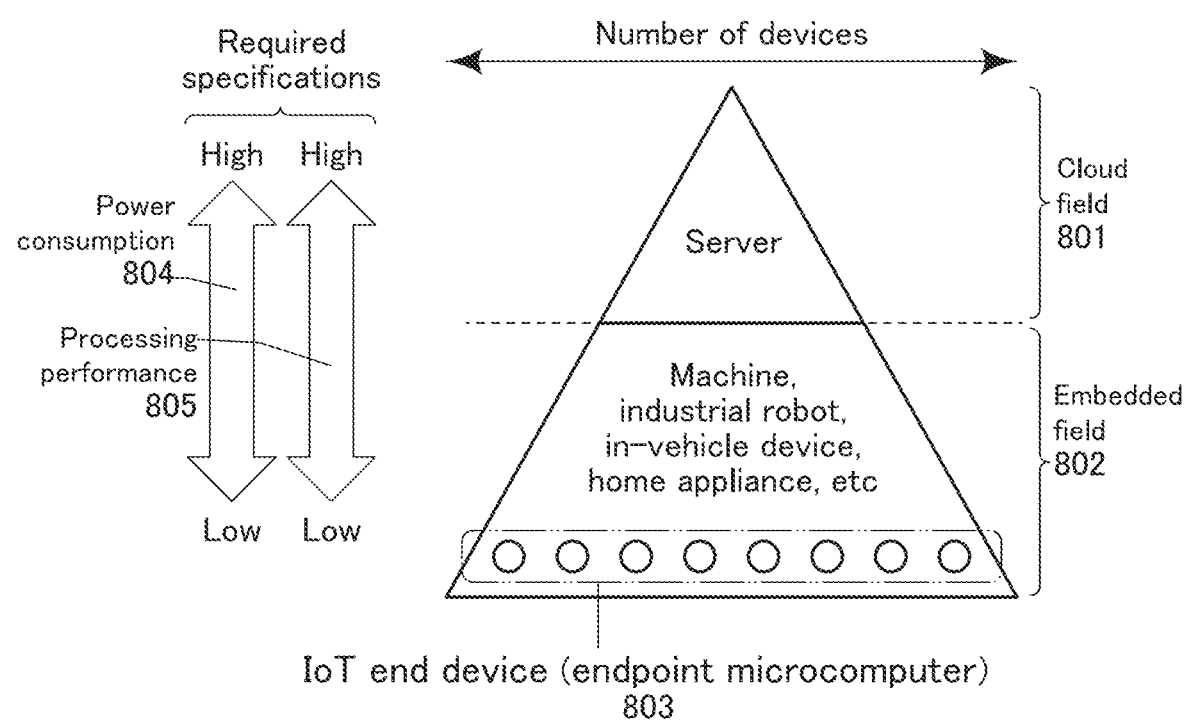
FIG. 22 is a diagram illustrating a hierarchical structure of an IoT network and tendencies of required specifications.

The high frequency receiver 100, the high frequency transmitter and receiver 200 and the like which are described in the above embodiments can be suitably used for a small-scale system such as an IoT end device (also referred to as an "endpoint microcomputer") 803 in the IoT field, for example. FIG. 22 illustrates a hierarchical structure of an IoT network and tendencies of required specifications. FIG. 22 illustrates power consumption 804 and processing performance 805 as the required specifications. The hierarchical structure of the IoT network is roughly divided into a cloud field 801 at the upper level and an embedded field 802 at the lower level. The cloud field 801 includes a server, for example. The embedded field 802 includes a machine, an industrial robot, an in-vehicle device, and a home appliance, for example.

Higher processing performance is required rather than lower power consumption at the upper level. Thus, a high-performance CPU, a high-performance GPU, a large-scale SoC (System on a Chip), and the like are used in the cloud field 801. Furthermore, lower power consumption is required rather than higher processing performance at the lower level where the number of devices is explosively increased.

Note that an "endpoint" refers to an end region of the embedded field 802. Examples of devices used in the endpoint include microcomputers used in a factory, a home appliance, infrastructure, agriculture, and the like.

Figure 23:
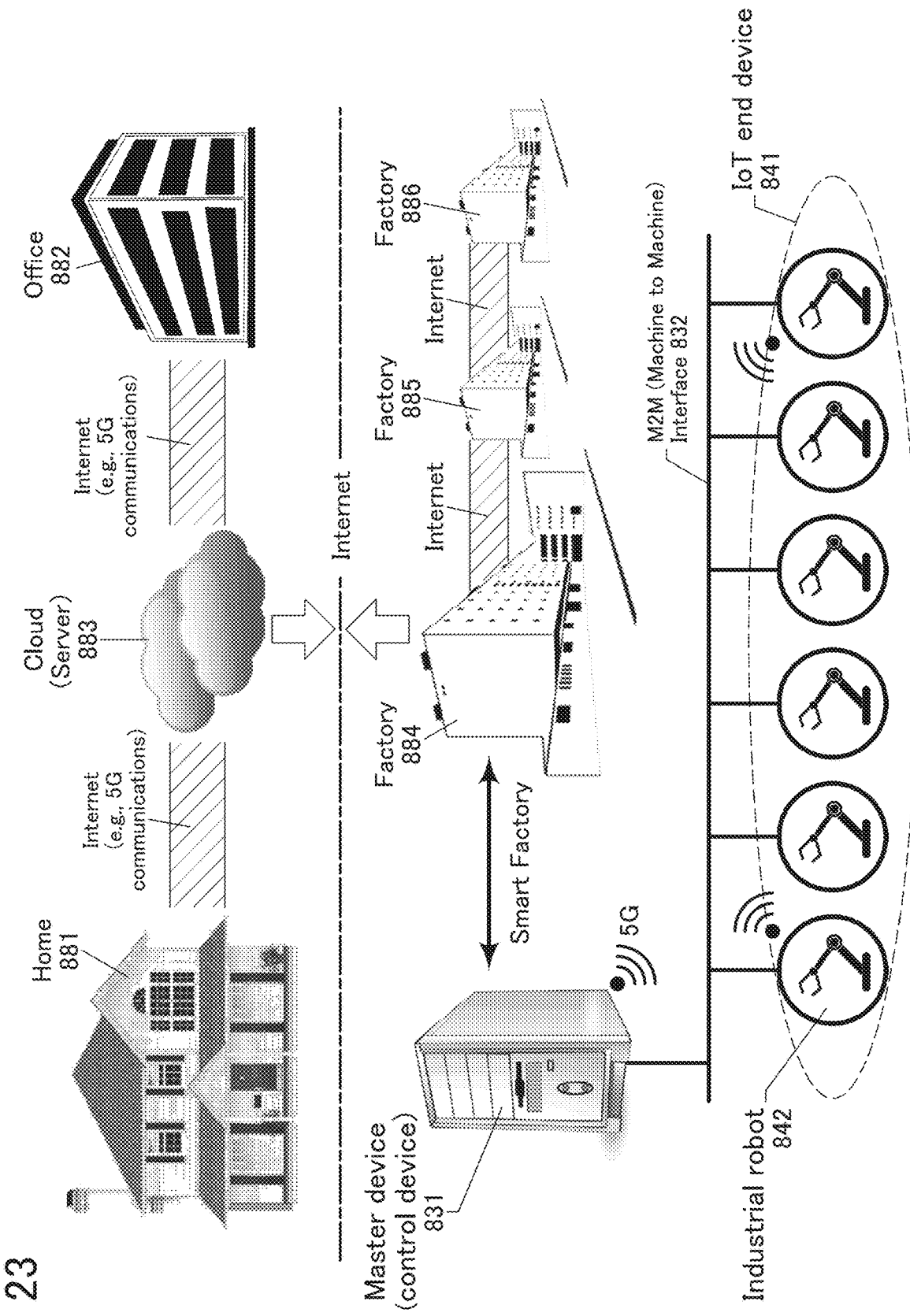
FIG. 23 is a conceptual diagram of factory automation.

FIG. 23 shows a conceptual diagram showing factory automation as an application example of the endpoint microcomputer. A factory 884 is connected to a cloud 883 through Internet connection (Internet). The cloud 883 is connected to a home 881 and an office 882 through the Internet connection. The Internet connection may be wired communication or wireless communication. For example, in the case of wireless communication, the fourth-generation mobile communication system (4G) or the fifth-generation mobile communication system (5G) may be used. The factory 884 may be connected to a factory 885 and a factory 886 through the Internet connection.

The factory 884 includes a master device (control device) 831. The master device 831 is connected to the cloud 883 and has a function of transmitting and receiving data. The master device 831 is connected to a plurality of industrial robots 842 included in an IoT end device 841 through an M2M (Machine to Machine) interface 832. As the M2M interface 832, for example, industrial Ethernet (registered trademark), which is a kind of wired communication, or local 5G, which is a kind of wireless communication, may be used.

A factory manager can check the operational status or the like from the home 881 or the office 882 connected to the factory 884 through the cloud 883. In addition, the manager can check wrong items and part shortage, instruct a storage space, and measure takt time, for example.

In recent years, IoT has been globally introduced into factories; under the name "Smart Factory". Smart Factory has been reported to enable not only simple examination and inspection by an endpoint microcomputer but also detection of failures and prediction of abnormality, for example.

Note that this embodiment can be combined with any of the other embodiments in this specification as appropriate.

Embodiment 7

This embodiment describes examples of electronic devices including the semiconductor device disclosed in this specification and the like.

Figure 24:
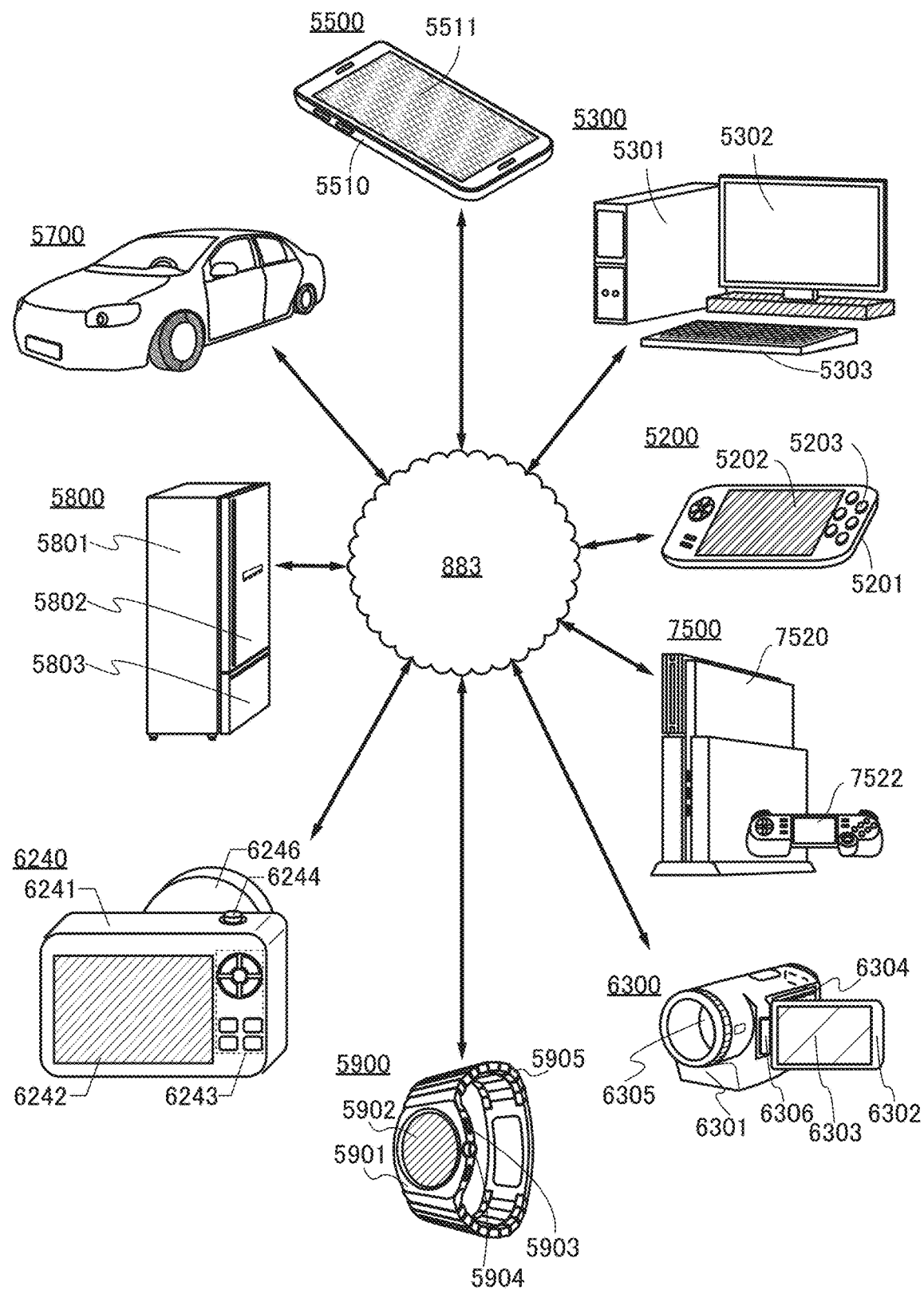
FIG. 24 is a perspective view illustrating examples of electronic devices.

The electronic devices illustrated in FIG. 24 are examples of electronic devices each including the semiconductor device, the electronic component, and the like described in the above embodiments. Note that the electronic devices described in this embodiment can have a function of the IoT end device 803 described in Embodiment 6. Thus, FIG. 24 illustrates a state where each electronic device is connected to the cloud 883, as an example.

[Information Terminal]

An information terminal 5500 illustrated in FIG. 24 is a mobile phone (a smartphone), which is a type of information terminal. The information terminal 5500 includes a housing 5510 and a display portion 5511. As input interfaces, a touch panel and a button are provided in the display portion 5511 and the housing 5510, respectively.

FIG. 24 illustrates a desktop information terminal 5300 as an example of an information terminal. The desktop information terminal 5300 includes a main body 5301 of the information terminal, a display 5302, and a keyboard 5303.

FIG. 24 illustrates an information terminal 5900 as an example of a wearable terminal. The information terminal 5900 illustrated in FIG. 24 is a wrist-wearable information terminal and includes a housing 5901, a display portion 5902, an operation button 5903, an operator 5904, a band 5905, and the like.

Note that although FIG. 24 illustrates the smartphone, the desktop information terminal, and the wearable terminal as examples of the electronic device, one embodiment of the present invention can also be applied to information terminals other than smartphones, desktop information terminals, and wearable terminals. Examples of information terminals other than smartphones, desktop information terminals, and wearable terminals include a PDA (Personal Digital Assistant), a laptop information terminal, and a workstation.

[Household Appliance]

FIG. 24 illustrates an electric refrigerator-freezer 5800 as an example of a household appliance. The electric refrigerator-freezer 5800 includes a housing 5801, a refrigerator door 5802, a freezer door 5803, and the like.

The electric refrigerator-freezer is described in this example as a household appliance; other examples of household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machines]

FIG. 24 illustrates a portable game machine 5200 as an example of a game machine. The portable game machine 5200 includes a housing 5201, a display portion 5202, a button 5203, and the like.

FIG. 24 illustrates a stationary game machine 7500 as another example of a game machine. The stationary game machine 7500 includes a main body 7520 and a controller 7522. The controller 7522 can be connected to the main body 7520 with or without a wire. Especially in the case of wireless connection, the semiconductor device described in the above embodiments can be used for the stationary game machine 7500. Although not illustrated in FIG. 24, the controller 7522 can include a display portion that displays a game image, and an input interface besides a button, such as a touch panel, a stick, a rotating knob, and a sliding knob, for example. The shape of the controller 7522 is not limited to that in FIG. 24, and the shape of the controller 7522 may be changed variously in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary gaming machine may include a camera, a depth sensor, a microphone, and the like so that the game player can play a game using a gesture and/or a voice instead of a controller.

An image of the game machine can be output with a display device such as a television device, a personal computer display, a game display, or a head-mounted display. An image of the game machine may be wirelessly transmitted to the display device from the stationary game machine 7500 with use of the semiconductor device described in the above embodiments.

Although FIG. 24 illustrates the portable game machine as an example of a game machine, the electronic device of one embodiment of the present invention is not limited thereto. Examples of the electronic device of one embodiment of the present invention include a home stationary game machine, an arcade game machine installed in entertainment facilities (e.g., a game center and an amusement park), and a throwing machine for batting practice installed in sports facilities.

[Moving Vehicle]

The semiconductor device described in the above embodiment can be used for an automobile, which is a moving vehicle, and around the driver's seat in an automobile.

FIG. 24 illustrates an automobile 5700 as an example of a moving vehicle.

In the automobile 5700, the semiconductor device described in the above embodiments can be applied to a navigation system which transmits and receives information on the current position, for example.

Note that although an automobile is described above as an example of a moving vehicle, the moving vehicle is not limited to an automobile. Examples of moving vehicles include a train, a monorail train, a ship, and a flying object (a helicopter, an airplane, and a rocket). Further examples of the moving vehicle include vehicles that is wirelessly operated (such as a model car, a motor boat, an unmanned aerial vehicle (drone)). In particular, the semiconductor device described in the above embodiments can be used as a receiver and transmitter for wireless operation.

[Camera]

The semiconductor device described in the above embodiments can be used for a camera.

FIG. 24 illustrates a digital camera 6240 as an example of an imaging device. The digital camera 6240 includes a housing 6241, a display portion 6242, operation buttons 6243, a shutter button 6244, and the like, and an attachable lens 6246 is attached to the digital camera 6240. Although the lens 6246 of the digital camera 6240 is detachable from the housing 6241 for replacement here, the lens 6246 may be integrated with the housing 6241. A stroboscope, a viewfinder, or the like may be additionally attached to the digital camera 6240.

When the semiconductor device described in the above embodiments is used for the digital camera 6240, a captured image can be transmitted to a storage server in the cloud 883, an SNS (Social Networking Service) server, or the like, for example. In addition, for example, image editing software can be read from the cloud 883 to edit the image captured by the digital camera 6240.

[Video Camera]

The semiconductor device described in the above embodiment can be used for a video camera.

FIG. 24 illustrates a video camera 6300 as an example of an imaging device. The video camera 6300 includes a first housing 6301, a second housing 6302, a display portion 6303, operation keys 6304, a lens 6305, a joint 6306, and the like. The operation keys 6304 and the lens 6305 are provided in the first housing 6301, and the display portion 6303 is provided in the second housing 6302. The first housing 6301 and the second housing 6302 are connected to each other with the joint 6306, and the angle between the first housing 6301 and the second housing 6302 can be changed with the joint 6306. Images displayed on the display portion 6303 may be changed in accordance with the angle at the joint 6306 between the first housing 6301 and the second housing 6302.

When the semiconductor device described in the above embodiments is used for the video camera 6300, a captured moving image can be transmitted to the storage server of the cloud 883, the SNS server, or the like, for example, as in the digital camera 6240. In addition, for example, the image editing software can be read from the cloud 883 to edit the captured moving image in the video camera 6300.

Note that this embodiment can be combined with any of the other embodiments in this specification as appropriate.

Example 1

In this example, calculation using a circuit simulator was performed to check whether the operation was performed appropriately in the structure of the downconversion mixer DNCMX2 illustrated in FIG. 3B.

Figure 25:
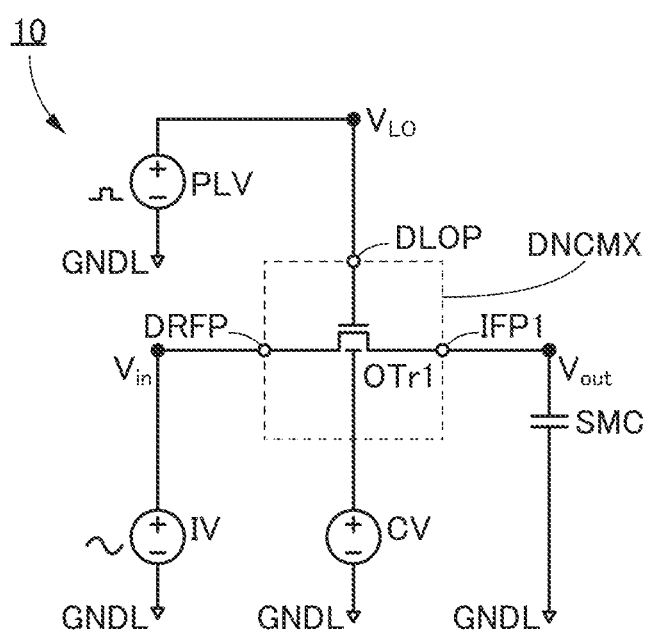
FIG. 25 is a circuit diagram illustrating conditions for circuit calculation.

First, a circuit structure for the calculation will be described. FIG. 25 illustrates a circuit structure based on the downconversion mixer DNCMX2 in FIG. 3B, which was input to the circuit simulator. A circuit 10 includes an input voltage source IV, a constant voltage source CV, a pulse voltage source PLV, and a capacitor SMC.

In the circuit 10, a positive-side terminal of the input voltage source IV is electrically connected to the terminal DRFP, and a negative-side terminal of the input voltage source IV is electrically connected to the wiring GNDL. A first terminal of the capacitor SMC is electrically connected to the terminal IFP1, and a second terminal of the capacitor SMC is electrically connected to the wiring GNDL. A positive-side terminal of the pulse voltage source PLV is electrically connected to the terminal DLOP, and a negative-side terminal of the pulse voltage source PLV is electrically connected to the wiring GNDL. A positive-side terminal of the constant voltage source CV is electrically connected to a back gate of the transistor OTr1 and a negative-side terminal of the constant voltage source CV is electrically connected to the wiring GNDL.

Note that in this example, the wiring GNDL is a wiring for supplying a ground potential (GND).

An OS transistor including an In—Ga—Zn oxide in a channel formation region is used for the transistor OTr1 in the circuit 10, for example. In the transistor OTr1 in the circuit 10, the channel length is 60 nm and the channel width is 60 nm.

An example of the input voltage source IV is a voltage source that outputs an AC voltage $V_{in}$ with the maximum voltage of 3.3 V and the minimum voltage of −3.3 V. The frequency of the AC voltage is 4 MHz. Note that $V_{in}$ supplied from the input voltage source IV to the terminal DRFP corresponds to a voltage output from the low noise amplifier LNA in the circuit in FIG. 3B.

In the constant voltage source CV, the voltage between the positive-side terminal and the negative-side terminal is 0 V.

The pulse voltage source PLV is a voltage source that outputs a pulse voltage $V_{LO}$ with the maximum voltage of 3.3 V and the minimum voltage of 0 V. The frequency of the pulse voltage is 5 MHz. Note that the $V_{LO}$ supplied to the terminal DLOP from the pulse voltage source PLV corresponds to a voltage output from the local oscillator LO in the circuit in FIG. 3B.

The capacitance value of the capacitor SMC is 10 pF. The capacitor SMC is added to the circuit 10 as a load capacitor (terminated impedance). Note that the voltage of the first terminal of the capacitor SMC, that is, the voltage output from the terminal IFP1 is $V_{out}$.

Figure 26:
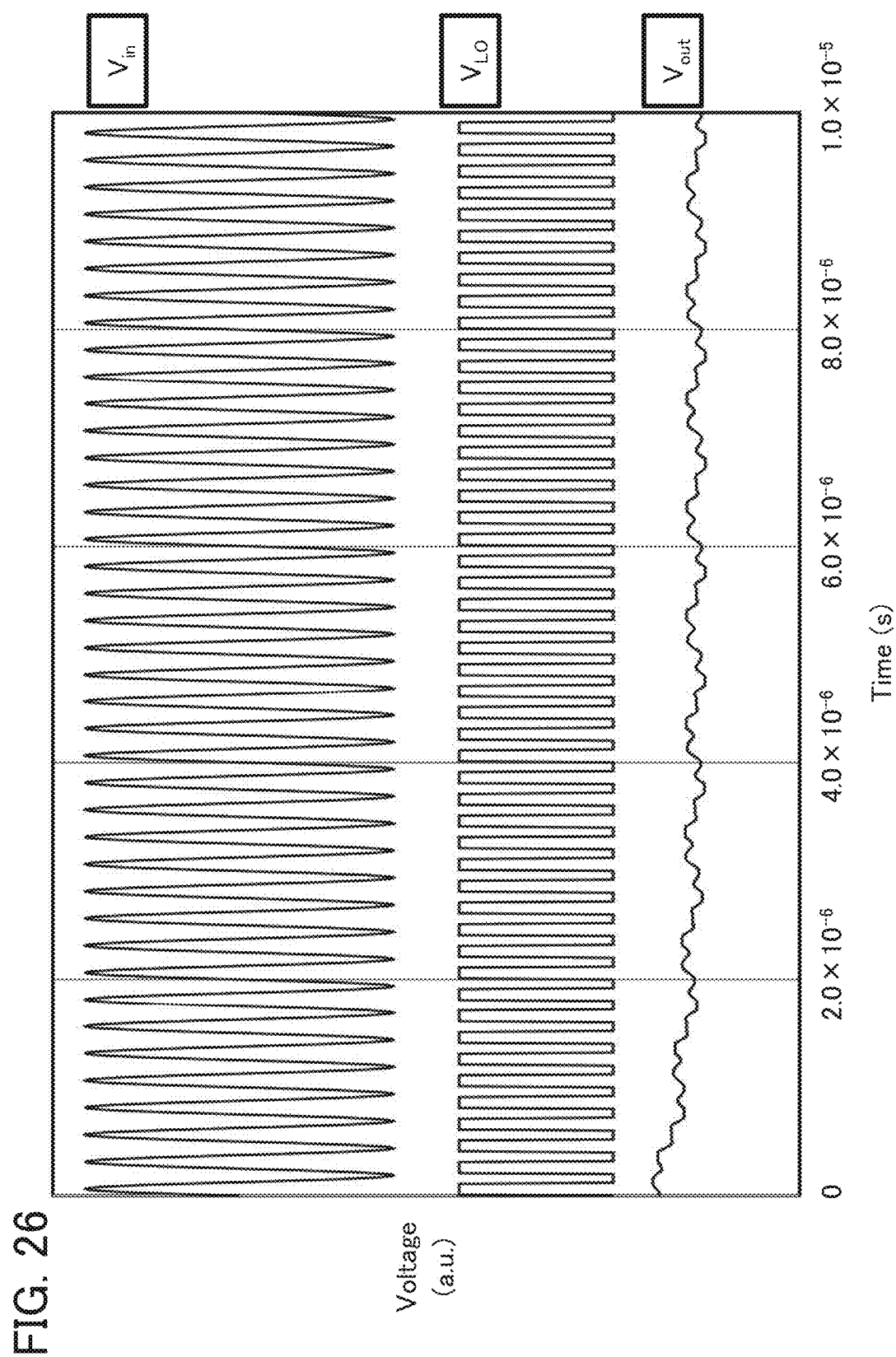
FIG. 26 is a diagram showing results of the circuit calculation.

FIG. 26 is a graph showing waveforms of the AC voltage $V_{in}$, the pulse voltage $V_{LO}$, and the output voltage $V_{out}$ that were obtained by input of the structure of the circuit 10 in FIG. 25 to the circuit simulator. In the graph, the horizontal axis represents time (s) and the vertical axis represents a voltage (arbitrary unit (a.u.)).

When an input voltage that is an AC voltage is mixed with a voltage that is from the local oscillator and has higher frequency than the input voltage by a mixer, the frequency of the voltage output from the mixer is a difference value between the frequency of the input voltage and the frequency of the voltage from the local oscillator. As illustrated in FIG. 26, for example, it was confirmed that the output voltage $V_{out}$ with 1 MHz that is a difference in frequency between $V_{in}$ and $V_{LO}$ was output from the terminal IFP1 after $4.0 \times 10^{-6}$ s when the AC voltage $V_{in}$ with 4 MHz was input to the terminal DRFP and the pulse voltage $V_{LO}$ with 5 MHz was input to the terminal DLOP.

That is, the downconversion mixer DNCMX2 including the OS transistor in FIG. 3B or the like can be applied to the downconversion mixer DNCMX of the high frequency receiver 100 in FIG. 1.

In addition, since the OS transistor has a low dependence of a field-effect mobility on temperature, a change in field-effect mobility due to a temperature change is small. On the other hand, since the field-effect mobility of the Si transistor is reduced as the temperature rises, the operation capability of the amplifier including the Si transistor included in the high frequency receiver 100 is decreased. Therefore, amplifiers in multiple stages are sometimes used in the low noise amplifier LNA or the like to compensate for a decrease in operation capability of the amplifier. However, when any one of the downconversion mixer DNCMX1 to the downconversion mixer DNCMX3 including the OS transistor in FIGS. 3A to 3C is used as the downconversion mixer DNCMX of the high frequency receiver 100, the downconversion mixer DNCMX is less likely to be affected by a reduction in field-effect mobility due to high temperature. Therefore, the number of amplifiers that are used in multiple stages included in the low noise amplifier LNA can be reduced, so that power consumption of the high frequency receiver 100 can be reduced. The area of the high frequency receiver 100 can be reduced.

Example 2

In this example, calculation using a circuit simulator was performed to check whether the operation was performed appropriately in the structure of the single-balanced mixer SBMXA in FIG. 6A and the structure in the double-balanced mixer DBMXA in FIG. 9A.

<Single-Balanced Mixer>

Figure 27:
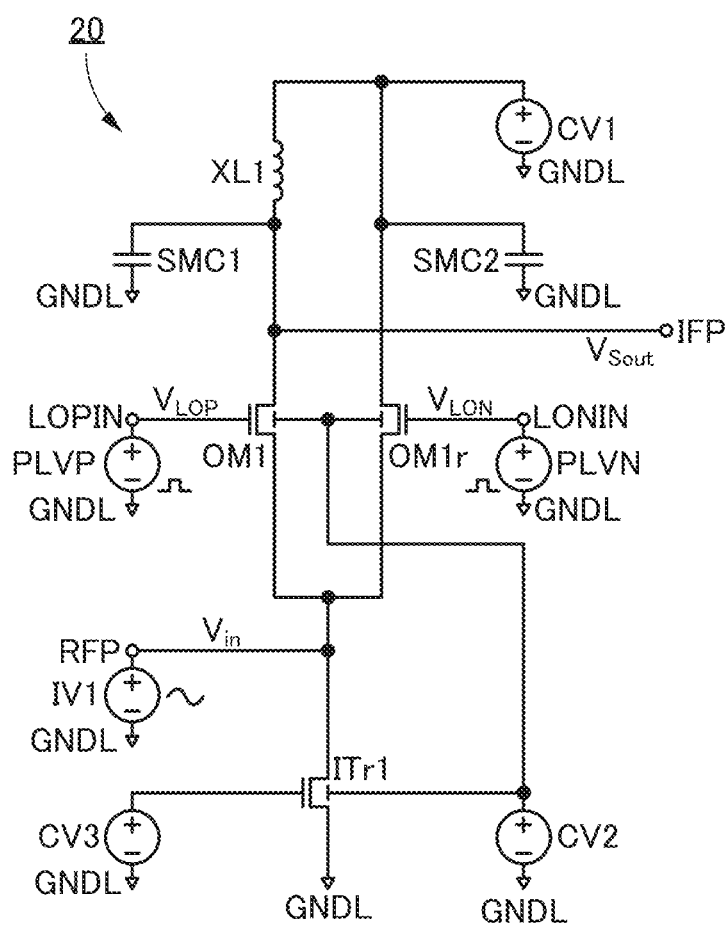
FIG. 27 is a circuit diagram illustrating conditions for circuit calculation.

First, the calculation in a circuit structure in the single-balanced mixer is described. FIG. 27 illustrates a circuit structure based on the single-balanced mixer SBMXA in FIG. 6A, which was input to the circuit simulator. A circuit 20 includes a constant voltage source CV1, a constant voltage source CV2, a constant voltage source CV3, an input voltage source IV1, a pulse voltage source PLVP, a pulse voltage source PLVN, an inductor XL1, a capacitor SMC1, a capacitor SMC2, the transistor ITr, the transistor OM1, and the transistor OM1r.

Note that the inductor XL1 included in the circuit 20 corresponds to the load LE1 of the single-balanced mixer SBMXA in FIG. 6A. A circuit element that corresponds to the load LE2 of the single-balanced mixer SBMXA in FIG. 6A is not provided in the circuit 20.

The transistor ITr1 included in the circuit 20 corresponds to a transistor included in the current source IS1.

In the circuit 20, a positive-side terminal of the input voltage source IV1 is electrically connected to the terminal RFP and a negative-side terminal of the input voltage source IV1 is electrically connected to the wiring GNDL. A first terminal of the capacitor SMC1 is electrically connected to the terminal IFP, a first terminal of the inductor XL1, and the first terminal of the transistor OM1, and a second terminal of the capacitor SMC1 is electrically connected to the wiring GNDL. A first terminal of the capacitor SMC2 is electrically connected to the first terminal of the transistor OM1r, and a second terminal of the capacitor SMC2 is electrically connected to the wiring GNDL.

Note that the wiring GNDL is a wiring for supplying a ground potential (GND).

A positive-side terminal of the constant voltage source CV1 is electrically connected to a second terminal of the inductor XL1, the first terminal of the capacitor SMC2, and the first terminal of the transistor OM1r. A negative-side terminal of the constant voltage source CV1 is electrically connected to the wiring GNDL. A positive-side terminal of the constant voltage source CV2 is electrically connected to a back gate of the transistor OM1, a back gate of the transistor OM1r, and a back gate of the transistor ITR1. A negative-side terminal of the constant voltage source CV2 is electrically connected to the wiring GNDL. A positive-side terminal of the constant voltage source CV3 is electrically connected to the gate of the transistor ITr1, and a negative-side terminal of the constant voltage source CV3 is electrically connected to the wiring GNDL.

A positive-side terminal of the pulse voltage source PLVP is electrically connected to the terminal LOPIN, and a negative-side terminal of the pulse voltage source PLVP is electrically connected to the wiring GNDL. A positive-side terminal of the pulse voltage source PLVN is electrically connected to the terminal LONIN, and a negative-side terminal of the pulse voltage source PLVN is electrically connected to the wiring GNDL.

For example, the transistor OM1, the transistor OM1r, and the transistor ITr1 of the circuit 20 are OS transistors each including an In—Ga—Zn oxide in a channel formation region. The channel length and the channel width of each of the transistor OM1, the transistor OM1r, and the transistor ITr1 in the circuit 20 are 60 nm and 60 nm, respectively.

The input voltage source IV1 is, for example, a voltage source that outputs an alternative voltage $V_{in}$ with the maximum voltage of 3.3 V and the minimum voltage of −3.3 V. The frequency of the AC voltage is 4 MHz. Note that $V_{in}$ supplied from the input voltage source IV1 to the terminal RFP corresponds to a voltage output from the low noise amplifier LNA in the circuit in FIG. 3B.

A voltage between the positive-side terminal and the negative-side terminal of the constant voltage source CV1 is set to 3.3 V. In addition, a voltage between the positive-side terminal and the negative-side terminal of the constant voltage source CV2 is set to 0 V. A voltage between the positive-side terminal and the negative-side terminal of the constant voltage source CV3 is set to 3.3 V.

The pulse voltage source PLVP is a voltage source that outputs a pulse voltage $V_{LOP}$ with the maximum voltage of 3.3 V and the minimum voltage of 0 V. The frequency of the pulse voltage is 5 MHz. In addition, the pulse voltage source PLVN is a voltage source that outputs a pulse voltage $V_{LON}$ with a phase advanced by a half wavelength from a phase of the pulse voltage $V_{LOP}$ of the pulse voltage source PLVP. That is, a voltage waveform with a phase difference of 180° from that of the pulse voltage $V_{LOP}$ corresponds to the pulse voltage $V_{LON}$. Note that $V_{LOP}$ and $V_{LON}$ supplied from the pulse voltage source PLVP and the pulse voltage source PLVN to the terminal LOPIN and terminal LONIN correspond to voltages output from the local oscillator LO in the circuit in FIG. 3B.

The capacitances of the capacitor SMC1 and the capacitor SMC2 are 10 pF. Note that the capacitor SMC1 and capacitor SMC2 are added to the circuit 20 as decoupling capacitors for separating a signal voltage and a power supply voltage (GND). The voltage of the first terminal of the capacitor SMC1, that is, the voltage output from the terminal IFP is $V_{Sout}$.

Figure 28:
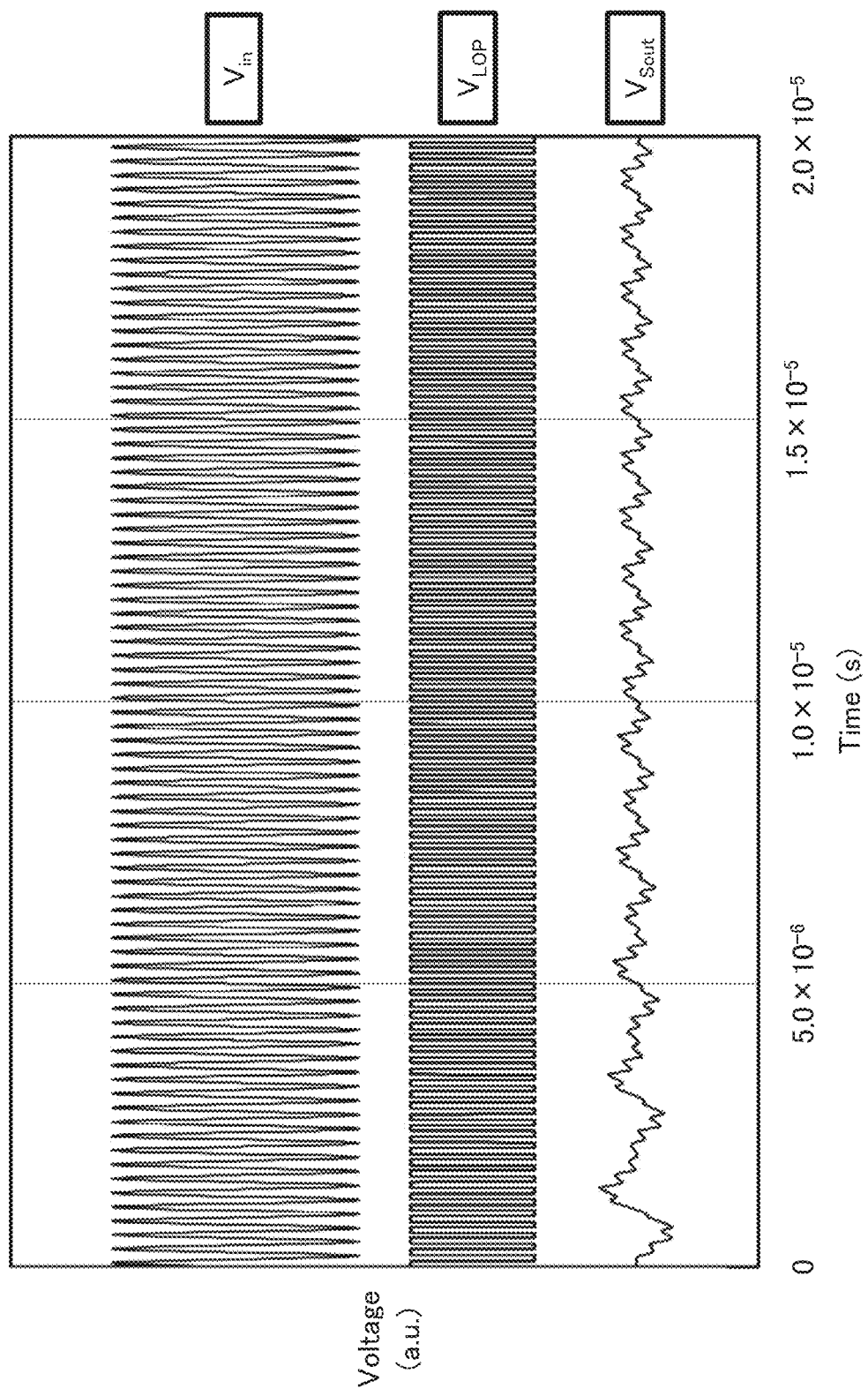
FIG. 28 is a diagram showing results of the circuit calculation.

FIG. 28 is a graph showing waveforms of the alternative voltage $V_{in}$, the pulse voltage $V_{LOP}$, and the output voltage $V_{Sout}$ that were obtained by input of the structure of the circuit 20 in FIG. 27 to the circuit simulator. In the graph, the horizontal axis represents time (s) and the vertical axis represents a voltage (arbitrary unit (a.u.)). Note that the pulse voltage $V_{LON}$ is omitted in FIG. 28.

As illustrated in FIG. 28, for example, it was confirmed that the output voltage $V_{Sout}$ with 1 MHz that is a difference in frequencies between $V_{in}$ and $V_{LOP}$ was output from the terminal IFP after $1.0 \times 10^{-5}$ s when the AC voltage $V_{in}$ with 4 MHz was input to the terminal RFP and the pulse voltage $V_{LOP}$ with 5 MHz was input to the terminal LOPIN.

When an input voltage that is an AC voltage is mixed with a voltage that is from the local oscillator and has higher frequency than the input voltage by a mixer, the frequency of the voltage output from the mixer is a difference value between the frequency of the input voltage and the frequency of the voltage from the local oscillator. Accordingly, it was confirmed from the result in FIG. 28 that the circuit 20 illustrated in FIG. 27 operated as a mixer.

<Double-Balanced Mixer>

Figure 29:
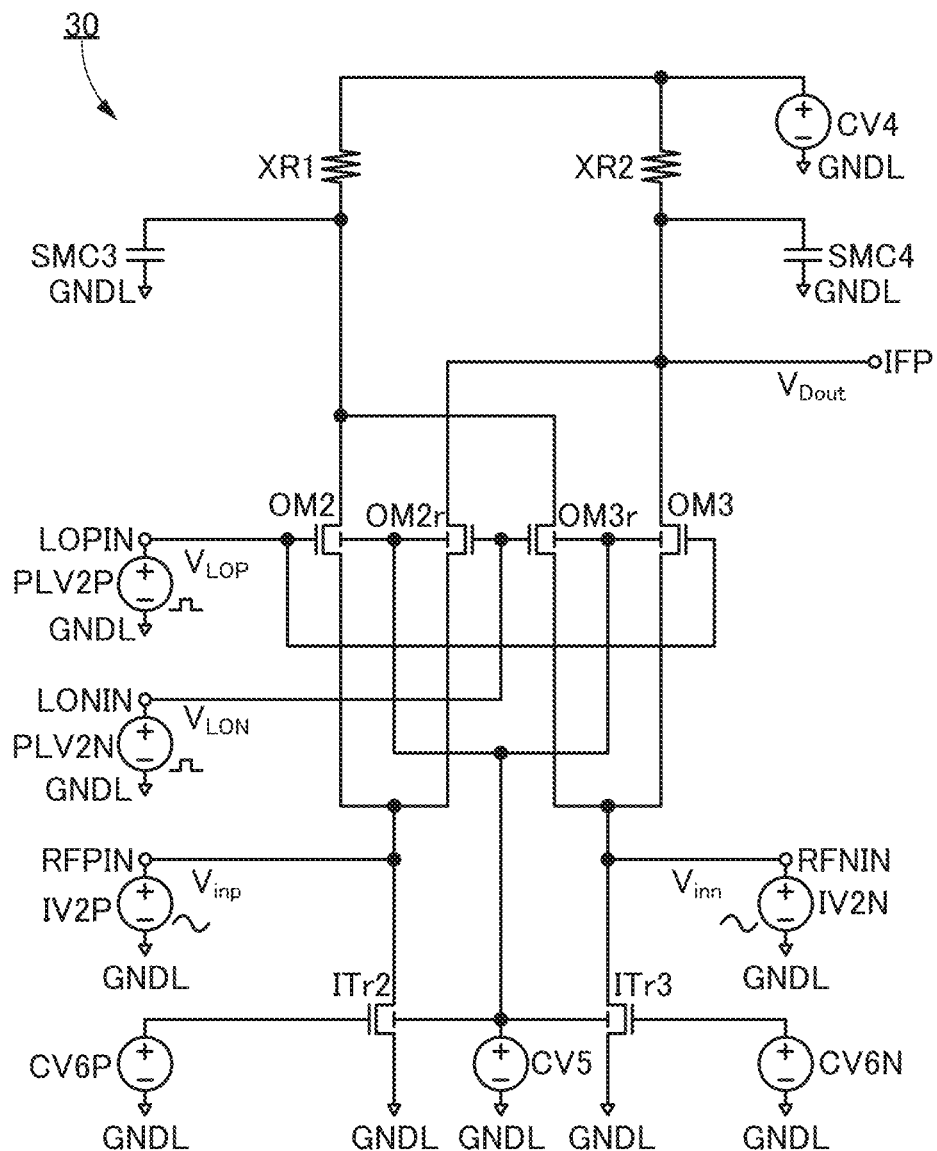
FIG. 29 is a circuit diagram illustrating conditions for circuit calculation.

Next, calculation using the circuit simulator in the circuit structure of the double-balanced mixer is described. FIG. 29 illustrates a circuit structure based on the double-balanced mixer DBMXA in FIG. 9A, which is input to the circuit simulator. The circuit 30 includes a constant voltage source CV4, a constant voltage source CV5, a constant voltage source CV6P, a constant voltage source CV6N, an input voltage source IV2P, an input voltage source IV2N, a pulse voltage source PLV2P, a pulse voltage source PLV2N, a resistor XR1, a resistor XR2, a capacitor SMC3, a capacitor SMC4, a transistor ITr2, a transistor ITr3, the transistor OM2, the transistor OM2r, the transistor OM3, and the transistor OM3r.

The resistor XR1 included in the circuit 30 corresponds to the load LET of the double-balanced mixer DBMXA in FIG. 9A. The resistor XR2 included in the circuit 30 corresponds to the load LE2 of the double-balanced mixer DBMXA in FIG. 9A.

The transistor ITr2 included in the circuit 30 corresponds to a transistor included in the current source IS2. The transistor ITr3 included in the circuit 30 corresponds to a transistor included in the current source IS3.

In the circuit 30, a positive-side terminal of the input voltage source IV2P is electrically connected to the terminal RFPIN, and a negative-side terminal of the input voltage source IV2P is electrically connected to the wiring GNDL. A positive-side terminal of the input electrode source IV2N is electrically connected to the terminal RFNIN, and a negative-side terminal of the input voltage source IV2N is electrically connected to the wiring GNDL. A first terminal of the capacitor SMC3 is electrically connected to a first terminal of the resistor XR1, the first terminal of the transistor OM2, and the first terminal of the transistor OM3$r$, and a second terminal of the capacitor SMC3 is electrically connected to the wiring GNDL. A first terminal of capacitor SMC4 is electrically connected to a first terminal of the resistor XR2, the first terminal of the transistor OM2$r$, the first terminal of the transistor OM3, and the terminal IFP, and a second terminal of the capacitor SMC4 is electrically connected to the wiring GNDL.

A positive-side terminal of the constant voltage source CV4 is electrically connected to a second terminal of the resistor XR1 and a second terminal of the resistor XR2. A negative-side terminal of the constant voltage source CV4 is electrically connected to the wiring GNDL. A positive-side terminal of the constant voltage source CV5 is electrically connected to a back gate of the transistor OM2, a back gate of the transistor OM2$r$, a back gate of the transistor OM3, a back gate of the transistor OM3$r$, a back gate of the transistor ITr2, and a back gate of the transistor ITr3. A negative-side terminal of the constant voltage source CV5 is electrically connected to the wiring GNDL. A positive-side terminal of the constant voltage source CV6P is electrically connected to the gate of the transistor ITr2, and a negative-side terminal of the constant voltage source CV6P is electrically connected to the wiring GNDL. A positive-side terminal of the constant voltage source CV6N is electrically connected to the gate of the transistor ITr3, and a negative-side terminal of the constant voltage source CV6N is electrically connected to the wiring GNDL.

The wiring GNDL is a wiring for supplying a ground potential (GND).

A positive-side terminal of the pulse voltage source PLV2P is electrically connected to the terminal LOPIN, and a negative-side terminal of the pulse voltage source PLV2P is electrically connected to the wiring GNDL. A positive-side terminal of the pulse voltage source PLV2N is electrically connected to the terminal LONIN, and a negative-side terminal of the pulse voltage source PLV2N is electrically connected to the wiring GNDL.

For example, the transistor OM2, the transistor OM2$r$, the transistor OM3, the transistor OM3$r$, the transistor ITr2, and the transistor ITr3 of the circuit 30 are OS transistors each including an In—Ga—Zn oxide in a channel formation region. The channel length and the channel width of each of the transistor OM2, the transistor OM2$r$, the transistor OM3, the transistor OM3$r$, the transistor ITr2, and the transistor ITr3 in the circuit 30 are 60 nm and 60 nm, respectively.

The input voltage source IV2P is, for example, a voltage source that outputs an alternative voltage $V_{inp}$ with the maximum voltage of 3.3 V and the minimum voltage of −3.3 V. The frequency of the AC voltage is 4 MHz. The input voltage source IV2N is, for example, a voltage source that outputs the AC voltage $V_{inn}$ with a phase advanced by a half wavelength from a phase of the AC voltage $V_{inp}$ output from the input voltage source IV2P. Note that $V_{inp}$ and $V_{inn}$ supplied from the input voltage source IV2P and the input voltage source IV2N to the terminal RFPIN and the terminal RFNIN correspond to voltage output from the low noise amplifier LNA in the circuit in FIG. 3B.

A voltage between the positive-side terminal and the negative-side terminal of the constant voltage source CV4 is set to 3.3 V. In addition, a voltage between the positive-side terminal and the negative-side terminal of the constant voltage source CV5 is set to 0 V. A voltage between the positive-side terminal and the negative-side terminal of the constant voltage source CV6P is set to 3.3 V and a voltage between the positive-side terminal and the negative-side terminal of the constant voltage source CV6N is set to 3.3 V.

Each of the pulse voltage source PLV2P and pulse voltage source PLV2N are voltage sources similar to the pulse voltage source PLVP and the pulse voltage source PLVN illustrated in FIG. 27. Thus, for each of the pulse voltage source PLV2P and pulse voltage source PLV2N illustrated in FIG. 29, the description for the pulse voltage source PLVP and the pulse voltage source PLVN illustrated in FIG. 27 is referred to.

The capacitance valued of the capacitor SMC3 and the capacitor SMC4 are 10 pF. Note that the capacitor SMC3 and capacitor SMC4 are added to the circuit 30 as decoupling capacitors, like the capacitor SMC1 and the capacitor SMC2. Note that a voltage of a first terminal of the capacitor SMC4, that is, the voltage output from the terminal IFP is $V_{Dout}$.

Figure 30:
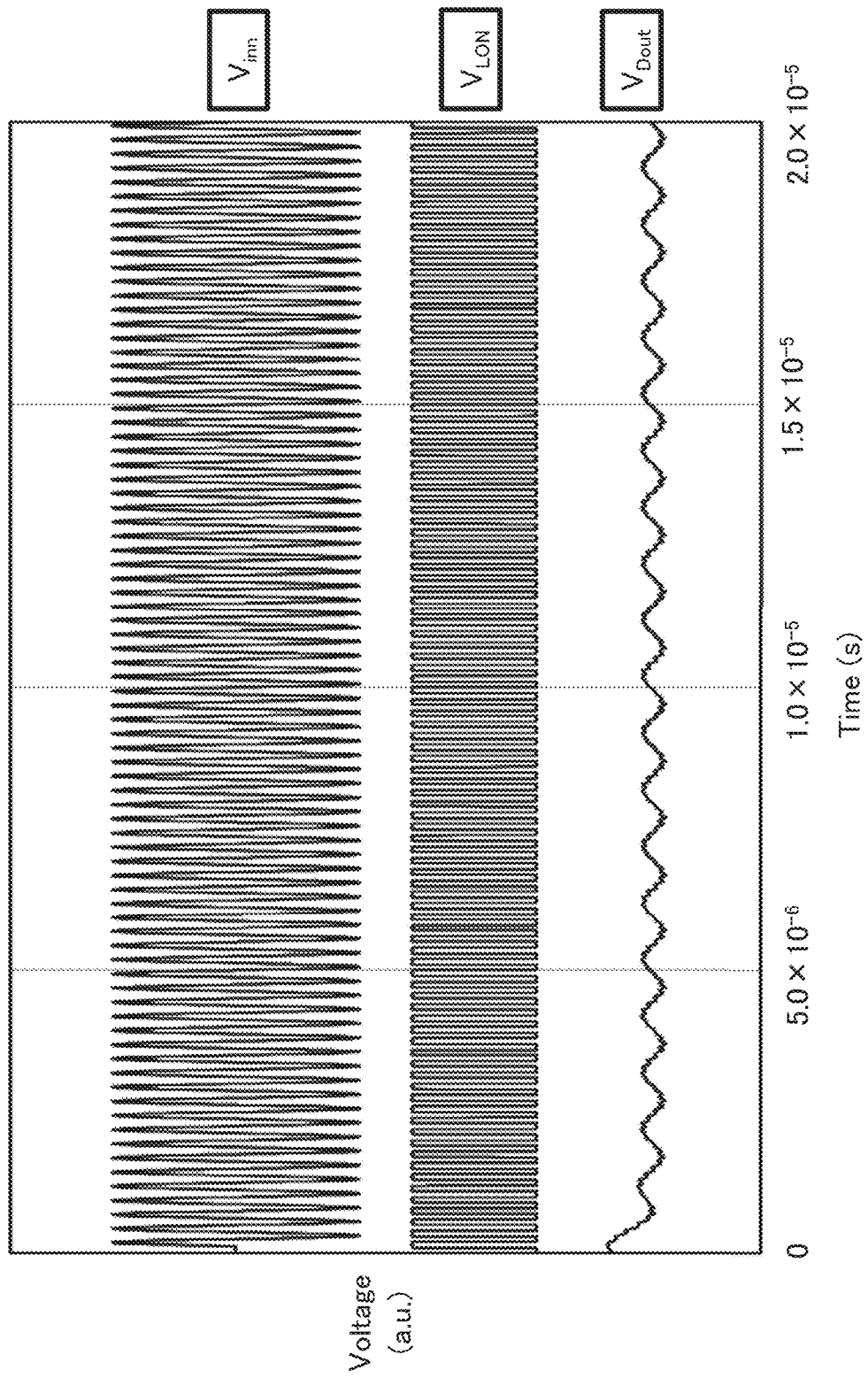
FIG. 30 is a diagram showing results of the circuit calculation.

FIG. 30 is a graph showing waveforms of the alternative voltage $V_{inn}$, the pulse voltage $V_{LON}$, and the output voltage $V_{Dout}$ that were obtained by input of the structure of the circuit 20 in FIG. 27 to the circuit simulator. In the graph, the horizontal axis represents time (s) and the vertical axis represents a voltage (arbitrary unit (a.u.)). Note that the AC voltage $V_{inp}$ and the pulse voltage $V_{LOP}$ are omitted in FIG. 30.

As illustrated in FIG. 30, for example, it was confirmed that the output voltage $V_{Dout}$ with 1 MHz that is a difference between the frequency of $V_{inn}$ ($V_{inp}$) and the frequency of $V_{LOP}$ ($V_{LON}$) was output from the terminal IFP after 1.0× $10^{-5}$ s when the input voltage $V_{inn}$ with 4 MHz was input to the terminal RFNIN and the pulse voltage $V_{LON}$ with 5 MHz was input to the terminal LONIN.

When an AC voltage is mixed with a voltage that is from the local oscillator and has higher frequency than the input voltage by a mixer, the frequency of the voltage output from the mixer is a difference value between the frequency of the input voltage and the frequency of the voltage from the local oscillator. Accordingly, it was confirmed from the result in FIG. 30 that the circuit 30 illustrated in FIG. 29 operated as a mixer, like the circuit 20.

Figure 31:
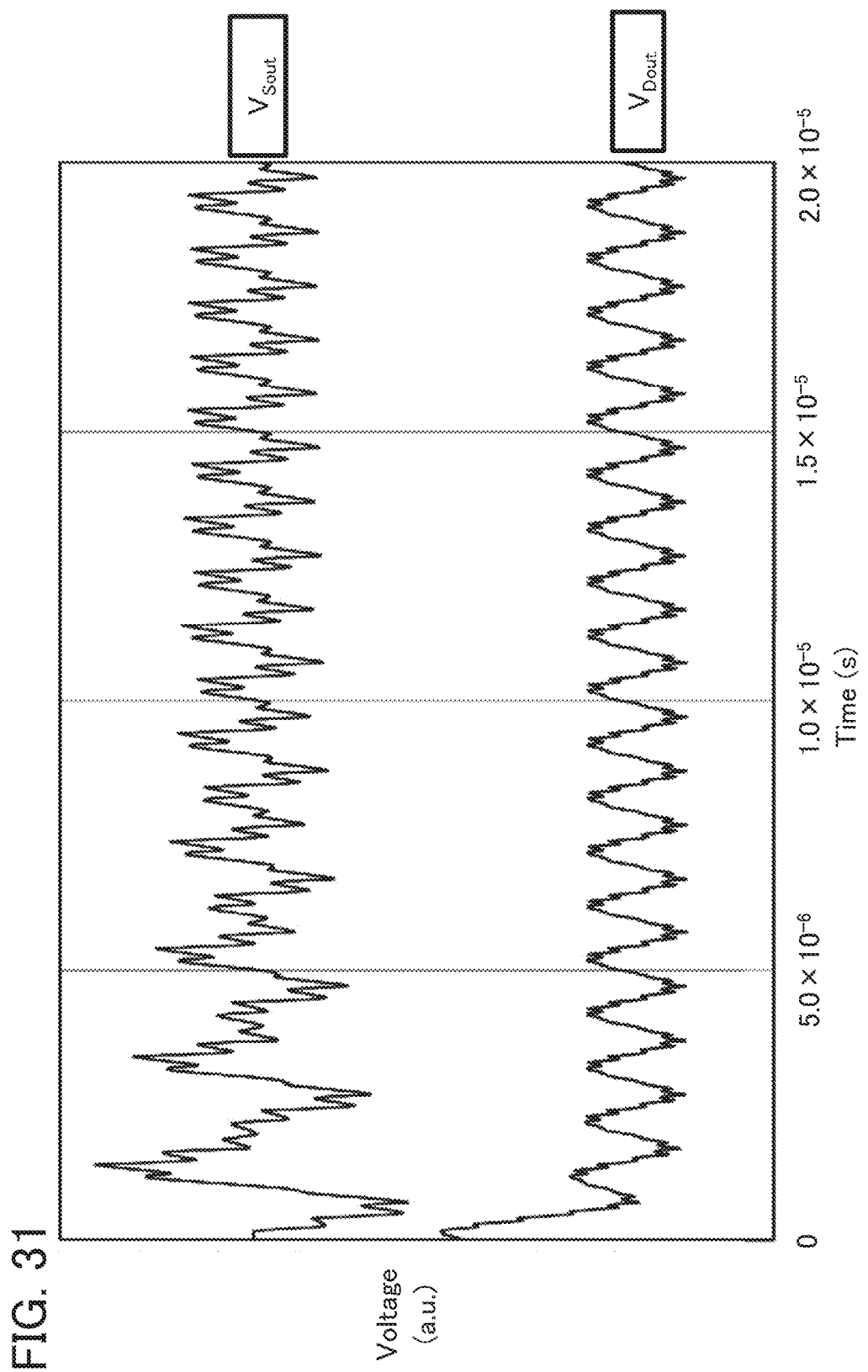
FIG. 31 is a diagram showing results of the circuit calculation.

FIG. 31 is a graph showing voltage waveforms of $V_{Sout}$ in FIG. 28, which is an output result of the circuit 20 and $V_{Dout}$ in FIG. 30, which is an output result of the circuit 30. In the graph, the horizontal axis represents time (s) and the vertical axis represents a voltage (arbitrary unit (a.u.)). It was confirmed from FIG. 31 that the second distortion of the output voltage $V_{Dout}$ of the circuit 30 that is the double-balanced mixer is reduced as compared with that of the output voltage $V_{Sout}$ of the circuit 20 that is the single-balanced mixer.

REFERENCE NUMERALS

ANT: antenna, DPXR: duplexer, LNA: low noise amplifier, PA: power amplifier, LO: local oscillator, DNCMX: downconversion mixer, DNCMX1: downconversion mixer, DNCMX2: downconversion mixer, DNCMX3: downconversion mixer, UPCMX: upconversion mixer, BPF: band pass filter, IFA: IF amplifier, ADC: analog-to-digital converter circuit, AMP: amplifier, LAMP[T]: amplifier, LAMP[2]: amplifier, LAMP[3]: amplifier, PAMP[1]: amplifier, PAMP[2]: amplifier, PAMP[3]: amplifier, TL1: transmission line, TL2: transmission line, TL3: transmission line, LTL1: transmission line, LTL2: transmission line, PTL1: transmission line, ANC1: circuit, ANC2: circuit, ANC3: circuit, CV: constant voltage source, CV1: constant voltage source, CV2: constant voltage source, CV3: constant voltage source, CV4: constant voltage source, CV5: constant voltage source, CV6P: constant voltage source, CV6N: constant voltage source, PLV: pulse voltage source, PLVP: pulse voltage source, PLVN: pulse voltage source, PLV2P: pulse voltage source, PLV2N: pulse voltage source, IV: input voltage source, IV1: input voltage source, IV2P: input voltage source, IV2N: input voltage source, IS: current source, IS1: current source, IS2: current source, IS3: current source, LP: load portion, DIFP: differential portion, ISP: current source part, ACP: circuit part, STr1: transistor, OTr1: transistor, OM1: transistor, OM1r: transistor, OM2: transistor, OM2r: transistor, OM3: transistor, OM3r: transistor, RFOM: transistor, RFOM1: transistor, RFOM2: transistor, ITr: transistor, ITr1: transistor, ITr2: transistor, ITr3: transistor, C1: capacitor, PC1: capacitor, PC2: capacitor, SMC: capacitor, SMC1: capacitor, SMC2: capacitor, SMC3: capacitor, SMC4: capacitor, XL1: inductor, R1: resistor, XRT: resistor, XR2: resistor, LET: load, LE2: load, LT1: terminal, LT2: terminal, PT1: terminal, PT2: terminal, DRFP: terminal, DLOP: terminal, IFP1: terminal, URFP: terminal, ULOP: terminal, IFP: terminal, IFP2: terminal, IFPa: terminal, IFPb: terminal, LOPIN: terminal, LONIN: terminal, RFP: terminal, RFPIN: terminal, RFNIN: terminal, DTT: terminal, DT2: terminal, DT3: terminal, VI: terminal, VO: terminal, VB: terminal, VAL: wiring, VDDL: wiring, GNDL: wiring, 10: circuit, 20: circuit, 30: circuit, 100: high frequency receiver, 200: high frequency transmitter and receiver, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 402: insulator, 404: insulator, 500: transistor, 503: conductor, 503a: conductor, 503b: conductor, 510: insulator, 512: insulator, 514: insulator, 516: insulator, 518: conductor, 520: insulator, 522: insulator, 524: insulator, 530: oxide, 530a: oxide, 530b: oxide, 530c: oxide, 530c: oxide, 530c2: oxide, 540: conductor, 540a: conductor, 540b: conductor, 542a: conductor, 542b: conductor, 543a: region, 543b: region, 544: insulator, 546: conductor, 548: conductor, 550: insulator, 552: insulator, 560: conductor, 560a: conductor, 560b: conductor, 574: insulator, 580: insulator, 581: insulator, 582: insulator, 586: insulator, 600: capacitor, 600A: capacitor, 600B: capacitor, 610: conductor, 611: conductor, 612: conductor, 620: conductor, 630: insulator, 631: insulator, 650: insulator, 651: insulator, 801: cloud field, 802: field, 803: IoT end device, 804: power consumption, 805: processing performance, 831: master device, 832: M2M interface, 841: IoT end device, 842: industrial robot, 881: home, 882: office, 883: cloud, 884: factory, 885: factory, 886: factory, 4700: electronic component, 4702: printed circuit board, 4704: mounting board, 4710: semiconductor device, 4730: electronic component, 4731: interposer, 4732: package substrate, 4733: electrode, 4735: semiconductor device, 4800: semiconductor wafer, 4800a: chip, 4801: wafer, 4801a: wafer, 4802: circuit portion, 4803: spacing, 4803a: spacing, 5200: portable game machine, 5201: housing, 5202: display portion, 5203: button, 5300: desktop information terminal, 5301: main body, 5302: display, 5303: keyboard, 5500: information terminal, 5510: housing, 5511: display portion, 5700: automobile, 5800: electric refrigerator-freezer, 5801: housing, 5802: refrigerator door, 5803: freezer door, 5900: information terminal, 5901: housing, 5902: display portion, 5903: operation button, 5904: operator, 5905: band, 6240: digital camera, 6241: housing, 6242: display portion, 6243: operation button, 6244: shutter button, 6246: lens, 6300: video camera, 6301: first housing, 6302: second housing, 6303: display portion, 6304: operation key, 6305: lens, 6306: joint, 7500: stationary game machine, 7520: main body, 7522: controller

The invention claimed is:

1. A mixer comprising a differential portion, a current source, a first load, an input terminal, and a first output terminal,
   wherein the differential portion includes a first transistor and a second transistor,
   wherein each of the first transistor and the second transistor includes a metal oxide in a channel formation region,
   wherein a first terminal of the first transistor is electrically connected to a first terminal of the second transistor, the input terminal, and a first terminal of the current source,
   wherein a second terminal of the first transistor is electrically connected to a first terminal of the first load and the first output terminal,
   wherein the first load is configured to supply a current between the first terminal and a second terminal of the first load when a first voltage is supplied to the second terminal of the first load,
   wherein the current source is configured to supply a constant current to a first terminal of the current source,
   wherein when a first signal is input to a gate of the first transistor, a second signal with a phase difference of 180° from the first signal is input to a gate of the second transistor, and a third signal is input to the input terminal, the differential portion generates a first output signal with a voltage waveform based on a voltage waveform of the first signal and a voltage waveform of the third signal and outputs the first output signal to the first output terminal,
   wherein the current source comprises a transistor including silicon in a channel formation region,
   wherein an insulator is positioned above the channel formation region of the transistor, and
   wherein the channel formation region of the each of the first transistor and the second transistor is positioned above the insulator.

2. A mixer comprising a differential portion, a current source, a first load, a third transistor, an input terminal, and a first output terminal,
   wherein the differential portion includes a first transistor and a second transistor,
   wherein each of the first transistor and the second transistor includes a metal oxide in a channel formation region,
   wherein a first terminal of the first transistor is electrically connected to a first terminal of the second transistor and a first terminal of the third transistor,
   wherein a second terminal of the third transistor is electrically connected to a first terminal of the current source,
   wherein a gate of the third transistor is electrically connected to the input terminal, wherein a second terminal of the first transistor is electrically connected to a first terminal of the first load and the first output terminal, wherein the first load is configured to supply a current between the first terminal and a second terminal of the first load when a first voltage is supplied to the second terminal of the first load, wherein the current source is configured to supply a constant current to a first terminal of the current source, wherein when a first signal is input to a gate of the first transistor, a second signal with a phase difference of 180° from the first signal is input to a gate of the second transistor, and a third signal is input to the input terminal, the differential portion generates a first output signal with a voltage waveform based on a voltage waveform of the first signal and a voltage waveform of the third signal and outputs the first output signal to the first output terminal, wherein the current source comprises a transistor including silicon in a channel formation region, wherein an insulator is positioned above the channel formation region of the transistor, and wherein the channel formation region of the each of the first transistor and the second transistor is positioned above the insulator.

3. The mixer according to claim 1, further comprising a second load and a second output terminal, wherein a second terminal of the second transistor is electrically connected to a first terminal of the second load and the second output terminal, wherein the second load is configured to supply a current between the first terminal and a second terminal of the second load when the first voltage is supplied to the second terminal of the second load, and wherein when the first signal is input to the gate of the first transistor, the second signal is input to the gate of the second transistor, and the third signal is input to the input terminal, the differential portion is configured to generate a second output signal with a voltage waveform based on a voltage waveform of the second signal and the voltage waveform of the third signal and to output the second output signal to the second output terminal.

4. The mixer according to claim 2, further comprising a second load and a second output terminal, wherein a second terminal of the second transistor is electrically connected to a first terminal of the second load and the second output terminal, wherein the second load is configured to supply a current between the first terminal and a second terminal of the second load when the first voltage is supplied to the second terminal of the second load, and wherein when the first signal is input to the gate of the first transistor, the second signal is input to the gate of the second transistor, and the third signal is input to the input terminal, the differential portion is configured to generate a second output signal with a voltage waveform based on a voltage waveform of the second signal and the voltage waveform of the third signal and to output the second output signal to the second output terminal.

* * * * *